United States Patent
Cheung

(10) Patent No.: US 9,943,821 B2
(45) Date of Patent: Apr. 17, 2018

(54) CATALYTIC REFORMING

(71) Applicant: Chevron Phillips Chemical Company LP, The Woodlands, TX (US)

(72) Inventor: Tin-Tack Peter Cheung, Kingwood, TX (US)

(73) Assignee: Chevron Phillips Chemical Company LP, The Woodlands, TX (US)

( * ) Notice: Subject to any disclaimer, the term of this patent is extended or adjusted under 35 U.S.C. 154(b) by 177 days.

(21) Appl. No.: 14/937,604

(22) Filed: Nov. 10, 2015

(65) Prior Publication Data
US 2016/0059199 A1    Mar. 3, 2016

Related U.S. Application Data

(62) Division of application No. 13/601,281, filed on Aug. 31, 2012, now Pat. No. 9,200,214.

(51) Int. Cl.
*B01J 19/00* (2006.01)
*C10G 35/04* (2006.01)
(Continued)

(52) U.S. Cl.
CPC ........... *B01J 19/0006* (2013.01); *B01J 19/24* (2013.01); *C10G 35/04* (2013.01); *C10G 35/24* (2013.01);
(Continued)

(58) Field of Classification Search
CPC ..... G06F 17/10; G06F 17/5009; C10G 45/72; C10G 35/04; C10G 35/24; C10G 45/68;
(Continued)

(56) References Cited

U.S. PATENT DOCUMENTS 2,882,244 A    4/1959    Milton
2,995,509 A    8/1961    Carr
(Continued)

FOREIGN PATENT DOCUMENTS

| EP | 1038943 A1 | 9/2000 |
|---|---|---|
| WO | 9617040 A1 | 6/1996 |
| WO | 2014035888 A1 | 3/2014 |

OTHER PUBLICATIONS

Davis, Mark E., et al., "Fundamentals of Chemical Reaction Engineering," 2003, pp. 19-26 plus 4 pages of cover and publishing information, McGraw-Hill.
(Continued)

*Primary Examiner* — Shogo Sasaki
(74) *Attorney, Agent, or Firm* — Conley Rose, P.C.; Rodney B. Carroll; Monte R. Rhodes

(57) ABSTRACT

Methods and systems for improved catalytic reforming are disclosed. A method of catalytic reforming includes feeding a feedstream comprising $C_6$-convertibles to one or more reactors; contacting the feedstream with a reforming catalyst; selecting values for a LHSV, a H2/HC ratio, and a conversion of $C_6$-convertibles from a deactivation kinetic model so as to maximize a net present amount of benzene produced over a run-length of the reforming catalyst; operating the one or more reactors at the selected LHSV, the selected H2/HC ratio, and the selected conversion of $C_6$-convertibles; and recovering an effluent from the reactor, wherein the effluent comprises at least about 40 wt % benzene.

12 Claims, 11 Drawing Sheets

(51) Int. Cl.
*C10G 35/24* (2006.01)
*C10G 45/68* (2006.01)
*C10G 45/72* (2006.01)
*B01J 19/24* (2006.01)
*G06F 17/10* (2006.01)
*G06F 17/50* (2006.01)

(52) U.S. Cl.
CPC .............. *C10G 45/68* (2013.01); *C10G 45/72* (2013.01); *G06F 17/10* (2013.01); *G06F 17/5009* (2013.01); *B01J 2219/00166* (2013.01); *B01J 2219/24* (2013.01)

(58) Field of Classification Search
CPC .................... B01J 19/0006; B01J 19/24; B01J 2219/00166; B01J 2219/24
See application file for complete search history.

(56) References Cited

U.S. PATENT DOCUMENTS

| | | | |
|---|---|---|---|
| 3,002,918 A | 10/1961 | Lang | |
| 3,130,007 A | 4/1964 | Breck | |
| 3,216,789 A | 11/1965 | Breck et al. | |
| 3,487,009 A | 12/1969 | Jacobson et al. | |
| 3,497,449 A | 2/1970 | Urban | |
| 4,021,447 A | 5/1977 | Rubin et al. | |
| 4,401,554 A * | 8/1983 | Choi | C10G 59/02 208/64 |
| 4,456,527 A | 6/1984 | Buss et al. | |
| 4,503,023 A | 3/1985 | Breck et al. | |
| 4,508,617 A | 4/1985 | Montgomery | |
| 4,594,145 A | 6/1986 | Roarty | |
| 4,839,024 A | 6/1989 | Ramage et al. | |
| 4,927,521 A * | 5/1990 | Chu | C10G 59/02 208/138 |
| 5,401,386 A | 3/1995 | Morrison et al. | |
| 5,407,558 A | 4/1995 | Kline et al. | |
| 5,411,658 A * | 5/1995 | Chawla | C10G 35/095 208/212 |
| 5,552,033 A | 9/1996 | Shih | |
| 5,858,205 A | 1/1999 | Huebner | |
| 5,858,209 A | 1/1999 | Schmidt et al. | |
| 5,877,367 A | 3/1999 | Witte | |
| 5,879,538 A | 3/1999 | Haritatos | |
| 5,885,439 A | 3/1999 | Glover | |
| 5,958,216 A | 9/1999 | Glover | |
| 6,004,452 A | 12/1999 | Ash et al. | |
| 6,177,002 B1 | 1/2001 | Glover | |
| 6,812,180 B2 | 11/2004 | Fukunaga | |
| 7,153,801 B2 | 12/2006 | Wu | |
| 9,200,214 B2 | 12/2015 | Cheung | |

OTHER PUBLICATIONS

Foreign communication from a related counterpart application—International Search Report and Written Opinion, PCT/US2013/056632, dated Dec. 9, 2013, 10 pages.

Foreign communication from a related counterpart application—International Preliminary Report on Patentability, PCT/US2013/056632, dated Mar. 3, 2015, 7 pages.

Krishnaswamy, S., et al., "Analysis of Temperature-Time Data for Deactivating Catalysts," Ind. Eng. Chem. Process Des. Dev., 1979, pp. 399-403, vol. 18, No. 3, American Chemical Society.

Rahimpour, Mohammad Reza, et al., "Progress in catalytic naphtha reforming process: A review," Applied Energy, 2013, pp. 79-93, vol. 109, Elsevier Ltd.

Ramage, Michael P., et al., "KINPTR (Mobil's Kinetic Reforming Model): A Review of Mobil'S Industrial Process Modeling Philosophy," Advances in Chemical Engineering, 1987, pp. 193 and 267 plus 1 cover page, vol. 13, Academic Press, Inc.

* cited by examiner

CATALYTIC REFORMING

CROSS-REFERENCE TO RELATED APPLICATIONS

This application is a divisional of and claims priority to U.S. patent application Ser. No. 13/601,281 filed on Aug. 31, 2012, now U.S. Pat. No. 9,200,214 B2 and entitled "Catalytic Reforming," which is hereby incorporated herein by reference in its entirety for all purposes.

STATEMENT REGARDING FEDERALLY SPONSORED RESEARCH OR DEVELOPMENT

Not applicable.

FIELD OF THE INVENTION

The present disclosure relates generally to aromatization of hydrocarbons with a reforming catalyst. Particularly, the present disclosure relates to a catalytic reforming process in terms of improving the benzene production over the run-length of the reforming catalyst.

BACKGROUND OF THE INVENTION

The catalytic conversion of hydrocarbons into aromatic compounds, referred to as aromatization or reforming, is an important industrial process. The aromatization reactions may include dehydrogenation, isomerization, and hydrocracking the hydrocarbons, each of which produces specific aromatic compounds. These reactions are generally conducted in one or more aromatization reactors containing an aromatization catalyst. The catalyst may increase the reaction rates, production of desired aromatics, and/or the throughput rates for the desired aromatic compounds.

The economics of a chemical process are affected by many factors, including capital cost, plant efficiency, and margin of the product. In the catalytic reforming process, the cost of the catalyst, the run-length of the catalyst and the throughput of the plant play an important role in determining the economics. Given their commercial importance, an ongoing need exists for improved methods of catalytic reforming processes.

SUMMARY OF THE INVENTION

Disclosed herein is a method of catalytic reforming comprising feeding a feedstream comprising $C_6$-convertibles to one or more reactors; contacting the feedstream with a reforming catalyst; selecting values for a LHSV, a H2/HC ratio, and a conversion of $C_6$-convertibles from a deactivation kinetic model so as to maximize a net present amount of benzene produced over a run-length of the reforming catalyst; operating the one or more reactors at the selected LHSV, the selected H2/HC ratio, and the selected conversion of $C_6$-convertibles; and recovering an effluent from the reactor, wherein the effluent comprises at least about 40 wt % benzene.

Also disclosed herein is a method of catalytic reforming comprising kinetically modeling a deactivation of a reforming catalyst with a deactivation kinetic model to determine a run-length of the reforming catalyst as a function of a LHSV of a feedstream, a H2/HC ratio of the feedstream, and a conversion of $C_6$-convertibles in the feedstream; calculating a net present amount of benzene that is produced over the run-length of the reforming catalyst; and selecting values for the LHSV, the H2/HC ratio, and the conversion of $C_6$-convertibles that maximize the net present amount of benzene produced over the run-length of the reforming catalyst.

Also disclosed herein is a catalytic reactor comprising a feedstream and a reforming catalyst wherein the reactor is configured to produce a net present amount of benzene over a run-length of the reforming catalyst; wherein the run-length is determined as a function of a LHSV of the feedstream, a H2/HC ratio of the feedstream, and a conversion of $C_6$-convertibles in the feedstream by kinetically modeling a deactivation of the reforming catalyst with a deactivation kinetic model; and wherein values for the LHSV of the feedstream, the H2/HC ratio of the feedstream, and the conversion of $C_6$-convertibles in the feedstream are selected to maximize the net present amount of benzene produced over the run-length of the reforming catalyst.

Also disclosed herein is a computer system comprising one or more processors; a non-transitory memory coupled to the processor, wherein the non-transitory memory comprises executable instructions that, when executed, cause the one or more processors to: kinetically model a deactivation of a reforming catalyst with a deactivation kinetic model to determine a run-length of the reforming catalyst as a function of a LHSV of a feedstream, a H2/HC ratio of the feedstream, and a conversion of $C_6$-convertibles in the feedstream; calculate a net present amount of benzene that is produced over a run-length of the reforming catalyst; and select values for the LHSV, the H2/HC ratio, and the conversion of $C_6$-convertibles that maximize the net present amount of benzene produced over a run-length of the reforming catalyst.

Also disclosed herein is a system, which may optionally be utilized in combination with any of embodiments 1 to 77, comprising a catalytic reactor comprising a feedstream and a reforming catalyst; and a computer system coupled to the catalytic reactor and having a deactivation kinetic model to: kinetically model a deactivation of the reforming catalyst with a deactivation kinetic model to determine a run-length of the reforming catalyst as a function of a LHSV of a feedstream, a H2/HC ratio of the feedstream, and a conversion of $C_6$-convertibles in the feedstream; and calculate a net present amount of benzene that is produced over the run-length of the reforming catalyst; wherein the catalytic reactor operates at values for the LHSV, the H2/HC ratio, and the conversion of $C_6$-convertibles that maximize the net present amount of benzene produced over a run-length of the reforming catalyst.

Also disclosed herein is a non-transitory computer readable medium, which may be optionally be utilized in combination with any of embodiments 1 to 92, comprising a model unit to: kinetically model a deactivation of a reforming catalyst with a deactivation kinetic model to determine a run-length of the reforming catalyst as a function of a LHSV of a feedstream, a H2/HC ratio of the feedstream, and a conversion of $C_6$-convertibles in the feedstream; and calculate a net present amount of benzene that is produced over a run-length of the reforming catalyst.

BRIEF DESCRIPTION OF THE DRAWINGS

For a more detailed description of the embodiments of the disclosure, reference will now be made to the accompanying drawings, wherein.

DETAILED DESCRIPTION OF THE EMBODIMENTS

Figure 1:
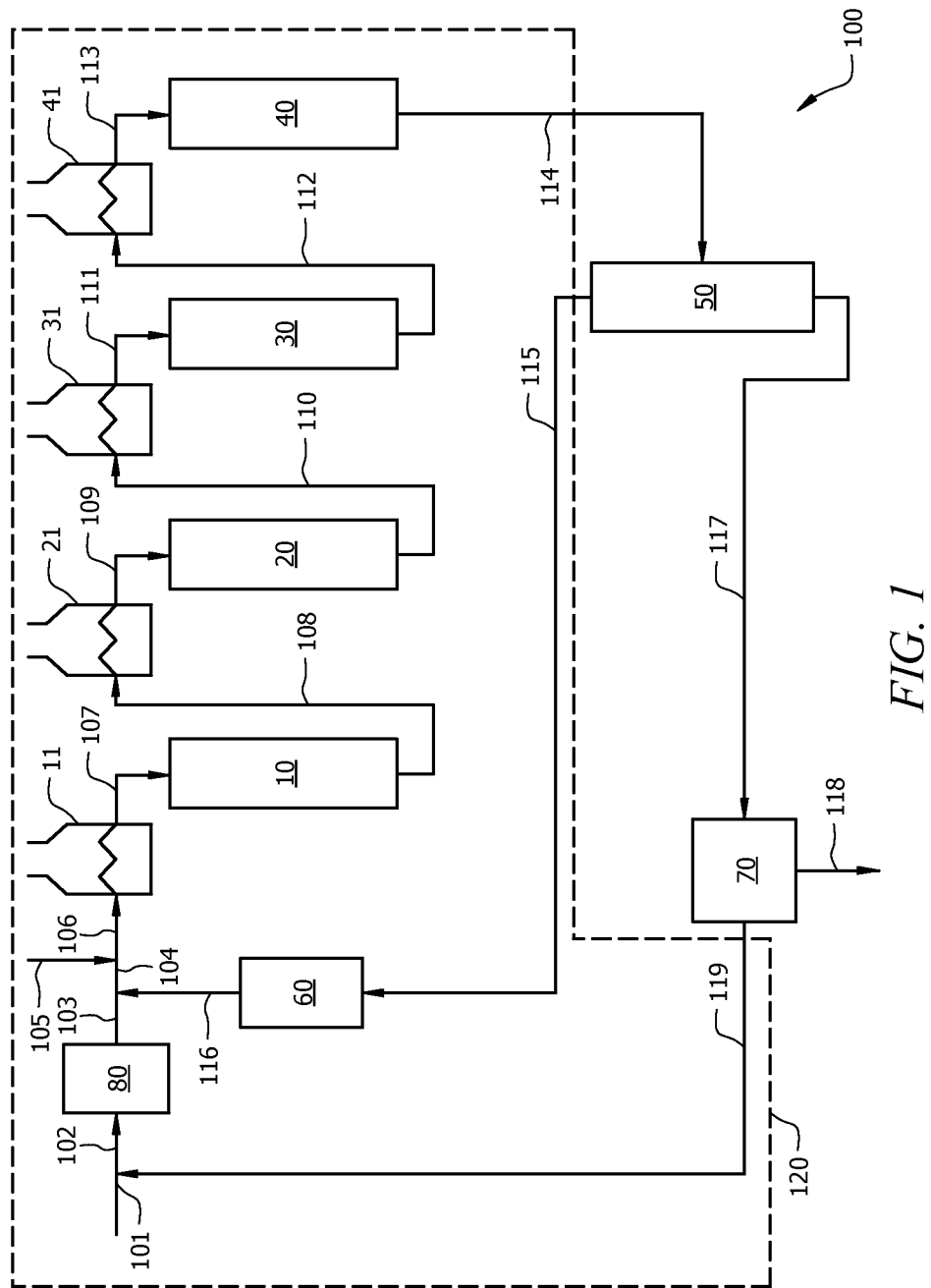
FIG. 1 is a schematic of one embodiment of a catalytic reactor system, the operation of which may be improved in accordance with the disclosure.

Disclosed herein are methods, systems, and reactors for improving catalytic reforming processes. "Aromatization", "aromatizing", and "reforming" as used herein refer to treatment of a hydrocarbon-containing feedstream to provide an aromatics enriched product (i.e., a product whose aromatics content is greater than in the feedstream). Catalytic reforming may comprise the production of reformate in a catalytic reformer (e.g., a reactor), the reformate having a high aromatic content and very low olefins content (alkenes). Various catalytic reforming processes and catalysts (e.g., silica-bound KL-type zeolite supporting platinum, chloride, and fluoride, and alumina supported platinum, tin, and chloride) are described herein. The methods as disclosed herein improve the catalytic reforming process by maximizing the production of benzene per unit of catalyst. The broader economics can be evaluated by using this knowledge and factoring in product margin, unit cost of the catalyst and other commercial variables such as the economic value of the hydrogen produced.

The catalytic reforming processes which may be improved using the disclosed inventive subject matter are described in more detail below, including both isothermal and adiabatic reactor designs. In general, the disclosed inventive subject matter may comprise kinetically modeling the deactivation of the reforming catalyst with a deactivation kinetic model. The run-length of the reforming catalyst as a function of the percentage of $C_6$ hydrocarbons that are convertible under the employed catalytic reforming process conditions (herein referred to as "conversion of $C_6$-convertibles") in the feedstream, the hydrogen-to-hydrocarbon mole ratio (hereinafter referred to as "H2/HC ratio") of the feedstream, and the liquid hourly space velocity (hereinafter referred to as "LHSV") of the feedstream may be determined from the deactivation kinetic model. The amount of benzene produced per unit of catalyst during the life cycle (e.g., run-length) of the reforming catalyst may then be determined from the run-length and the benzene yield per month. A catalytic reforming process may be improved by selecting values for LHSV, H2/HC ratio, and conversion of $C_6$-convertibles that maximize a net present amount of benzene produced per unit of catalyst over the run-length of the catalyst.

The catalytic reforming processes which may be improved according to the inventive subject matter may comprise one or more reactors. A feedstream comprising $C_6$-convertibles may be fed to the one or more reactors. Within the one or more reactors, the feedstream may be contacted with a reforming catalyst under reaction conditions (e.g., temperature, flow, and pressure) and improved conditions as disclosed herein for reforming of one or more components in the feedstream. Particularly, the reactor may be operated at the selected LHSV, the selected H2/HC ratio, and the selected conversion of $C_6$-convertibles determined as disclosed herein. The effluent of the reactor may comprise at least about 40 wt % benzene by weight of the effluent.

"Reactor", "catalytic reactor", and "aromatization reactor" as used herein refer interchangeably to the reactor vessel, reactor internals, and associated processing equipment, including but not limited to the catalyst, inert packing materials, scallops, flow distributors, center pipes, reactor ports, catalyst transfer and distribution system, furnaces and other heating devices, heat transfer equipment, and piping. Any suitable reactor configuration and associated processing equipment may be used to carry out the improved catalytic reforming process as disclosed herein. In various embodiments, the catalytic reforming process may comprise a fixed bed system, a moving bed system, a fluidized bed system, or combinations thereof. The catalytic reforming process may be batch or continuous. In an embodiment, the catalytic reforming process may comprise a fixed bed system comprising one or more fixed bed aromatization reactors in series. In a fixed bed system, the feed may be preheated in furnace tubes and passed into at least one reactor that contains a fixed bed of the catalyst. The flow of the feed to such a system can be upward, downward, or radial through the reactors.

One or more embodiments of the inventive subject matter may be used for or with a catalytic reactor system comprising at least one catalytic reactor and its corresponding processing equipment. Alternatively, one or more embodiments of the inventive subject matter may be used for or with a catalytic reactor system comprising a plurality of catalytic reactors in series.

FIG. 1 illustrates one embodiment of a catalytic reactor system 100 to be improved via the disclosed inventive subject matter. In the embodiment shown in FIG. 1, the catalytic reactor system 100 may comprise four catalytic reforming reactors in series: reactors 10, 20, 30, and 40. However, the catalytic reactor system 100 may comprise any suitable number and configuration of aromatization reactors, for example one, two, three, five, six, or more reactors in series and/or in parallel. As aromatization reactions are highly endothermic, large temperature drops occur across the reactors. Therefore, each reactor 10, 20, 30, and 40 in the series may comprise a corresponding furnace 11, 21, 31, and 41, respectively, for preheating components to a desired temperature for maintaining a desired reaction rate. Alternatively, one or more reactors may share a common furnace where practical. In embodiments, oxygenate and/or nitrogenate may be added within reaction zone 120 to increase/maintain catalyst activity, as further discussed hereinbelow.

In FIG. 1, hydrocarbon feed 101 may be combined with recycle stream 119 to form combined feedstream 102, which may be fed into purification process 80. The purification process 80 employs known processes to purify the hydrocarbon feed, which may include fractionation and/or treating the hydrocarbon feed. Treating as used herein includes removing impurities, such as oxygenates, sulfur, and metals, from the hydrocarbon feed. Fractionation as used herein includes removing heavy (e.g., $C_9^+$) hydrocarbons and light (e.g., $C_5^-$) hydrocarbons. The resulting purified feed 103 may be combined with a dry hydrogen recycle 116 to produce hydrogen rich purified feed 104, which may be combined with oxygenate and/or nitrogenate 105 to produce reactor feedstream 106, as will be described in more detail herein. Reactor feedstream 106 may be pre-heated in a first furnace 11, which heats the hydrocarbons to a desired temperature, thereby producing first reactor feed 107. First reactor feed 107 may be fed into reactor 10, where the hydrocarbons are contacted with an reforming catalyst under suitable reaction conditions (e.g., temperature and pressure) for aromatizing one or more components in the feed to increase the aromatics content thereof. First reactor effluent 108 comprising aromatics, unreacted feed, and other hydrocarbon compounds or byproducts is recovered from first reactor 10. Hydrocarbon feed 101 and any process piping or process vessels upstream that supply said feed, hydrocarbon recycle stream 119, combined feedstream 102, purification process 80, purified feed 103, dry hydrogen recycle 116, reactor feedstream 106, the furnaces, and the reactor vessels are all within the reaction zone 120 to which oxygenate and/or nitrogenate may be added. In various embodiments, one or more reactor feedstreams of the type shown in FIG. 1 are feedstreams upon entering the reactor, and such feedstreams may be further characterized as described herein.

First reactor effluent 108 may be pre-heated in second furnace 21, which heats the hydrocarbons to a desired temperature, thereby producing second reactor feed 109. Second reactor feed 109 may be then fed into reactor 20, where the hydrocarbons are contacted with a reforming catalyst under suitable reaction conditions for aromatizing one or more components in the feed to increase the aromatics content thereof. Second reactor effluent 110 comprising aromatics, unreacted feed, and other hydrocarbon compounds or byproducts is recovered from second reactor 20.

Second reactor effluent 110 may be pre-heated in third furnace 31, which heats the hydrocarbons to a desired temperature, thereby producing third reactor feed 111. Third reactor feed 111 may be then fed into reactor 30, where the hydrocarbons are contacted with a reforming catalyst under suitable reaction conditions for aromatizing one or more components in the feed to increase the aromatics content thereof. Third reactor effluent 112 comprising aromatics, unreacted feed, and other hydrocarbon compounds or byproducts is recovered from third reactor 30.

Third reactor effluent 112 may be pre-heated in fourth furnace 41, which heats the hydrocarbons to a desired temperature, thereby producing fourth reactor feed 113. Fourth reactor feed 113 may be then fed into reactor 40, where the hydrocarbons are contacted with a reforming catalyst under suitable reaction conditions for aromatizing one or more components in the feed to increase the aromatics content thereof. Fourth reactor effluent 114 comprising aromatics, unreacted feed, and other hydrocarbon compounds or byproducts is recovered from fourth reactor 40.

Fourth reactor effluent 114 may be fed into hydrogen separation process 50 that uses one or more known processes to separate hydrogen recycle 115 from reformate 117. In some embodiments, pure hydrogen may be also produced as a product. Reformate 117 may comprise aromatization reaction products from reactors 10, 20, 30, and 40 (e.g., aromatic and non-aromatic compounds) in addition to any unreacted feed and other hydrocarbon compounds or byproducts. In embodiments, the effluent from the catalytic reforming process may comprise at least about 40 wt % benzene by total weight of the effluent. In other embodiments, the effluent from the catalytic reforming process may comprise from about 40 wt % to about 60 wt % benzene by total weight of the effluent.

Hydrogen recycle 115 may be dried in dryer 60, thereby forming dry hydrogen recycle 116, which may be recycled into purified feed 103. Hydrogen is preferred as diluent as it serves to not only lower the partial pressure of the cyclic hydrocarbon, but also suppresses the formation of hydrogen deficient, carbonaceous deposits, commonly referred to as "coke," on the catalytic composite.

Reformate 117 is fed to purification-extraction process 70, which separates raffinate recycle 119 (e.g., unreacted feed) and reactor byproducts (not shown) from aromatics 118. In some embodiments, raffinate recycle 119 may be not combined with hydrocarbon feed 101 to form combined feedstream 102, but may be instead produced as a product. Hydrogen separation processes 50 and purification-extraction processes 70 are well known in the art and are described in numerous patents, including U.S. Pat. No. 5,401,386 to Morrison et al. entitled "Reforming Process for Producing High-Purity Benzene," U.S. Pat. No. 5,877,367 to Witte entitled "Dehydrocyclization Process with Downstream Dimethylbenzene Removal", and U.S. Pat. No. 6,004,452 to Ash et al. entitled "Process for Converting Hydrocarbon Feed to High Purity Benzene and High Purity Paraxylene," each of which is incorporated herein by reference in its entirety. Raffinate recycle 119 may be then recycled into feed 101 and aromatics 118 are sold or otherwise used as desired. For the sake of simplicity, FIG. 1 does not illustrate the byproduct streams that are removed from catalytic reactor system 100 at various points throughout the system. However, persons of ordinary skill in the art are aware of the composition and location of such byproduct streams.

The composition of the feedstream (e.g., any of streams 101, 102, 103, 104, 106, 107, 108, 109, 110, 111, 112, and/or 113) may be a consideration when designing catalytic reforming systems. In an embodiment, the feedstream may comprise non-aromatic hydrocarbons containing at least six carbon atoms. In embodiments, the feedstream may feed to the catalytic reactor (e.g., aromatization reactor), and may comprise any combination of hydrocarbons having from about five to about nine carbon atoms. In embodiments, the feedstream to the catalytic reforming system may comprise a mixture of hydrocarbons comprising $C_6$ to $C_8$ hydrocarbons containing up to about 10 wt % of $C_5$ and lighter hydrocarbons ($C_5^-$) by weight of the feed; alternatively, up to about 15 wt % of $C_5$ and lighter hydrocarbons ($C_5^-$), and containing up to about 10 wt % of $C_9$ and heavier hydrocarbons ($C_9^+$) by weight of the feed. Low levels of $C_9^+$ and $C_5^-$ hydrocarbons may maximize the yield of high value aromatics. Coke formation may be affected by the coke forming components in the feedstream such as cyclopentane and C9+ compounds. In some embodiments, the feedstream maximizes the percentage of $C_6$ hydrocarbons. Such a feedstream can be achieved by separating a hydrocarbon feedstock, such as a full-range naphtha, into a light hydrocarbon feed fraction and a heavy hydrocarbon feed fraction, and using the light fraction in the feedstream. In embodiments, the feedstream may maximize the conversion of $C_6$-convertibles. In embodiments, the feedstream may comprise up to about 50 wt % $C_6$-convertibles; alternatively, up to 60 wt % $C_6$-convertibles; alternatively, up to 70 wt % $C_6$-convertibles by weight of the feedstream.

In certain embodiments, the feedstream may comprise naphtha. The naphtha feed may comprise a light hydrocarbon, with a boiling range of about 70° F. to about 450° F. The naphtha feed may contain aliphatic, naphthenic or paraffinic hydrocarbons. These aliphatic and naphthenic hydrocarbons may be converted, at least in part, to aromatics in the catalytic reactor system. While catalytic aromatization typically refers to the conversion of naphtha, other feedstocks can be treated as well to provide an aromatics enriched product. Therefore, while the conversion of naphtha may be one embodiment, the present disclosure can be useful for the conversion or aromatization of a variety of feedstocks such as paraffin hydrocarbons, olefin hydrocarbons, acetylene hydrocarbons, cyclic paraffin hydrocarbons, cyclic olefin hydrocarbons, and mixtures thereof, and particularly saturated hydrocarbons.

In an embodiment, the feedstock may be substantially free of sulfur, nitrogen, metals, and other known poisons for reforming catalysts. In an embodiment, the feedstock contains less than 100 ppb of sulfur. If present, such poisons can be removed using methods known to those skilled in the art. In some embodiments, the feed can be purified by first using conventional hydrofining techniques, then using sorbents to remove the remaining poisons, as is known to those of skill in the art. Such hydrofining techniques and sorbents may be part of the improved catalytic reforming process herein below.

The reforming reactions may occur under process conditions that thermodynamically favor the dehydrocyclization reaction and limit undesirable hydrocracking reactions. Operating ranges for a typical catalytic reforming process, such as an aromatization process, may include reactor inlet temperatures between 700° F. and 1050° F.; a system pressure between 0 pounds per square inch gauge (psig) and about 500 psig; a recycle hydrogen rate sufficient to yield a hydrogen to hydrocarbon mole ratio for the feed to the reforming reactor zone between 0.1 and 20; and a liquid hourly space velocity for the hydrocarbon feed over the reforming catalyst of between 0.1 and 10. The operating temperatures generally may include reactor inlet temperatures from about 700° F. to about 1050° F. The subject matter disclosed herein may be used to kinetically model a reforming process (e.g., an aromatization process) in order to enable selection of improved operating conditions for benzene production.

The reforming catalyst may comprise an inorganic support, a group VIII metal such as platinum, and one or more halides such as fluorine, chlorine, iodine, bromine, or combinations thereof. In some embodiments, the catalyst may comprise Group VIII metals on an inorganic support such as platinum on alumina, Pt/Sn on alumina and Pt/Re on alumina. In other embodiments, the catalyst may comprise Noble Group VIII metals on a zeolitic support such as Pt, Pt/Sn and Pt/Re on zeolitic supports which may comprise a binder and zeolites such as L-zeolites, ZSM-5, silicalite and beta; and Noble Group VIII metals on alkali- and alkaline-earth exchanged L-zeolites. The catalyst may comprise a large-pore zeolite as the inorganic support, charged with at least one Group VIII metal. In embodiments, the Group VIII metal may comprise platinum, which may be more selective for dehydrocyclization and which may be more stable under reforming reaction conditions than other Group VIII metals. In other embodiments, the catalyst may comprise a Group VIII metal such as rhenium, or a Group IV metal or metalloid such as tin.

In an embodiment, the catalyst may comprise a non-acidic catalyst which may comprise a non-acidic zeolite support as the inorganic support, a group VIII metal, and one or more halides. Suitable halides include chloride, fluoride, bromide, iodide, or combinations thereof. Suitable Group VIII metals include iron, cobalt, nickel, ruthenium, rhodium, palladium, osmium, iridium, platinum, or combinations thereof.

Inorganic supports for reforming catalysts (e.g., aromatization catalysts) can generally include any inorganic oxide. These inorganic supports include bound large pore aluminosilicates (zeolites), amorphous inorganic oxides and mixtures thereof. Large pore aluminosilicates include, but are not limited to, L-zeolite, Y-zeolite, mordenite, omega zeolite, beta zeolite and the like. Amorphous inorganic oxides include, but are not limited to, aluminum oxide, silicon oxide and titania. Suitable bonding agents for the inorganic supports include, but are not limited to, silica, alumina, clays, titania, magnesium oxide, and combinations thereof.

The inorganic support may be an aluminosilicate, for example a zeolite. In embodiments, the reforming catalyst may comprise a zeolitic catalyst. Zeolite materials, both natural and synthetic, are known to have catalytic properties for many hydrocarbon processes. The term "zeolite" generally refers to a particular group of hydrated, crystalline metal aluminosilicates. These zeolites exhibit a network of $SiO_4$ and $AlO_4$ tetrahedra in which aluminum and silicon atoms are crosslinked in a three-dimensional framework by sharing oxygen atoms. The cavities and channels throughout the crystalline material of zeolites are interconnected and generally can be of a size to allow selective separation of hydrocarbons. In the three-dimensional framework, the ratio of oxygen atoms to the total of aluminum and silicon atoms may be equal to 2. The framework exhibits a negative electrovalence that typically is balanced by the inclusion of cations within the crystal such as metals, alkali metals, alkaline earth metals, or hydrogen. Thus, zeolites are a group of natural or synthetic hydrated aluminosilicate minerals that typically contain alkali and alkaline metals. Zeolites are characterized by a framework structure that encloses interconnected cavities occupied by ion-exchangeable large metal cations such as potassium and water molecules permitting reversible dehydration. The actual formula of the zeolite may vary without changing the crystalline structure. In an embodiment, the mole ratio of silicon to aluminum (Si/Al) in the zeolite may vary from about 1.0 to about 3.5.

In embodiments, the reforming catalyst may comprise a large pore zeolite. The term "large-pore zeolite" may be defined as a zeolite having an effective pore diameter of from about 6 Angstroms (Å) to about 15 Å; alternatively, from about 7 Å to about 9 Å. Examples of large pore crystalline zeolites are type L-zeolite, zeolite X, zeolite Y, omega zeolite, beta zeolite, ZSM-4, ZSM-5, ZSM-10, ZSM-12, ZSM-20, REY, USY, RE-USY, LZ-210, LZ-210-A, LZ-210-M, LZ-210-T, SSZ-24, ZZA-26, SSZ-31, SSZ-33, SSZ-35, SSZ-37, SSZ-41, SSZ-42, SSZ-44, MCM-58, mordenite, mazzite, faujasite, and combinations thereof. In an embodiment, the large pore zeolite may comprise an isotypic framework structure. In an embodiment, the reforming catalyst may comprise L-zeolite.

L-zeolite, its X-ray diffraction pattern, its properties, and methods for its preparation are described in detail in, U.S. Pat. No. 3,216,789, the content of which is hereby incorporated by reference. Zeolite X is described in U.S. Pat. No. 2,882,244. Mazzite is described in U.S. Pat. Nos. 4,503,023 and 4,021,447. Mordenite is described in U.S. Pat. No. 4,503,023. Zeolite Y is described in U.S. Pat. No. 3,130,007. U.S. Pat. Nos. 3,216,789; 2,882,244; 4,503,023; 4,021,447; and 3,130,007, are hereby incorporated by reference to show zeolites useful for reforming processes.

In embodiments, the reforming catalyst may comprise a large pore L-zeolite. L-type zeolite catalysts are a sub-group of zeolitic catalysts. Typical L-type zeolites contain mole ratios of oxides in accordance with the following formula:

$$M_{2/n}O \cdot Al_2O_3 \cdot xSiO_2 \cdot yH_2O$$

wherein "M" designates at least one exchangeable cation such as barium, calcium, cerium, lithium, magnesium, potassium, sodium, strontium, and zinc as well as non-metallic cations like hydronium and ammonium ions which may be replaced by other exchangeable cations without causing a substantial alteration of the basic crystal structure of the L-type zeolite. The "n" in the formula represents the valence of "M", "x" may be 2 or greater; and "y" is the number of water molecules contained in the channels or interconnected voids with the zeolite.

Bound potassium L-type zeolites, or KL zeolites, have been found to be particularly desirable. The term KL zeolite as used herein refers to L-type zeolites in which the principal cation M incorporated in the zeolite may comprise potassium. A KL zeolite may be cation-exchanged or impregnated with another metal and one or more halides to produce a platinum-impregnated, halided zeolite or a KL supported Pt-halide zeolite catalyst. In an embodiment, the zeolite may comprise type L zeolite. In embodiments, the reforming catalyst may comprise a potassium L-type zeolite, hereafter referred to as KL-zeolite, which refers to L-type zeolites wherein the principal exchangeable cation M incorporated in the zeolite is potassium.

One or more Group VIII metals may be added to the catalyst support to form a metallized catalyst support. The metal may be added to the catalyst support by employing a variety of known and conventional techniques, e.g., ion-exchange, incipient wetness, pore fill, impregnation, vapor deposition etc. In embodiments, the platinum and optionally one or more halides may be added to the zeolite support by any suitable method, for example via impregnation with a solution of a platinum-containing compound and one or more halide-containing compounds. In an embodiment, the metal may be added to the catalyst support by impregnation with a metal-containing solution. The metal in the metal containing solution may comprise at least one Group VIII metal; alternatively, Pt, Pd, Rh, Ir, Ru, Os, or combinations thereof. In an embodiment, the metal may comprise platinum that may be added to the catalyst support via contact with a metal-containing solution containing at least one platinum-containing compound. Examples of suitable platinum-containing compounds for contact with the catalyst support include without limitation platinum compounds that form positively charged platinum complex ions in solution such as for example platinum salts such as chlorides and nitrates; platinum complexes with amines; or combinations thereof. For example, the platinum-containing compound can be any decomposable platinum-containing compound including, but not limited to, ammonium tetrachloroplatinate, chloroplatinic acid, diammineplatinum (II) nitrite, bis-(ethylenediamine)platinum (II) chloride, platinum (II) acetylacetonate, dichlorodiammine platinum, platinum (II) chloride, tetraammineplatinum (II) hydroxide, tetraammineplatinum chloride, and tetraammineplatinum (II) nitrate. In an embodiment, the platinum source may comprise tetraamine platinum chloride (TAPC). The amount of platinum in the metallized catalyst support may range from about 0.1 to about 5 wt %; alternatively, from about 0.1 to about 3 wt %; alternatively, from about 0.3 to about 1.8 wt %.

In an embodiment, the catalyst may comprise a large pore zeolite support with a platinum-containing compound and at least one halide. One or more halides may be added to the catalyst support by contact with a halide-containing compound to form a halided catalyst support. The halides may be added into the catalyst support separately; alternatively, the halides may be added to the catalyst support at the same time. Such halides may be incorporated during addition of a metal, alternatively, the halides may be incorporated in a separate step that may be pre- or post-addition of the metal, to form a halided, metallized catalyst support. Examples of suitable halides include without limitation fluoride, chloride, bromide, iodide, or combinations thereof. Such halides may be introduced as the ammonium halide compound.

In an embodiment, the catalyst may comprise a large pore zeolite support with a platinum-containing compound and at least one ammonium halide compound. The ammonium halide compound may comprise one or more compounds represented by the formula $N(R)_4X$, where X may comprise a halide and where R represents a hydrogen or a substituted or unsubstituted carbon chain molecule having 1-20 carbons wherein each R may be the same or different. In an embodiment, R may comprise methyl, ethyl, propyl, butyl, or combinations thereof. Examples of a suitable organic ammonium compound represented by the formula $N(R)_4X$ may include ammonium chloride, ammonium fluoride, and tetraalkylammonium halides such as tetramethylammonium chloride (TMAC), tetramethylammonium fluoride (TMAF), tetraethylammonium chloride, tetraethylammonium fluoride, tetrapropylammonium chloride, tetrapropylammonium fluoride, tetrabutylammonium chloride, tetrabutylammonium fluoride, methyltriethylammonium chloride, methyltriethylammonium fluoride, or combinations thereof.

In an embodiment, the ammonium halide compound may comprise at least one acid halide and at least one ammonium hydroxide represented by the formula $N(R')_4OH$, where R' may comprise hydrogen or a substituted or unsubstituted carbon chain molecule having 1-20 carbon atoms wherein each R' may be the same or different. In an embodiment, R' may comprise methyl, ethyl, propyl, butyl, or combinations thereof. Examples of a suitable ammonium hydroxide represented by the formula $N(R')_4OH$ may include ammonium hydroxide, tetraalkylammonium hydroxides such as tetramethylammonium hydroxide, tetraethylammonium hydroxide, tetrapropylammonium hydroxide, tetrabutylammonium hydroxide, and combinations thereof. Examples of suitable acid halides may include HCl, HF, HBr, HI, or combinations thereof.

In an embodiment the ammonium halide compound may comprise (a) a compound represented by the formula $N(R)_4X$, where X may comprise a halide and where R represents a hydrogen or a substituted or unsubstituted carbon chain molecule having 1-20 carbons wherein each R may be the same or different, and (b) at least one acid halide and at least one ammonium hydroxide represented by the formula $N(R')_4OH$, where R' may comprise hydrogen or a substituted or unsubstituted carbon chain molecule having 1-20 carbon atoms wherein each R' may be the same or different.

The halide-containing compound may further comprise an ammonium halide such as ammonium chloride, ammonium fluoride, or both in various combinations with the ammonium halide compounds described previously. More specifically, ammonium chloride, ammonium fluoride, or both may be used with (a) as described previously, a compound represented by the formula $N(R)_4X$, where X may comprise a halide and where R represents a hydrogen or a substituted or unsubstituted carbon chain molecule having 1-20 carbons wherein each R may be the same or different and/or (b) as described previously, at least one acid halide and at least one organic ammonium hydroxide represented by the formula $N(R')_4OH$, where R' may comprise a substituted or unsubstituted carbon chain molecule having 1-20 carbon atoms wherein each R' may be the same or different. For example, a first fluoride- or chloride-containing compound can be introduced as a tetraalkylammonium halide with a second fluoride- or chloride-containing compound introduced as an ammonium halide. In an embodiment, tetraalkylammonium chloride may be used with ammonium fluoride.

In an embodiment, the reforming catalyst may comprise a metallized, halided support and the amount of halide in the catalyst ranges from about 0.05 wt % to about 5.0 wt %. In an embodiment, the halided catalyst support may comprise chloride present in an amount of from about 0.1 wt % to about 5 wt %; alternatively, from about 0.1 wt % to about 3 wt %; alternatively, from about 0.3 wt % to about 1.8 wt %. In an embodiment, the halided catalyst support may comprise fluoride present in an amount of from about 0.1 wt % to about 5 wt %; alternatively, from about 0.1 wt % to about 3 wt %; alternatively, from about 0.3 wt % to about 1.8 wt %. In an embodiment, the halided catalyst support may comprise both chloride and fluoride, which may be present in a Cl:F ratio of from about 1:10 to 10:1; alternatively, from about 1:5 to 5:1; alternatively, from about 1:2 to 2:1.

In embodiments, the catalyst may comprise a low-acidity silica-bound potassium L-type zeolite support, platinum, chloride, and fluoride. In embodiments, the reforming catalyst may readily convert near-linear $C_6$s (i.e., $C_6$ hydrocarbons with no more than one branch), but may not readily convert $C_6$ hydrocarbons having more than one branch, e.g., dimethylpentane. Such readily converted $C_6$ hydrocarbons are referred to herein as "$C_6$-convertibles." In embodiments, the process to be improved via the disclosed method may comprise a low-acidity silica-bound potassium L-type zeolite support, platinum, chloride, and fluoride. In embodiments, the process to be improved via the disclosed method may comprise a conversion of $C_6$-convertibles greater than about 75%; alternatively, greater than about 80%; alternatively, greater than about 83%.

Examples of catalysts and reactor systems suitable for use with the methods described herein are the AROMAX® Process and catalyst technologies available from the Chevron Phillips Chemical Company of The Woodlands, Tex. A specific example of a suitable commercially available reforming catalyst is the AROMAX® II Catalyst available from Chevron Phillips Chemical Company LP of The Woodlands, Tex. Suitable reforming catalysts are also disclosed in U.S. Pat. No. 7,153,801 to Wu entitled "Aromatization Catalyst and Methods of Making and Using Same," and U.S. Pat. No. 6,812,180 to Fukunaga entitled "Method for Preparing Catalyst," each of which is incorporated herein by reference as if reproduced in their entirety.

In embodiments, the reforming process to be improved via the disclosed method may comprise a series of adiabatic Aromax® Reactors with inter-stage heating. Alternatively, the process to be improved may comprise isothermal Aromax® Reactors in which a bank of isothermal reactors is heated in a fire box. In an embodiment, the process may comprise six adiabatic Aromax® Reactors with inter-stage heating; alternative embodiments may comprise seven adiabatic Aromax® Reactors with inter-stage heating.

Figure 2:
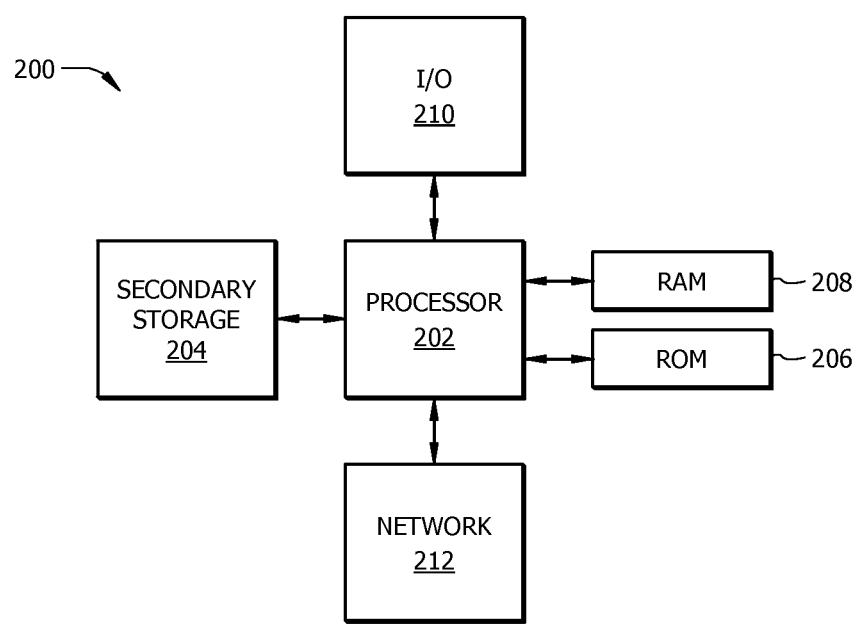
FIG. 2 illustrates a computer system suitable for implementing one or more embodiments of the disclosure.

FIG. 2 illustrates a computer system 200 suitable for implementing all, or a portion of, one or more embodiments disclosed herein. All of, or a portion of, the system 200 may be implemented on any particular machine, or machines, with sufficient processing power, memory resources, and throughput capability to handle the necessary workload placed upon the computer, or computers. The computer system 200 includes a processor 202 (which may be referred to as a central processor unit or CPU) that is in communication with memory devices including secondary storage 204, read only memory (ROM) 206, random access memory (RAM) 208, input/output (I/O) devices 210, and network connectivity devices 212. The processor 202 may be implemented as one or more CPU chips.

It is understood that by programming and/or loading executable instructions onto the computer system 200, at least one of the CPU 202, the RAM 208, and the ROM 206 are changed, transforming the computer system 200 in part into a particular machine or apparatus having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application specific integrated circuit (ASIC), because for large production runs the hardware implementation may be less expensive than the software implementation. Often a design may be developed and tested in a software form and later transformed, by well-known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

The secondary storage 204 is typically comprised of one or more disk drives or tape drives and is used for non-volatile storage of data and as an over-flow data storage device if RAM 208 is not large enough to hold all working data. Secondary storage 204 may be used to store programs which are loaded into RAM 208 when such programs are selected for execution. The ROM 206 is used to store instructions and perhaps data which are read during program execution. ROM 206 is a non-volatile memory device which typically has a small memory capacity relative to the larger memory capacity of secondary storage 204. The RAM 208 is used to store volatile data and perhaps to store instructions. Access to both ROM 206 and RAM 208 is typically faster than to secondary storage 204. The secondary storage 204, the RAM 208, and/or the ROM 206 may be referred to in some contexts as computer readable storage media and/or non-transitory computer readable media.

I/O devices 210 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 212 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), long-term evolution (LTE), worldwide interoperability for microwave access (WiMAX), and/or other air interface protocol radio transceiver cards, and other well-known network devices. These network connectivity devices 212 may enable the processor 202 to communicate with the Internet or one or more intranets. With such a network connection, it is contemplated that the processor 202 might receive information from the network, or might output information to the network in the course of performing the above-described method steps. Such information, which is often represented as a sequence of instructions to be executed using processor 202, may be received from and outputted to the network, for example, in the form of a computer data signal embodied in a carrier wave.

Such information, which may include data or instructions to be executed using processor 202 for example, may be received from and outputted to the network, for example, in the form of a computer data baseband signal or signal embodied in a carrier wave. The baseband signal or signal embedded in the carrier wave, or other types of signals currently used or hereafter developed, may be generated according to several methods well known to one skilled in the art. The baseband signal and/or signal embedded in the carrier wave may be referred to in some contexts as a transitory signal.

The processor 202 executes instructions, codes, computer programs, scripts which it accesses from hard disk, floppy disk, optical disk (these various disk based systems may all be considered secondary storage 204), ROM 206, RAM 208, or the network connectivity devices 212. While only one processor 202 is shown, multiple processors may be present. Thus, while instructions may be discussed as executed by a processor, the instructions may be executed simultaneously, serially, or otherwise executed by one or multiple processors. Instructions, codes, computer programs, scripts, and/or data that may be accessed from the secondary storage 204, for example, hard drives, floppy disks, optical disks, and/or other device, the ROM 206, and/or the RAM 208 may be referred to in some contexts as non-transitory instructions and/or non-transitory information.

In an embodiment, the computer system 200 may comprise two or more computers in communication with each other that collaborate to perform a task. For example, but not by way of limitation, an application may be partitioned in such a way as to permit concurrent and/or parallel processing of the instructions of the application. Alternatively, the data processed by the application may be partitioned in such a way as to permit concurrent and/or parallel processing of different portions of a data set by the two or more computers. In an embodiment, virtualization software may be employed by the computer system 200 to provide the functionality of a number of servers that is not directly bound to the number of computers in the computer system 200. For example, virtualization software may provide twenty virtual servers on four physical computers. In an embodiment, the functionality disclosed above may be provided by executing the application and/or applications in a cloud computing environment. Cloud computing may comprise providing computing services via a network connection using dynamically scalable computing resources. Cloud computing may be supported, at least in part, by virtualization software. A cloud computing environment may be established by an enterprise and/or may be hired on an as-needed basis from a third party provider. Some cloud computing environments may comprise cloud computing resources owned and operated by the enterprise as well as cloud computing resources hired and/or leased from a third party provider.

In an embodiment, some or all of the functionality disclosed above may be provided as a computer program product. The computer program product may comprise one or more computer readable storage medium having computer usable program code embodied therein to implement the functionality disclosed above. The computer program product may comprise data structures, executable instructions, and other computer usable program code. The computer program product may be embodied in removable computer storage media and/or non-removable computer storage media. The removable computer readable storage medium may comprise, without limitation, a paper tape, a magnetic tape, magnetic disk, an optical disk, a solid state memory chip, for example analog magnetic tape, compact disk read only memory (CD-ROM) disks, floppy disks, jump drives, digital cards, multimedia cards, and others. The computer program product may be suitable for loading, by the computer system 200, at least portions of the contents of the computer program product to the secondary storage 204, to the ROM 206, to the RAM 208, and/or to other non-volatile memory and volatile memory of the computer system 200. The processor 202 may process the executable instructions and/or data structures in part by directly accessing the computer program product, for example by reading from a CD-ROM disk inserted into a disk drive peripheral of the computer system 200. Alternatively, the processor 202 may process the executable instructions and/or data structures by remotely accessing the computer program product, for example by downloading the executable instructions and/or data structures from a remote server through the network connectivity devices 212. The computer program product may comprise instructions that promote the loading and/or copying of data, data structures, files, and/or executable instructions to the secondary storage 204, to the ROM 206, to the RAM 208, and/or to other non-volatile memory and volatile memory of the computer system 200.

In some contexts, the secondary storage 204, the ROM 206, and the RAM 208 may be referred to as a non-transitory computer readable medium or a computer readable storage media. A dynamic RAM embodiment of the RAM 208, likewise, may be referred to as a non-transitory computer readable medium in that while the dynamic RAM receives electrical power and is operated in accordance with its design, for example during a period of time during which the computer 200 is turned on and operational, the dynamic RAM stores information that is written to it. Similarly, the processor 202 may comprise an internal RAM, an internal ROM, a cache memory, and/or other internal non-transitory storage blocks, sections, or components that may be referred to in some contexts as non-transitory computer readable media or computer readable storage media.

In an embodiment, the computer system 200 (through, e.g., the network connectivity devices 212) is capable of facilitating communications between the processor 202 and components of the catalytic reactor system 100 of FIG. 1, including reactors 10, 20, 30, and 40; furnaces 11, 21, 31, and 41; hydrogen separation process 50; dryer 60; purification-extraction process 70; purification process 80; other components such as pumps and value, or combinations thereof. In an embodiment, the network connectivity devices 212 may be wired devices such as Ethernet cards, USB interface cards, etc., or combinations thereof, and the communications between the processor 202 and the components of the catalytic reactor system 100 may be wired network communications. Alternatively, the network connectivity devices 212 may be wireless devices such as WiFi, Bluetooth, etc. and the communications between the processor 202 and the components of the catalytic reactor system 100 may be wireless network communications.

In an embodiment, components of the catalytic reactor system 100 (e.g., reactors 10, 20, 30, and 40; furnaces 11, 21, 31, and 41; hydrogen separation process 50; dryer 60; purification-extraction process 70; and purification process 80; valves; pumps; etc.) may be coupled to the computer system 200 such that data obtained from one or more components may be stored and/or used by the computer system 200. In an embodiment, the run-length and net present amount of benzene recovered may be kinetically modeled as a function of the H2/HC ratio, LHSV, and/or conversion of $C_6$-convertibles using the computer system 200. After kinetic modeling, the H2/HC ratio, LHSV, and conversion of $C_6$-convertibles which maximize the run-length and/or net present amount of benzene recovered may be selected by a user of the computer system 200 or by the computer system 200 itself (e.g., under system or user-defined guidelines), for example. The computer system 200 may communicate with one or more components of the catalytic reactor system 100 so as to set or adjust operating parameters to maximize the run-length and/or net present amount of benzene.

Figure 3:
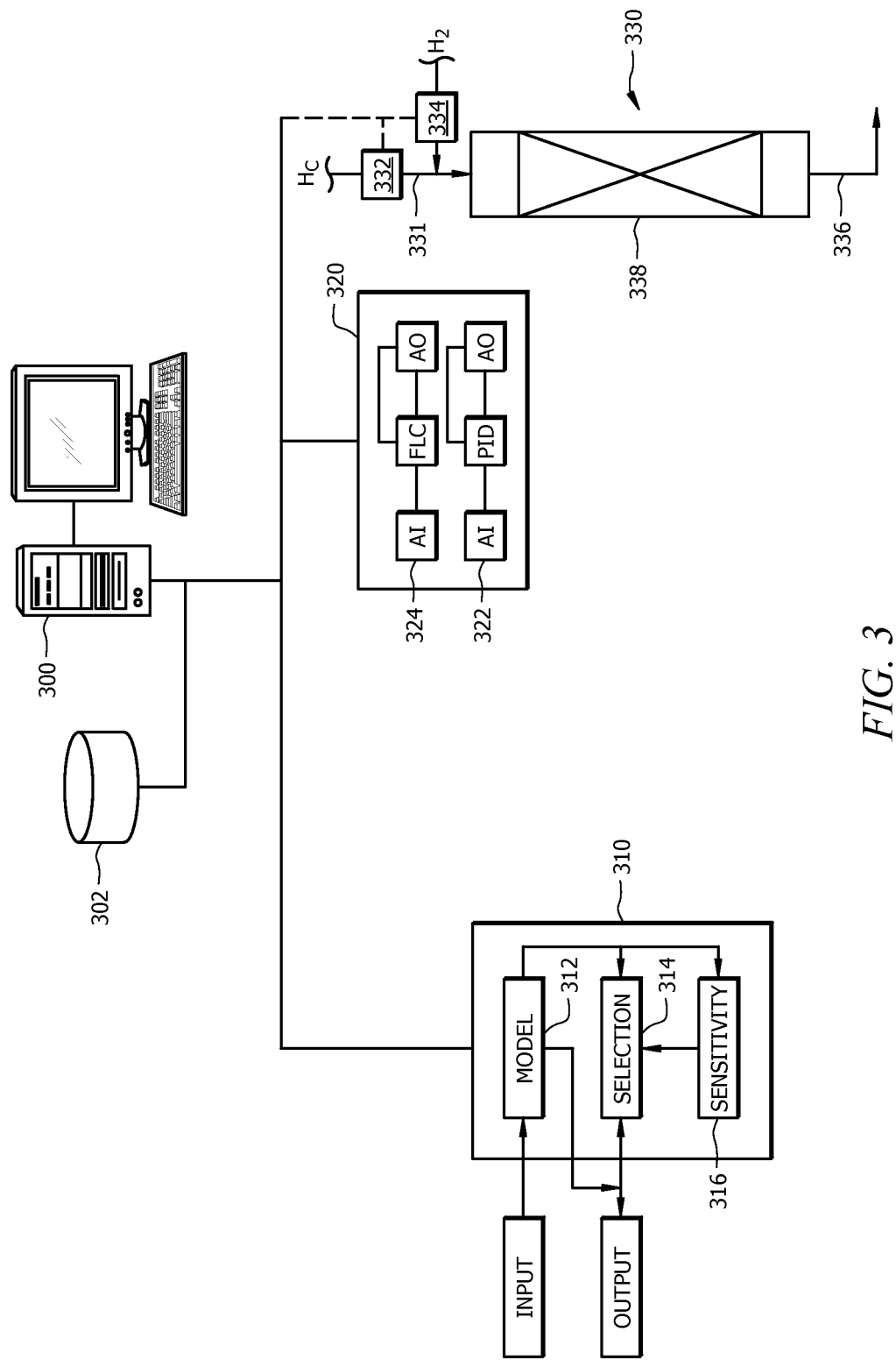
FIG. 3 illustrates a computer system and catalytic reactor system suitable for implementing one or more embodiments of the disclosure.

FIG. 3 illustrates the deactivation kinetic model 310 as disclosed herein utilized in conjunction with a computer system 300 (for example, computer system 200 as described herein) and a catalytic reactor system 330 (for example, as shown in FIG. 1 and described herein). All or a portion of the deactivation kinetic model 310 as disclosed herein may be located on computer system 300 or on a combination of computer systems 300 (e.g., a distributed computing system). A control program 320 may also be located in whole or in part on the computer system 300. The deactivation kinetic model 310 and/or control program 320 may communicate with the catalytic reactor system 330 through the computer system 300 as described herein.

In an embodiment, the deactivation kinetic model 310 may comprise an input, an output, a model unit 312, a selection unit 314, and a sensitivity unit 316. The input and output may move data into and out of the kinetic model 310, and may occur automatically (e.g., in computer system 300) or manually (e.g., through user input). The deactivation kinetic model 310 may predict run-length and/or net present amount of benzene of the catalytic reactor system 330 as a function of H2/HC ratio, LHSV, and/or conversion of $C_6$-convertibles in model unit 312. The selection unit 314 of the deactivation kinetic model 310 may then be used to select (either automatically or manually) H2/HC ratio, LHSV and/or conversion of $C_6$-convertibles which maximize run-length and or net present amount of product (e.g., benzene). Sensitivity of the values predicted by the model unit 312 may be determined in the sensitivity unit 316 (e.g., utilizing Equation 23), and the values calculated by the sensitivity unit 316 may be output (e.g., to a display of the computer system 300, to external storage 302, or combinations thereof). The values of H2/HC ratio, LHSV, and/or conversion of $C_6$-convertibles may be output to other components of computer system 300 (e.g., ROM, RAM, internal hard drive, external storage 302, a display, combinations thereof, etc.), or the values may be output through computer system 300 to the catalytic reactor system 330.

In one or more embodiments, the computer system 300 may have a control program 320 which comprises one or more control routines, such as a fuzzy logic control routine 324 and/or a PID control routine 322. The control program 320 may control the values of H2/HC ratio, LHSV, and/or conversion of $C_6$-convertibles selected by the deactivation kinetic model 310. The control program 320 may alternatively or additionally control other parameters of the catalytic control system 330 so as to maintain the system 330 with the values selected by or with the deactivation kinetic model 310. In FIG. 3, the control program 320 may control (e.g., open, close, adjust a degree of operation, or combinations thereof) components 332 and 334 (e.g., pumps or valves) to control the operating conditions (e.g., pressure, temperature, flow rate) of the HC stream and H2 stream entering reactor 338 through feedstream 331. For example, the fuzzy logic control routine 324 and PID control routine 322 of the control program 320 may communicate analog input (AI) and analog output (AO) with components (e.g., components 332 and 334) of the catalytic reactor system 330. Data from the control program 320 may be stored in the computer system 300, the external storage 302, or combinations thereof. The effluent stream 336 of the catalytic reactor system 330 may contain the desired product produced according to the selected value of H2/HC ratio, LHSV, and/or conversion of $C_6$-convertibles which maximize run-length and/or net present amount of product produced in catalytic reactor system 330.

In an embodiment, the computer system 300 may communicate with the catalytic reactor system 330 including reactor 338 and components 332 and 334. In an embodiment, components 332 and 334 and/or reactor 338 of the catalytic reactor system 330 may be coupled to the computer system 300 such that data obtained may be stored and/or used by the computer system 300.

In embodiments, components or conditions of the catalytic reactor system 330 may change or be modified. The run-length and net present amount of benzene may be again kinetically modeled to account for changes in the catalytic reactor system 330. For example, the catalytic reactor system 330 may change as a result of addition of fresh catalyst, regeneration of deactivated catalyst, or the addition or use of co-catalysts to the system 330. In such scenarios, coefficients and values in the equations of the disclosed deactivation kinetic model may be calibrated and/or adjusted to more accurately predict the run-length and/or net present amount of benzene for the catalytic reactor system 330. The computer system 300 may be utilized to adjust the equations, to kinetically model the changed system 330 as a function of H2/HC ratio, LHSV, and conversion of $C_6$-convertibles, and to predict new run-lengths and/or net present amount of benzene scenarios. A user or the computer system 300 may then select new values H2/HC ratio, LHSV, and conversion of-convertibles which maximize the production of benzene and/or run-length in the catalytic reactor system 330 under changed components or conditions. In alternative embodiments, none or only a portion of the disclosed embodiments may be utilized on the computer system 300 so as to account for changes in the catalytic reactor system 330.

In an embodiment, the computer system 300 may kinetically model different catalyst systems to predict which catalyst system has improved LHSV, H2/HC ratio, and conversion of $C_6$-convertibles for operating conditions which are available at a given site where a reactor system (e.g., catalytic reactor system 330) may be located. For example, catalyst systems which require high H2/HC ratios for maximum run-length and/or net present amount of benzene (as determined via the deactivation kinetic modeling disclosed herein) may not be suitable for sites which have limited access to required amounts of hydrogen; thus, other systems may be kinetically modeled (e.g., by adjusting coefficients and values in the equations of the disclosed deactivation kinetic model) to find a suitable catalytic reactor system which does not require unobtainable amounts of hydrogen. In alternative embodiments, none or only a portion of the kinetic modeling associated with changes and/or modifications may be utilized on the computer system 300 so as to kinetically model different catalyst systems.

The computer system 300 may be capable of receiving internal data and/or external data and generating and delivering signals to components of the catalytic reactor system 330. For example, the computer system 300 may receive automated instructions and/or manual instructions from a user input, and may send signals to, for example, the reactor 338, components 332 and 334, or combinations thereof of the catalytic reactor system 330 based on the kinetic modeling performed according to the disclosed subject matter. Thus, the computer system 300 may be coupled to the catalytic reactor system 330, and may display the selected and operating values for H2/HC ratio, LHSV, and/or conversion of $C_6$-convertibles. As such, the computer system 300 may be capable of affecting various functions of catalytic reactor system 330. In alternative embodiments, the catalytic reactor system 330 may be controlled manually or by a system(s) in addition to or other than computer system 300.

As disclosed herein, improvement of the catalytic reforming process may comprise kinetically modeling the catalytic reforming process. Typically, one or more components of the feedstream undergoes one or more reforming reactions to produce aromatics. Some of the hydrocarbon reactions that occur during the reforming operation include the dehydrogenation of cyclohexanes to aromatics, dehydroisomerization of alkylcyclopentanes to aromatics, and dehydrocyclization of acyclic hydrocarbons to aromatics. A number of other reactions also occur, including the dealkylation of alkylbenzenes, isomerization of paraffins, and hydrocracking reactions which produce light gaseous hydrocarbons, e.g., methane, ethane, propane, and butane. These reforming reactions may be kinetically modeled in a deactivation kinetic model as described herein, for example, by using one or more aromatization reaction rate equations. While catalyzing the foregoing reforming reactions, the reforming catalyst itself may be subjected to a number of reactions that cause the catalyst to deactivate. These deactivation reactions of the reforming catalyst may be kinetically modeled in a deactivation kinetic model as described herein, for example, by using one or more catalyst deactivation equations. Also, the overall process may be subject to heat balance, for example by using a heat balance equation. Kinetic models including catalyst deactivation equations are referred to herein as deactivation kinetic models. Accordingly, in an embodiment, the deactivation kinetic model may comprise one or more equations of at least three basic types, namely aromatization reaction rate equations, heat balance equations, and catalyst deactivation equations.

In an embodiment, a single rate equation may be used to represent the aromatization reaction. For example, an irreversible first order aromatization rate equation for a plug flow reactor may be written as:

$$k(t)=p(t)\exp(-E_r/RT)=-\upsilon[(1+\delta)\ln(1-f)+\delta f] \qquad (1)$$

wherein $E_r$ is the activation energy of the reaction, p(t) is the pre-exponential factor of the Arrhenius rate constant (which is the intrinsic catalyst activity), T is the reaction temperature, $\upsilon$ is the gas hourly space velocity (GHSV), $f$ is the fraction conversion of the convertibles, and $\delta$ is a dimensionless parameter that accounts for the change in the number of moles of gaseous species as a result of the aromatization reactions. Note that p is a function of time because of catalyst deactivation.

The conversions of paraffins, isoparaffins, and napthenes as a combined feedstream are all lumped into a single equation in Equation (1). In embodiments, the deactivation kinetic model may be more complex, including separate rate equations for the various components of the feedstream. For example, separate rate equations similar to Equation (1) may be written for the $C_6$-convertibles as well as for the $C_7$ and $C_8$-convertibles. The term "$C_x$-convertibles" as used herein refers to those components containing x carbons that are readily converted to aromatics via a catalytic reforming process. For example, when the reforming process utilizes a catalyst having platinum dispersed on a zeolitic catalyst support, the $C_6$-convertibles can be all $C_6$ hydrocarbons excluding the highly substituted hydrocarbons, such as the dimethylbutane isomers. By utilizing separate rate equations for the various components of the feedstream, the model can be run to target certain conversion of $C_6$-convertibles as it may be often practiced in a plant. As the catalyst deactivates during the catalytic reforming processes, the inlet temperature of the reactor(s) may be raised to maintain the overall conversion at the process outlet, e.g., reactor effluent. By fitting the model to plant or laboratory data, kinetic parameters may be revised. Including hydrocracking reactions and separate kinetic equations for the various components of the feedstream allows for a better description of the catalytic reactor temperature profile over the run-length of the catalyst. Accordingly, in another embodiment, a plurality of rate equations such as Equations (2), (3), and (4) may be used to represent the aromatization reaction.

An irreversible first order aromatization reaction rate equation of the conversion of $C_6$-convertibles in a plug flow reactor may be written as:

$$p_6(t)\exp(-E_{r,6}/RT)=-\upsilon[(1+\delta_6)\ln(1-f_6)+\delta_6 f_6] \qquad (2)$$

where $E_{r,6}$ is the activation energy of the reaction, $p_6$ is the pre-exponential factor, $\upsilon$ is the GHSV, $f_6$ is the fraction of conversion for the $C_6$-convertibles, and $\delta_6$ accounts for the change in the number of moles of gaseous species as a result of the aromatization of the $C_6$-convertibles. $p_6$ is a function of time due to catalyst deactivation.

A rate equation similar to Equation (2) for the $C_7$ & $C_8$-convertibles may be written as:

$$p_{7\&8}(t)\exp(-E_{r,7\&8}/RT)=-\upsilon[(1+\delta_{7\&8})\ln(1-f_{7\&8})+\delta_{7\&8} f_{7\&8}] \qquad (3)$$

where $E_{r,7\&8}$ is the activation energy of the reaction, $p_{7\&8}$ is the pre-exponential factor, $\upsilon$ is the GHSV, $f_{7\&8}$ is the fraction conversion of the $C_7$ and $C_8$-convertibles, and $\delta_{7\&8}$ accounts for the change in the number of moles of gaseous species as a result of the aromatization of the $C_7$ and $C_8$-convertibles. $p_{7\&8}$ is a function of time due to catalyst deactivation.

In embodiments, the deactivation kinetic model also accounts for the exothermic hydrocracking reaction, which may be significant near end of run (EOR) conditions, and for accurately determining the run-length of the catalyst. An equation describing the cracking of a paraffin molecule into two smaller molecules is:

$$p_{hc}(t)\exp(-E_h/RT) = -\upsilon \ln(1-f) \quad (4)$$

where $E_{hc}$ is the activation energy of the hydrocracking reaction and $p_{hc}$ is the preexponential factor of the hydrocracking reaction. The hydrocracking of paraffins does not alter the number of molecules in the product. In embodiments, it may be assumed that hydrocracking does not alter the amount of convertibles and that all hydrocarbons in the feedstream can be hydrocracked.

In an embodiment, a single heat balance equation may be used for the reactor, for example:

$$C_p \Delta T = f C_0 H_r \quad (5)$$

wherein $C_p$ is the heat capacity of the stream, $\Delta T$ is the change in the reactor temperature as the result of the reaction, $C_0$ is the inlet concentration of the convertibles in the stream, and $H_r$ is the heat of the aromatization reaction.

In a similar manner to the use of separate kinetic equations for the various components of the feedstream, separate heat balance equations may be written. Accordingly, in an embodiment, a plurality of heat balance equations such as Equation (6). The heat balance for the aromatization reactions of $C_x$ convertibles, wherein $x=C_6$, $C_7$, or $C_8$ may be given by an equation analogous to Equation (5):

$$C_p \Delta T_r = f C_x H_r \quad (6)$$

where $C_p$ is the heat capacity of the stream, $\Delta T_r$ is the change in the reactor temperature as the result of the aromatization reactions, $C_x$ is the inlet concentration of the $C_x$ convertibles in the stream, and $H_r$ is the heat of reaction for the aromatization reactions.

A similar equation may be written for the hydrocracking reaction:

$$C_p \Delta T_{hc} = f \dot{C}_x H_{hc} \quad (7)$$

wherein $\Delta T_{hc}$ is the change in the reactor temperature as the result of the hydrocracking reaction, $\dot{C}_x$ is the concentration of $C_x$ hydrocarbons in the feedstream, and $H_{hc}$ is the heat of reaction for the hydrocracking reaction Predictions of the kinetic models above (Equations (1)-(7) or Equations (2), (3), (4), (6), and (7)), i.e., kinetic models without catalyst deactivation, are restricted to those of start of run (SOR) conditions, and may be used, for example, to determine SOR temperature, hereinafter referred to as $T_o$. In order to project reactor and catalyst performance over time in plant conditions and to predict the run-length of the catalyst, catalyst deactivation may be included in the kinetic modeling herein disclosed for the determination of improved reforming process conditions, and use of such deactivation kinetic models is disclosed further herein.

In embodiments, the decay of reforming catalyst activity with on-stream time t (i.e., catalyst deactivation) may be described by a first order rate equation:

$$da(t)/dt = -k_d(T)a(t) \quad (8)$$

wherein a(t) is the normalized catalyst activity which is defined as $p_x(t)/p_x(t=0)$ with $x=6$ or $7\&8$ and $k_d(T)$ is the deactivation rate constant. In embodiments, it may be assumed that Equation (8) applies to $C_6$, $C_7$ and $C_8$ aromatization and that the hydrocracking reaction can also be deactivated but at a much slower rate. The deactivation of the hydrocracking may be described as $a(t)^\alpha$ where $\alpha$ is much smaller than unity and is one of the fitting parameters.

The deactivation rate constant of Equation (8), $k_d(T)$, can be expressed in the Arrhenius form:

$$k_d(T) = A_d \exp(-E_d/RT) \quad (9)$$

where T is the catalyst temperature, $E_d$ is the activation energy of the reaction that leads to catalyst deactivation, and R is the gas constant. The deactivation amplitude $A_d$ is a function of H2/HC ratio. In embodiments, $A_d$ and H2/HC ratio may be linearly correlated.

Equations (1) to (9) are disclosed herein. In one or more embodiments, a deactivation kinetic model may comprise Equation (1), Equation (2), Equation (3), Equation (4), Equation (5), Equation (6), Equation (7), Equation (8), Equation (9), or combinations thereof. In an embodiment, a deactivation kinetic model may comprise Equations (1) to (9). In an additional or alternative embodiment, a deactivation kinetic model may comprise Equations (1), (4), (5), (7), and (8). The deactivation kinetic model may be represented by first order rate equations for the conversion of light naphtha to aromatics, and hydrocracking, two heat balance equations, and a catalyst deactivation equation represented by a first order decay of the catalyst activity. In an additional or alternative embodiment, a deactivation kinetic model may comprise Equations (2), (3), (4), (5), (7), and (8). The deactivation kinetic model may be represented by a rate equation for the conversion of $C_6$-convertibles, a rate equation for the $C_7$ and $C_8$-convertibles, a rate equation for exothermic hydrocracking, a heat balance for the aromatization reactions, a heat balance for the hydrocracking reaction, and a catalyst deactivation equation. Deactivation kinetic models, such as those disclosed herein, may be applied to a single reactor vessel, or may be applied to a plurality of reactor vessels, for example, a series of reactors. Individual parameters within a given equation (e.g., $E_r$, p, $C_p$, $H_r$, etc.) may be adjusted independently for each reactor in a plurality of reactors to provide a more accurate representation of the performance of each reactor.

A deactivation kinetic model may be used to calculate a fouling curve for a given reforming catalyst. A fouling curve may be defined as the catalyst temperature, T, for maintaining a given conversion of $C_6$-convertibles as a function of on-stream time, t. The intersection between the fouling curve and the prescribed end-of-run (EOR) catalyst temperature gives the catalyst run-length. The EOR catalyst temperature may be a function of catalyst and/or process equipment (e.g., reactor metallurgy) maximum operating temperatures. For example, the EOR temperature may range from about 900° F. to about 1100° F.; alternatively, from about 950° F. to about 1050° F.; alternatively, from about 1000° F. to about 1020° F. In an embodiment, the EOR may be about 940° F. The run-length of the catalyst may be further determined as a function of the conversion of $C_6$-convertibles in the feedstream, LHSV of the feedstream, and H2/HC ratio in the feedstream.

After setting up the three dimensional process variable space spanned by conversion of $C_6$-convertibles, LHSV and H2/HC ratio, one may calculate the fouling curve for each point in that space with a deactivation kinetic model [e.g., a simplified model employing Equations (1), (4), (5), (7), and (8) or a more complex model employing Equations (2), (3), (4), (5), (7), and (8)]. For a given EOR temperature, the run-lengths of the reforming catalyst may be read from the various fouling curves. Accordingly, the run-length of the catalyst may be established as a function of the LHSV of the feedstream, the H2/HC ratio in the feedstream, and the conversion of $C_6$-convertibles in the feedstream.

For a given reactor system (e.g., a plurality of reactors in series), the equations of a deactivation kinetic model may be coupled and solved numerically using methods recognized by those of skill in the art with the aid of this disclosure, for example, using a Visual Basic Language equation solver application with an Excel spreadsheet interface. As one can see, just a few discrete values of each process variable (e.g., LHSV, H2/HC ratio, and conversion of $C_6$-convertibles) would mushroom into over hundreds of separate runs by a deactivation kinetic model. Such a brute force approach, while effective, is tedious and time consuming. Therefore, the fouling curve(s) generated by a deactivation kinetic model may be approximated with an analytical solution(s) to the deactivation kinetic model, for example, using an approximated analytical equation. In embodiments, solving of a deactivation kinetic model may be simplified via an approximated analytical equation depending on the system reactor configuration, for example, an isothermal reactor system or a series of adiabatic reactors, as described in more detail below.

Once the run-length of the reforming catalyst has been determined, the amount of benzene produced per unit of catalyst (e.g., pounds of benzene per pound of catalyst) during the life cycle (e.g., run-length) may be calculated from the run-length of the catalyst and the benzene yield per month.

In an embodiment, the amount of benzene produced per unit of catalyst may comprise calculating the net present amount of benzene produced.

In an embodiment, calculating the net present amount of benzene produced may comprise using the run-length of the reforming catalyst and a benzene yield per month of the reforming catalyst to calculate an amount of benzene produced over the run-length per unit of the reforming catalyst. Calculating the net present amount of benzene produced may further comprise discounting the amount of benzene produced over the run-length of the reforming catalyst per unit of reforming catalyst to determine the net present amount of benzene produced per unit of reforming catalyst over the run-length of the reforming catalyst.

In an additional or alternative embodiment, calculating the net present amount of benzene produced may comprise calculating the number of pounds of benzene produced per pound of reforming catalyst per hour, N, which may be calculated by:

$$N = 0.907 f w_{C6} LHSV (d_{lf}/d_c) \quad (10)$$

where $d_{lf}$, $d_c$, $f$, and $w_{C6}$ are, respectively, the density of the feedstream, the density of the reforming catalyst, the fraction representing conversion of $C_6$-convertibles, and the weight fraction of $C_6$-convertibles in the feedstream. The factor of 0.907 may represent the contraction in the molecular weight as a $C_6$ paraffin converts to benzene. The total amount of benzene produced per pound of catalyst in the run-length of the catalyst may then be calculated by multiplying N by the catalyst run-length in hours. In an embodiment, N may be greater than about 1; alternatively, greater than about 1.5; alternatively, greater than about 2; alternatively, greater than about 2.5; alternatively, greater than about 3; alternatively, greater than about 3.5; alternatively, greater than about 4; alternatively, greater than about 4.5; alternatively, greater than about 5; alternatively, greater than about 5.5; alternatively, greater than about 6. In an embodiment, N may be in a range from about 1.5 to about 6; alternatively, from about 2 to about 5.

In an additional or alternative embodiment, calculating the net present amount of benzene product may comprise calculating the net present pounds of benzene produced per pound of reforming catalyst over the run-length of the reforming catalyst, NPPB, which may be calculated by:

$$NPPB = (N/720)\{1-(1-D_m)^n\}/D_m \quad (11)$$

where $D_m$ is the monthly discount rate and n is the run-length of the reforming catalyst in units of months. The monthly discount rate $D_m$ is related to the yearly discount rate by $(1-D_y) = (1-\text{yearly discount rate})^{1/12}$. In an embodiment, NPPB may be greater than about 14,000; alternatively, greater than about 16,000; alternatively, greater than about 18,000. In an embodiment, NPPB may be in a range of about 14,000 to about 30,000; alternatively, about 16,000 to about 24,000. A time-value formula may be used to correct future benzene value to a present value. Because the value of one pound of benzene at the present is worth more than that a few years from now, the time value of benzene must be taken into account. Alternatively, one can consider that one pound of benzene produced in the future would have been actually less than one pound of benzene had it been produced today. The percent reduction may be the same as the discount rate in the value of the benzene.

In an embodiment, the deactivation kinetic model may be simplified for a catalytic reforming process comprising an isothermal reactor system. The deactivation kinetic model may be modified for isothermal calculations by setting all the heats of reactions to zero. Because at high conversions the H2/HC ratio in an isothermal reactor increases significantly as one moves toward the reactor outlet, $A_d$ may be treated as an implicit function of the distance from the reactor inlet. Also, $A_d$ at each location along the reactor axis may be a weak function of the on-stream time, t, because the H2/HC ratio at a given location changes as the catalyst deactivates. The simplification follows from the fact that the fouling curve calculated with $A_d$ varying along the reactor can be represented by the analytical solution of an isothermal reactor with a single $\tilde{A}_d$ for the whole catalyst bed. Accordingly, the change of the fouling curve with on-stream time, t, for a fixed conversion may be given by the analytical solution represented by:

$$T(t) = \frac{T_0}{1 + (RT_0/E_d)\ln\left[1-(E_d/\tilde{E}_r)\tilde{k}_d(T_0)t\right]} \quad (12)$$

where $\tilde{k}_d$ represents the average of $k_d$ across the reactor; $\tilde{E}_r$ is the average activation energy of the aromatization reaction of the $C_6$-, $C_7$- and $C_8$-convertibles; and $T_o$ is the start-of-run (SOR) temperature in Kelvin. $T_o$ may depend on LHSV, H2/HC ratio, and conversion of $C_6$-convertibles. For example, $T_o$ may be calculated as a function of GHSV ($\upsilon$) and conversion of convertibles ($f$) using Equation (1); alternatively, $T_o$ may be calculated as a function of GHSV ($\upsilon$) and conversion of $C_6$-convertibles ($f$) using Equation (2); alternatively, $T_o$ may be calculated as a function of LHSV ($\upsilon$) and conversion of $C_7$- and $C_8$-convertibles ($f$) using Equation (3); alternatively, $T_o$ may be calculated as a function of GHSV ($\upsilon$) and conversion of convertibles ($f$) using Equation (4). According to Equation (9), $\tilde{k}_d$ may depend on $\tilde{A}_d$, which is the average of $A_d$ across the reactor and may be determined as a function of H2/HC ratio and conversion of $C_6$-convertibles. For example, $\tilde{A}_d$ may be calculated from the H2/HC ratio and conversion of $C_6$-convertibles by the following equation:

$$\tilde{A}_d=1.343\times10^{11}-5.282\times10^{10}f-1.456\times10^{10}(H2/HC)_{inlet} \quad (13)$$

where $f$ is the fraction representing conversion of $C_6$-convertibles and $(H2/HC)_{inlet}$ is the hydrogen-to-hydrocarbon mole ratio in the inlet of a reactor. Without being limited by theory, it is believed the dependence of $\tilde{A}_d$ on conversion of $C_6$-convertibles may be due to the increase of H2/HC ratio in the reactor when more aromatization reaction occurs.

In embodiments, the run-length (t) of the reforming catalyst may be calculated as a function of conversion of $C_6$-convertibles ($f$), LHSV, and H2/HC ratio using Equations (12) and (13) and the values of $T_o$ from the isothermal reactor deactivation kinetic model. For example, for a given conversion of $C_6$-convertibles, H2/HC ratio, and LHSV, Equation (13) may be substituted for $\tilde{A}_d$ (e.g., in Equation (9), where $\tilde{k}_d$ may be calculated), EOR temperature may be selected for T, and the run-length of the reforming catalyst (t) may be calculated from Equation (12) when $T_o$ is calculated from, for example, one or more of Equations (1)-(3). The process of determining the run-length of the catalyst for each point in the process variable space is reduced to the calculation of $T_o$ at that point. Using a different correlation between $A_d$ and H2/HC ratio may result in a different linear function for Equation (13). However, the deactivation kinetic model calculations for $T_o$ need not be repeated in order to recalculate the run-length of the catalyst because, by definition, $T_o$ is independent of $A_d$ or $\tilde{A}_d$.

As shown in Example 1 hereinbelow, several trends can be established. First, for a given H2/HC ratio and LHSV, a lower conversion of $C_6$-convertibles may give a larger NPPB. When a reactor is operated at a lower conversion, the run-length of the catalyst may be longer. The longer run-length may be more than sufficient to compensate the time-value discount. However, there may be a limit on how low the conversion can be attained because of other operational requirements such as mogas octane number or the loading of the separation units downstream of the reactor. The results in Example 1 hereinbelow suggest a greater NPPB may be attained by operating the reactor at the lowest conversion that is consistent with other plant requirements. In embodiments, improving the reforming process may comprise selecting the lowest conversion of $C_6$-convertibles consistent with other plant requirements.

Second, for a given conversion, it is advantageous to run the catalytic reforming process at high LHSV. Although running at a higher LHSV means operating the reforming catalyst at a higher temperature, thus a shorter catalyst life, the amount of benzene produced per month is also proportionally higher. The end result is a larger NPPB. In practice, there is an upper limit on the LHSV because the aromatization reaction likely will become diffusion limited at high LHSV. More importantly, a high LHSV can lead to short run-length and frequent catalyst replacement. The cost of the associated down time as well as the lead time for the manufacture of the fresh catalyst may put a cap on high LHSV values.

In terms of logistics, it may be feasible to have a catalyst replacement cycle with a frequency of one year or longer. Using the run-length of the reforming catalyst of one year as a cut-off, according to Example 1 hereinbelow, a high NPPB may be achieved with a LHSV as high as 4, so long as mass transport does not become the rate limiting step at this LHSV. In embodiments, diffusion limitation occurs at a LHSV of about 5. In embodiments, the reforming process may be improved in terms of NPPB by running at a LHSV of about 4. In embodiments, the conversion of $C_6$-convertibles may range from about 83% to about 93% and selected values of LHSV of the feedstream and H2/HC ratio may be about 4.

Surprisingly, as shown in Example 1 hereinbelow, in embodiments, there is little advantage to using a high H2/HC ratio unless it is larger than 3. Although intuitively a higher H2/HC ratio may be thought to lead to a lower fouling, it does not necessarily translate into a longer run-length. As shown in the results in Example 1 hereinbelow, run-lengths of the catalyst for H2/HC ratios between 0.5 and 2 are similar. For an isothermal reactor, a higher H2/HC ratio results in a higher overall gas-hourly-space-velocity in the reactor, which requires a higher reactor temperature to maintain the conversion. In embodiments, for a given conversion of $C_6$-convertibles and LHSV, a higher value of NPPB is attained by selecting a H2/HC ratio of greater than 2 or less than about 1. In embodiments, improving the reforming process may comprise selecting a H2/HC ratio of greater than about 3; alternatively, improving the reforming process may comprise selecting a H2/HC ratio of about 4.

Catalyst activity may be expressed as a function of $A_d$, $E_d$, $E_r$, and $T_o$. A very simple equation for normalized catalyst activity, a(t), can be derived using the fact that, at a fixed conversion:

$$a(t)=\exp\{(E_r/R)(1/T(t)-1/T_o)\}. \quad (14)$$

Substituting Equation (14) into Equation (12), the normalized catalyst activity a(t) of an isothermal reactor over time is given by:

$$a(t)=\{1-((\tilde{k}_d(T_o)t)/\alpha)\}^\alpha \quad (15)$$

where $\alpha=\tilde{E}_r/E_d$ and $\tilde{k}_d$ is given by an equation similar to Equation (9) except that $A_d$ is replaced by $\tilde{A}_d$. The run-length is, therefore, dictated by $\tilde{k}_d(T_o)$. That is, a larger $\tilde{k}_d(T_o)$ leads to a shorter run-length. Referring to Equation (9), $\tilde{k}_d(T_o)$ is a product of $\tilde{A}_d$ and the Arrhenius factor $\exp(-E_d/RT_o)$. An increase in the H2/HC ratio reduces $\tilde{A}_d$ but increases the Arrhenius factor because of a higher $T_o$. These two opposing factors govern whether $\tilde{k}_d(T_o)$ increases or decreases with the H2/HC ratio, as further discussed in Example 1 hereinbelow.

In an embodiment, the deactivation kinetic model may be simplified for a catalytic reforming process comprising a series of adiabatic reactors to improve benzene production per catalyst usage. As for the isothermal reactor design discussed hereinabove, the deactivation kinetic model is used to generate the run-length of the catalyst as a function of conversion of $C_6$-convertibles, LHSV and H2/HC ratio. The run-length is in turn used to determine the amount of benzene produced per catalyst life cycle after factoring in the time value of the benzene.

The deactivation kinetic model as described above is used to generate the fouling curve, which for a series of adiabatic reactors is defined as the inlet temperature, T, of the first reactor for maintaining a given conversion of $C_6$-convertibles at the last reactor outlet as a function of run-length, t. In embodiments, equal inlet temperatures are assumed for all the reactors. The following discussion is for a six-reactor configuration with catalyst volume ratios of 10:10:10:20:20:30, although it is understood that the disclosed subject matter of kinetically modeling the catalytic reforming process is equally applicable to alternative numbers of reactors having different catalyst volume ratios.

To extend the deactivation model to run conditions with various H2/HC ratios, a correlation between the deactivation amplitude, $A_d$ (in units of $hr^{-1}$), of each of the six reactors with the H2/HC ratio to each of the reactors may be represented by:

$$A_d = 1.231 \times 10^{11} - 1.507 \times 10^{10} (H2/HC)_{inlet} \quad (16)$$

Because the heat capacity of the gas mixture in the reactor is also affected by the H2/HC ratio, it may be approximated by a linear combination of the heat capacities of the hydrogen and hydrocarbons.

As mentioned above, to determine the run-length of the reforming catalyst, one first calculates the fouling curve. The intersection between the fouling curve and the prescribed end-of-run (EOR) inlet temperature gives the run-length of the catalyst. However, instead of repeating the time consuming calculations of the fouling curve for various process conditions, one can seek an approximated analytical solution to the model describing the fouling curve. In an embodiment, an approximated analytical solution may be used to predict the fouling curve of a series of adiabatic reactors. As in the isothermal embodiment, the approximation greatly reduces the number of calculations required. Once the parameters in this analytical solution are established as a function of the process variables, determination of the various run-lengths and benzene yields is reduced to the determination of these parameters.

When comparing the fouling curves of an isothermal reactor to an adiabatic reactor under the same process conditions, one notices that the fouling curve of the latter has a smaller initial slope, namely a smaller initial fouling rate at the start of run (SOR). However, near EOR the fouling rate of the adiabatic reactors increases much more rapidly, and the fouling curve reaches EOR earlier. Without intending to be limited by theory, this difference can be explained as follows. Because of the large endotherm in an adiabatic reactor, only a small part of the catalyst bed is used at a given time. Initially, only the part of the catalyst bed near to the reactor inlet is utilized, and it is the first to be deactivated. The deactivation front moves down the bed with on-stream time. As long as the front is not close to the reactor outlet, one does not "sense" the catalyst deactivation and the catalyst fouling rate appears to be small. As the front moves close to the reactor outlet, there is not much catalyst activity left in the entire reactor, and rapid increases in the inlet temperature are necessary to maintain the conversion. An analytical solution describing this type of behavior may be represented by:

$$T(t) = T_a - \beta/(t_{max}) \ln(1 - t/t_{max}) \quad (17)$$

where $T(t)$ is the inlet temperature of at least one adiabatic reactor, $t$ is on-stream time, $t_{max}$ represents the theoretical maximum run-length of a catalyst (e.g., the time at which the catalyst has near zero activity and the reactor temperature approaches infinity), $\beta/t_{max}$ is the initial slope of the fouling curve and $T_a$ is related to the SOR T by $T_a = T(t=0) - \beta$. $\beta$ is an adjustable parameter describing the fouling of the catalyst near start-of run (SOR), and $\beta$ may be adjusted to fit the analytical solution (e.g., Equation (17)) to the fouling curve(s) (see, e.g., FIG. 7). Once SOR T is known, there are only two independent parameters in Equation (17). For an isothermal reactor, $t_{max}(iso)$ is given by:

$$t_{max}(iso) \sim (E_r \exp(E_d/RT_o^{iso}))/(E_d A_d) \quad (18)$$

where $E_r$ and $E_d$ are respectively the activation energy of the aromatization reaction (average of those of $C_6$, $C_7$ and $C_8$) and the deactivation reaction. $T_o^{iso}$ is the SOR temperature of the isothermal reactor.

In order to establish the relationship between these three parameters and the process variables, full calculations with the deactivation kinetic model for the process variables that span a wide range of run-lengths and SOR temperatures are performed. Equation (17) is fitted to the resulting fouling curves to determine the $t_{max}$ and $T_a$. In embodiments, $t_{max}$ is correlated linearly to $t_{max}(iso)$ when the latter is obtained from Equation (18) under the same process conditions as follows:

$$t_{max} = 0.9101 t_{max}(iso) \quad (19)$$

This relationship is expected because, under similar process conditions, the maximum run-lengths should be about the same between the isothermal and adiabatic reactors.

Because $T_a$ or $\beta$ reflects the slope of the fouling curve, such are expected to be a complicated function of LHSV, H2/HC ratio, conversion of $C_6$-convertibles and $t_{max}$. Accordingly, a new process variable $\varphi$ is defined as:

$$\varphi = B t_{max} (H2/HC)^a_{inlet\ 1st\ reactor} (LHSV)^b + CT(t=0)^c \quad (20)$$

and a second order polynomial of $\varphi$ is fit to the $T_a$ obtained from the sample calculations. In Equation (20), $T(t=0)$ and $t_{max}$ are, respectively, in units of Kelvin and day. The coefficients B and C as well as the exponents a, b and c are varied to obtain the best fit. In embodiments, the best fit may be achieved with $\varphi$ given by:

$$\varphi = -70 t_{max} (H2/HC)^{0.65}_{inlet\ 1st.reactor} (LHSV)^{0.434} + T(t=0)^2 \quad (21)$$

and $T_a$ may be found to correlate with $\varphi$ by the equation:

$$T_a = 6.643 \times 10^2 - 1.013 \times 10^{-3} \varphi + 1.265 \times 10^{-9} \varphi^2 \quad (22)$$

Incorporation of the conversion of the $C_6$-convertibles $f$ into Equation (20) leads to a zero exponent for $f$, which leads to the belief that $T_a$ is not a function of $f$.

In order to determine the sensitivity of Equations (19), (21) and (22) to the correlation between the deactivation amplitude and H2/HC ratio, a slightly different equation for $A_d$ may be examined in another analytical solution:

$$A_d = 1.505 \times 10^{11} - 2.010 \times 10^{10} (H2/HC)_{average} \quad (23)$$

in which $A_d$ of each reactor in the series is determined by the average H2/HC ratio in that reactor. The results are summarized in the Example 3. The linear correlation between $t_{max}$ and $t_{max}(iso)$ remains valid although the proportionality constant is slightly different. Equation (21) remains unchanged and the coefficients in Equation (22) are slightly modified.

The SOR inlet temperatures $T(t=0)$ for various process conditions are calculated directly from the deactivation kinetic model of the adiabatic reactors. Since SOR temperatures are independent of the correlation between $A_d$ and H2/HC ratio, SOR T only needs to be calculated once and at $t=0$.

With $T(t=0)$, $t_{max}$ and $T_a$ determined, the fouling curve according to Equation (17) for the adiabatic reactors is fully defined. The run-length of the reforming catalyst as a function of conversion of $C_6$-convertibles $f$, LHSV, and H2/HC ratio to the $1^{st}$ reactor is then determined from Equation (17) by setting T equal to the selected EOR temperature. Thus, the run-length for a series of adiabatic reactors is calculated using Equations (17), (19), (21) and (22) and the values of SOR T from the deactivation kinetic model of the adiabatic reactors.

The net present pounds of benzene produced per pound of catalyst during the run-length of the catalyst (NPPB) may be calculated from the Equations (10) and (11), as for the isothermal reactor embodiment.

EXAMPLES

The inventive subject matter having been generally described, the following examples are given as particular embodiments of the inventive subject matter and to demonstrate the practice and advantages thereof. It is understood that the examples are given by way of illustration and are not intended to limit the specification of the claims to follow in any manner. The data in the Examples is computer generated using Equations 1 to 9 as the embodiment for the deactivation kinetic model.

Example 1

The above-described deactivation kinetic model was used to determine process parameters which improve a catalytic reforming process utilizing an isothermal reactor. The relevant deactivation kinetic parameters, EOR condition, and feedstream composition for an isothermal reactor embodiment are summarized below in Table 1.

TABLE 1

| Kinetic Parameter | Feed Properties |
|---|---|
| C6 $E_r$ = 71.90 kcal/mole | Composition, wt % |
| C7 & C8 $E_r$ = 71.02 kcal/mole | C6 convertibles = 49.4 |
| C6 $P_0$ = 3.58 × $10^{24}$ $hr^{-1}$ | C7 & C8 Convertibles = 36.1 |
| C7 & C8 $P_0$ = 2.74 × $10^{24}$ $hr^{-1}$ | Others = 14.5 |
| $E_d$ = 50 kcal/mole | Density $d_{lf}$ = 0.675 g/cc |
| $A_d$ = 1.2308 × $10^{11}$-1.5074 × $10^{10}$ (H2/HC), $hr^{-1}$ | Average mol weight = 91.41 |
| $\tilde{E}_r$ = 71.5 kcal/mole | |
| Reactor Pressure = 79.7 psia | Catalyst density $d_c$ = 0.70 g/cc |
| End-of-run T = 940 F. | Yearly discount rate for benzene = 10% |

An end-of-run (EOR) catalyst temperature of 940° F. (777 K) was used, which translates to a reactor skin temperature of about 1000° F. $\tilde{E}_r$ in Equation (12), which is the average activation energy of the aromatization reaction of the $C_6$-, $C_7$- and $C_8$-convertibles, has a value of 71.5 kcal/mole. $T_o$ is the start-of-run (SOR) temperature, which depends on LHSV, H2/HC ratio, and conversion of $C_6$-convertibles.

Figure 4:
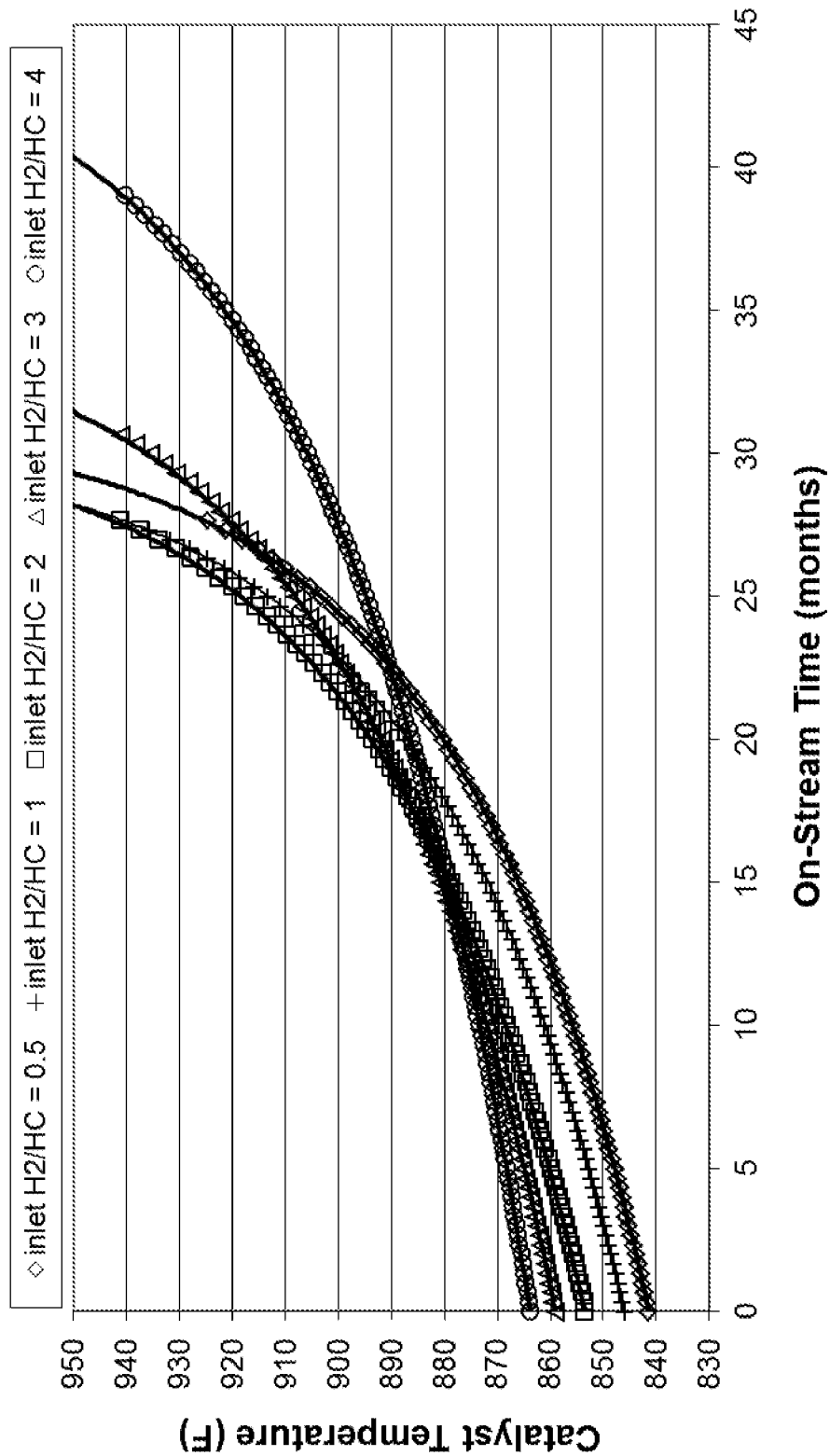
FIG. 4 is a plot of fouling curves predicted by a deactivation kinetic model and an analytical solution of Equation (12) fit to each of the fouling curves.

FIG. 4 is a plot of fouling curves predicted by the deactivation kinetic model (i.e., the shaped data points) and the fit of Equation (12) to the deactivation kinetic model (i.e., the solid lines). The deactivation kinetic model calculations are based on a feedstream composition shown in Table 1, a conversion of $C_6$-convertibles of 85% and a LHSV of 1.6. It is clear that the fits are exceptionally good.

Figure 5:
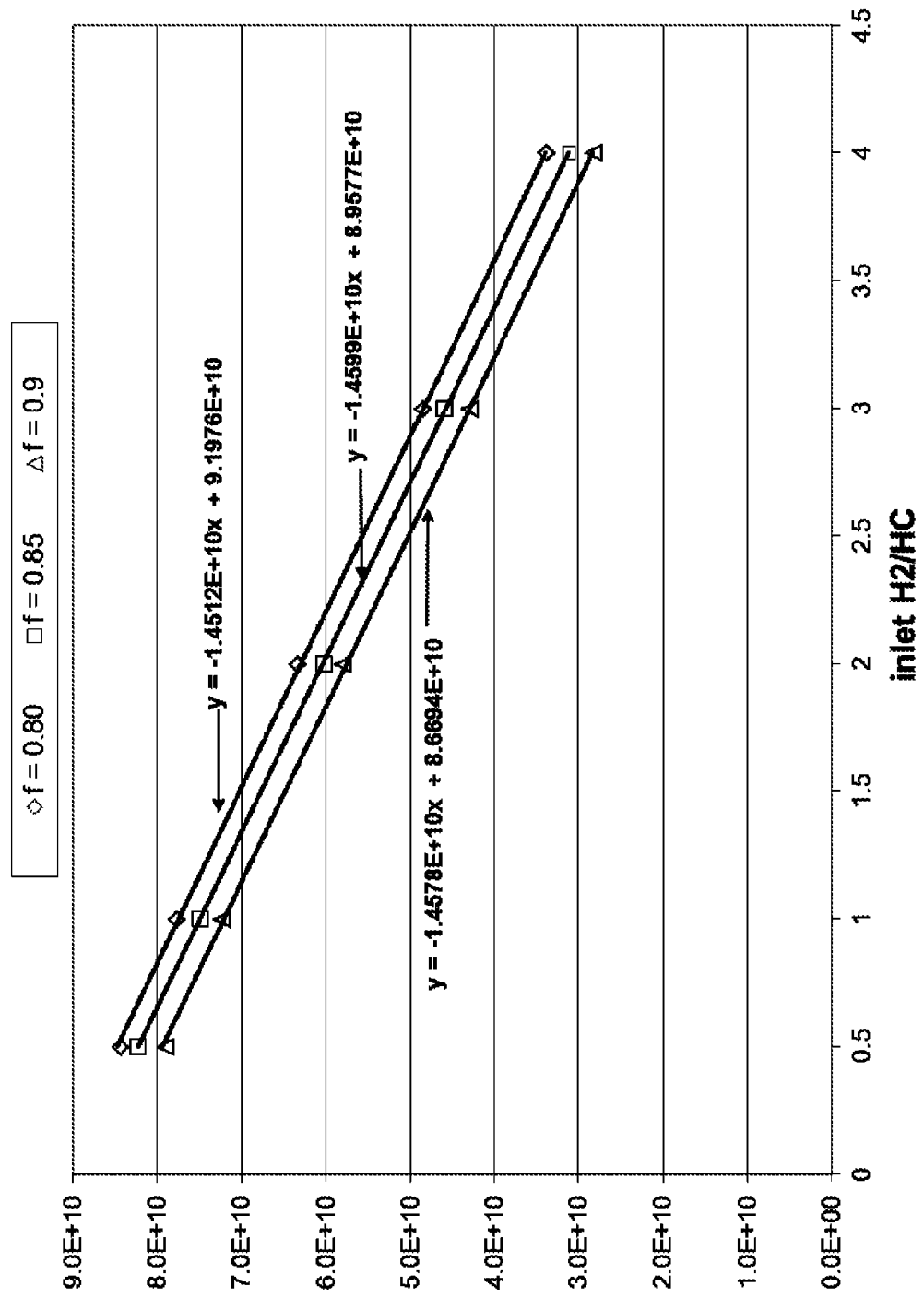
FIG. 5 is a plot of $\tilde{A}_d$ in units of $hr^{-1}$ as a function of H2/HC ratio and conversion of $C_6$-convertibles for an isothermal reactor.

FIG. 5 shows $\tilde{A}_d$ as a function of the inlet H2/HC ratio for different values of conversion of $C_6$-convertibles for an isothermal reactor. The results in FIG. 5 can be reduced to a single equation, Equation (13) hereinabove, which was used in Equation (12). In FIG. 4, Equation (12) was fitted to the fouling curves of the deactivation kinetic model, i.e., the curves made by the series of data-points generated with Equations (1) to (9).

With an EOR temperature of 940° F., LHSV of 1.6 and conversion of $C_6$-convertibles of 85%, it can be seen in FIG. 4 that the run-length for the inlet H2/HC ratios of 0.5, 1, 2, 3, and 4 are about 28.8, 27.7, 27.6, 30.6, and 38.8 months, respectively. Plots like FIG. 4 may be made for different combinations of conversion of $C_6$-convertibles, LHSV, and inlet H2/HC ratio values. However, instead of reading run-length off numerous plots of Equation (12) (e.g., FIG. 4) for numerous combinations of conversion of $C_6$-convertibles, LHSV, and inlet H2/HC ratio values, the run-length of the reforming catalyst was calculated as a function of conversion of $C_6$-convertibles, LHSV, and inlet H2/HC ratio as described above using Equations (12) and (13) and the values of $T_o$ from the deactivation kinetic model utilizing an isothermal reactor. The results are shown in Table 2, with run-length in units of months rounded to the nearest tenth.

TABLE 2

| | | \multicolumn{7}{c}{Catalyst Life, months} | | | | | | | |
|---|---|---|---|---|---|---|---|---|
| | | \multicolumn{7}{c}{LHSV} | | | | | | | |
| | | 1.2 | 1.6 | 2 | 2.4 | 2.8 | 3 | 4 | 5 |
| Conversion of $C_6$-Convertibles = 83% | | | | | | | | | |
| H2/HC | 0.5 | 37.8 | 30.4 | 25.5 | 22.1 | 19.5 | 18.5 | 14.6 | 12.0 |
| | 1 | 36.3 | 29.1 | 24.4 | 21.1 | 18.6 | 17.6 | 13.8 | 11.3 |
| | 2 | 36.3 | 28.9 | 24.2 | 20.8 | 18.3 | 17.2 | 13.4 | 10.9 |
| | 3 | 40.2 | 31.9 | 26.5 | 22.7 | 19.9 | 18.7 | 14.4 | 11.6 |
| | 4 | 50.6 | 40.0 | 33.1 | 28.3 | 24.6 | 23.1 | 17.6 | 14.0 |
| Conversion of $C_6$-Convertibles = 85% | | | | | | | | | |
| H2/HC | 0.5 | 35.9 | 28.8 | 24.2 | 20.9 | 18.5 | 17.5 | 13.7 | 11.3 |
| | 1 | 34.6 | 27.7 | 23.2 | 20.0 | 17.6 | 16.6 | 13.0 | 10.7 |
| | 2 | 34.7 | 27.6 | 23.1 | 19.8 | 17.4 | 16.4 | 12.7 | 10.3 |
| | 3 | 38.7 | 30.6 | 25.4 | 21.8 | 19.0 | 17.9 | 13.7 | 10.9 |
| | 4 | 49.2 | 38.8 | 32.1 | 27.3 | 23.7 | 22.3 | 16.8 | 13.3 |
| Conversion of $C_6$-Convertibles = 87% | | | | | | | | | |
| H2/HC | 0.5 | 35.9 | 27.2 | 22.8 | 19.7 | 17.4 | 16.4 | 12.9 | 10.6 |
| | 1 | 32.8 | 26.2 | 21.9 | 18.9 | 16.6 | 15.7 | 12.2 | 10.0 |
| | 2 | 33.1 | 26.3 | 21.9 | 18.8 | 16.4 | 15.5 | 11.9 | 9.6 |
| | 3 | 37.1 | 29.3 | 24.3 | 20.7 | 18.1 | 17.0 | 12.9 | 10.3 |
| | 4 | 47.7 | 37.5 | 31.0 | 26.3 | 22.8 | 21.3 | 16.1 | 12.6 |

TABLE 2-continued

| | | Catalyst Life, months | | | | | | | |
|---|---|---|---|---|---|---|---|---|---|
| | | LHSV | | | | | | | |
| | | 1.2 | 1.6 | 2 | 2.4 | 2.8 | 3 | 4 | 5 |
| Conversion of $C_6$-Convertibles = 89% | | | | | | | | | |
| H2/HC | 0.5 | 32.0 | 25.6 | 21.4 | 18.5 | 16.3 | 15.4 | 12.0 | 9.8 |
| | 1 | 30.9 | 24.7 | 20.6 | 17.7 | 15.6 | 14.7 | 11.4 | 9.3 |
| | 2 | 31.4 | 24.9 | 20.7 | 17.7 | 15.5 | 14.5 | 11.2 | 9.0 |
| | 3 | 35.4 | 27.9 | 23.1 | 19.6 | 17.1 | 16.0 | 12.1 | 9.6 |
| | 4 | 46.1 | 36.1 | 29.7 | 25.2 | 21.8 | 20.4 | 15.2 | 11.8 |
| Conversion of $C_6$-Convertibles = 91% | | | | | | | | | |
| H2/HC | 0.5 | 29.8 | 23.8 | 19.9 | 17.1 | 15.1 | 14.2 | 11.1 | 9.0 |
| | 1 | 29.0 | 23.0 | 19.2 | 16.5 | 14.5 | 13.6 | 10.5 | 8.5 |
| | 2 | 29.5 | 23.3 | 19.4 | 16.5 | 14.4 | 13.5 | 10.3 | 8.2 |
| | 3 | 33.5 | 26.3 | 21.7 | 18.4 | 16.0 | 15.0 | 11.2 | 8.8 |
| | 4 | 44.1 | 34.5 | 28.3 | 23.9 | 20.6 | 19.2 | 14.2 | 11.0 |
| Conversion of $C_6$-Convertibles = 93% | | | | | | | | | |
| H2/HC | 0.5 | 27.5 | 21.9 | 18.3 | 15.7 | 13.8 | 13.0 | 10.1 | 8.2 |
| | 1 | 26.8 | 21.3 | 17.7 | 15.2 | 13.3 | 12.5 | 9.6 | 7.7 |
| | 2 | 27.4 | 21.6 | 17.9 | 15.2 | 13.2 | 12.4 | 9.4 | 7.4 |
| | 3 | 31.3 | 24.6 | 20.2 | 17.1 | 14.7 | 13.8 | 10.2 | 8.0 |
| | 4 | 41.8 | 32.6 | 26.6 | 22.4 | 19.2 | 17.9 | 13.0 | 9.9 |

NPPB was calculated from Equations (10) and (11) using the results from Table 2. The NPPB values as a function of conversion of $C_6$-convertibles, LHSV, and inlet H2/HC ratio are shown in Table 3. The units of NPPB shown in Table 3 are expressed in pounds of benzene produced per pound of catalyst.

TABLE 3

| | | Net Present pounds of benzene/pounds catalyst-catalytic life | | | | | | | |
|---|---|---|---|---|---|---|---|---|---|
| | | LHSV | | | | | | | |
| | | 1.2 | 1.6 | 2 | 2.4 | 2.8 | 3 | 4 | 5 |
| Conversion of $C_6$-Convertibles = 83% | | | | | | | | | |
| H2/HC | 0.5 | 10,177 | 11,076 | 12,203 | 12,602 | 13,480 | 13,110 | 14,756 | 14,947 |
| | 1 | 9,722 | 10,752 | 11,360 | 12,081 | 12,861 | 13,110 | 13,831 | 13,761 |
| | 2 | 9,722 | 10,752 | 11,360 | 12,081 | 12,236 | 12,435 | 12,899 | 13,761 |
| | 3 | 10,624 | 11,716 | 12,619 | 13,119 | 13,480 | 13,780 | 13,831 | 14,947 |
| | 4 | 12,949 | 14,166 | 15,039 | 15,637 | 16,497 | 16,399 | 17,481 | 17,289 |
| Conversion of $C_6$-Convertibles = 85% | | | | | | | | | |
| H2/HC | 0.5 | 9,956 | 11,011 | 11,634 | 12,372 | 12,531 | 12,735 | 14,164 | 14,092 |
| | 1 | 9,720 | 10,676 | 11,196 | 11,833 | 12,531 | 12,735 | 13,209 | 14,092 |
| | 2 | 9,720 | 10,676 | 11,196 | 11,833 | 11,886 | 12,037 | 13,209 | 12,867 |
| | 3 | 10,652 | 11,672 | 12,067 | 12,906 | 13,171 | 13,426 | 14,164 | 14,092 |
| | 4 | 12,845 | 14,203 | 14,998 | 15,508 | 16,287 | 16,133 | 16,980 | 16,512 |
| Conversion of $C_6$-Convertibles = 87% | | | | | | | | | |
| H2/HC | 0.5 | 9,956 | 10,582 | 11,460 | 12,111 | 12,165 | 12,320 | 13,520 | 14,424 |
| | 1 | 9,459 | 10,233 | 11,008 | 11,555 | 12,165 | 12,320 | 12,534 | 13,170 |
| | 2 | 9,459 | 10,233 | 11,008 | 11,555 | 11,499 | 11,600 | 12,534 | 13,170 |
| | 3 | 10,430 | 11,270 | 11,907 | 12,663 | 12,826 | 13,034 | 13,520 | 13,170 |
| | 4 | 12,931 | 14,223 | 14,933 | 15,349 | 16,044 | 15,829 | 16,427 | 16,900 |
| Conversion of $C_6$-Convertibles = 89% | | | | | | | | | |
| H2/HC | 0.5 | 9,422 | 10,468 | 10,795 | 11,246 | 11,763 | 11,867 | 12,822 | 13,472 |
| | 1 | 9,166 | 10,108 | 10,795 | 11,246 | 11,763 | 11,867 | 11,805 | 12,178 |
| | 2 | 9,166 | 10,108 | 10,795 | 11,246 | 11,076 | 11,867 | 11,805 | 12,178 |
| | 3 | 10,177 | 11,179 | 11,723 | 12,390 | 12,445 | 12,604 | 12,822 | 13,472 |
| | 4 | 12,782 | 13,899 | 14,846 | 15,162 | 15,766 | 15,487 | 15,822 | 16,028 |

TABLE 3-continued

Net Present pounds of benzene/pounds catalyst-catalytic life

| | | LHSV | | | | | | |
|---|---|---|---|---|---|---|---|---|
| | | 1.2 | 1.6 | 2 | 2.4 | 2.8 | 3 | 4 | 5 |

Conversion of $C_6$-Convertibles = 91%

| H2/HC | 0.5 | 9,108 | 9,964 | 10,557 | 10,907 | 11,324 | 11,373 | 12,070 | 12,451 |
|---|---|---|---|---|---|---|---|---|---|
| | 1 | 8,841 | 9,589 | 10,072 | 10,309 | 10,615 | 11,373 | 12,070 | 12,451 |
| | 2 | 9,108 | 9,589 | 10,072 | 10,907 | 10,615 | 11,373 | 11,020 | 11,116 |
| | 3 | 9,893 | 10,703 | 11,514 | 11,499 | 12,028 | 12,133 | 12,070 | 12,451 |
| | 4 | 12,604 | 13,874 | 14,287 | 14,946 | 15,453 | 15,108 | 15,164 | 15,087 |

Conversion of $C_6$-Convertibles = 93%

| H2/HC | 0.5 | 8,761 | 9,414 | 9,793 | 10,536 | 10,848 | 10,839 | 11,262 | 11,360 |
|---|---|---|---|---|---|---|---|---|---|
| | 1 | 8,484 | 9,024 | 9,793 | 9,920 | 10,117 | 10,049 | 11,262 | 11,360 |
| | 2 | 8,484 | 9,414 | 9,793 | 9,920 | 10,117 | 10,049 | 10,180 | 9,984 |
| | 3 | 9,578 | 10,562 | 10,789 | 11,147 | 11,573 | 11,623 | 11,262 | 11,360 |
| | 4 | 12,397 | 13,481 | 14,139 | 14,121 | 14,411 | 14,690 | 14,453 | 14,078 |

From Tables 2 and 3, values for LHSV and inlet H2/HC ratio which improve the process are about 4, for a desired run-length of the reforming catalyst of at least 12 months and for a conversion of $C_6$-convertibles between about 83% and 93%. It can be seen there is little advantage to using a high H2/HC ratio unless it is greater than about 2. Higher values of NPPB are obtained when the catalyst is operated at lower conversion of C6-convertibles and high LHSV. For a given conversion of $C_6$-convertibles and LHSV, higher NPPB is obtained with a H2/HC ratio greater than 2 or below 1.

Figure 6:
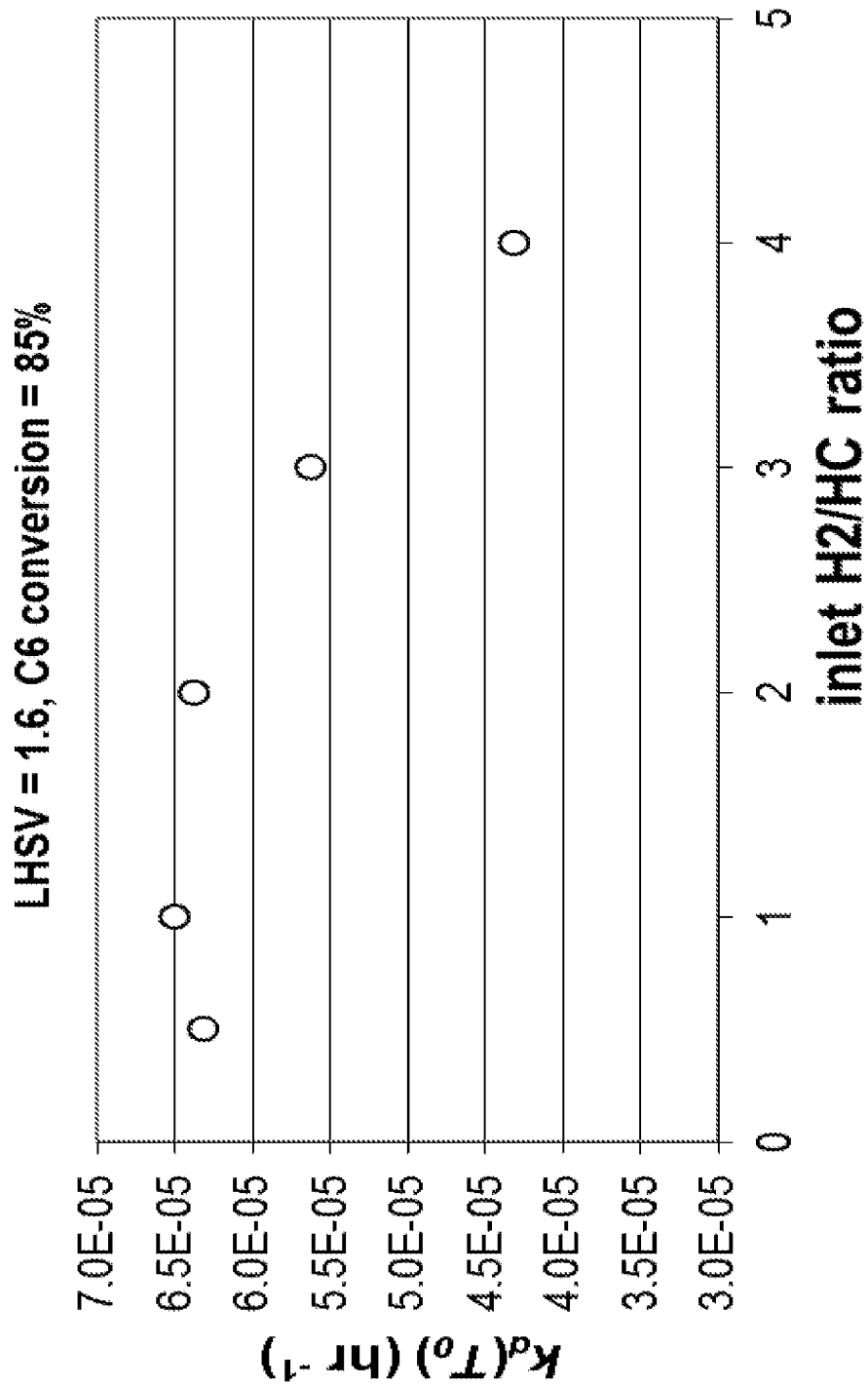
FIG. 6 is a plot showing $\hat{k}_d(T_o)$ as a function of H2/HC ratio for an isothermal reactor, as given by Equations (9) and (13) for the average over the reactor.

FIG. 6 shows an example of how $k_d(T_o)$ varies with the H2/HC ratio for isothermal reactor, as given by Equation (9). The curve in FIG. 6 is for an LHSV of 1.6 and a conversion of $C_6$-convertibles of 85%. Because the deactivation kinetic model used in this Example 1 employs a linear correlation between $A_d$ and H2/HC ratio, the NPPB in Table 3 are sensitive to the uncertainties in the correlation. A change in the correlation can affect the shape of the hump in $k_d(T_o)$ shown in FIG. 6 or the minima in the run-length in Table 2, making them more pronounced or shallower. The trends described above have been found to remain valid for different correlations.

Example 2

The above-described deactivation kinetic model was used to determine process parameters which improve a catalytic reforming process comprising a series of adiabatic reactors. The process has a six reactor configuration with catalyst volume ratios of 10:10:10:20:20:30. The relevant kinetic parameters are listed in Table 4.

TABLE 4

| | Kinetic Parameters | | | | | | Feed Properties |
|---|---|---|---|---|---|---|---|
| Reactor | #1 | #2 | #3 | #4 | #5 | #6 | Composition, wt % |
| $E_{r, C6}$ | 69.4 | 72.0 | 72.2 | 72.2 | 72.2 | 72.2 | C6 convertibles = 49.4 |
| $p_{C6}$ | $1.16 \times 10^{24}$ | $3.67 \times 10^{24}$ | $3.67 \times 10^{24}$ | $3.67 \times 10^{24}$ | $3.99 \times 10^{24}$ | $3.99 \times 10^{24}$ | C7 & C8 Convertibles = 36.1 |
| $E_{r, C7\&C8}$ | 69.4 | 71.2 | 71.2 | 71.2 | 71.2 | 71.2 | Others = 14.5 |
| $p_{C7\&C8}$ | $1.35 \times 10^{24}$ | $2.90 \times 10^{24}$ | $2.90 \times 10^{24}$ | $2.90 \times 10^{24}$ | $2.90 \times 10^{24}$ | $2.90 \times 10^{24}$ | Density $d_{if}$ = 0.675 g/cc |
| $E_r$ (average of C6, C7 & C8) = 71.5 kcal/mole | | | | | | | Average mol weight = 91.41 |
| $E_d$ = 50 kcal/mole | | | | | | | |
| $A_d$ according to equation (16) or (23) | | | | | | | |
| $1^{st}$ Reactor Inlet Pressure = 107.6 psia | | | | | | | Catalyst density $d_c$ = 0.70 g/cc |
| End-of-run T = 540° C. | | | | | | | Yearly discount rate for benzene = 10% |

Figure 7:
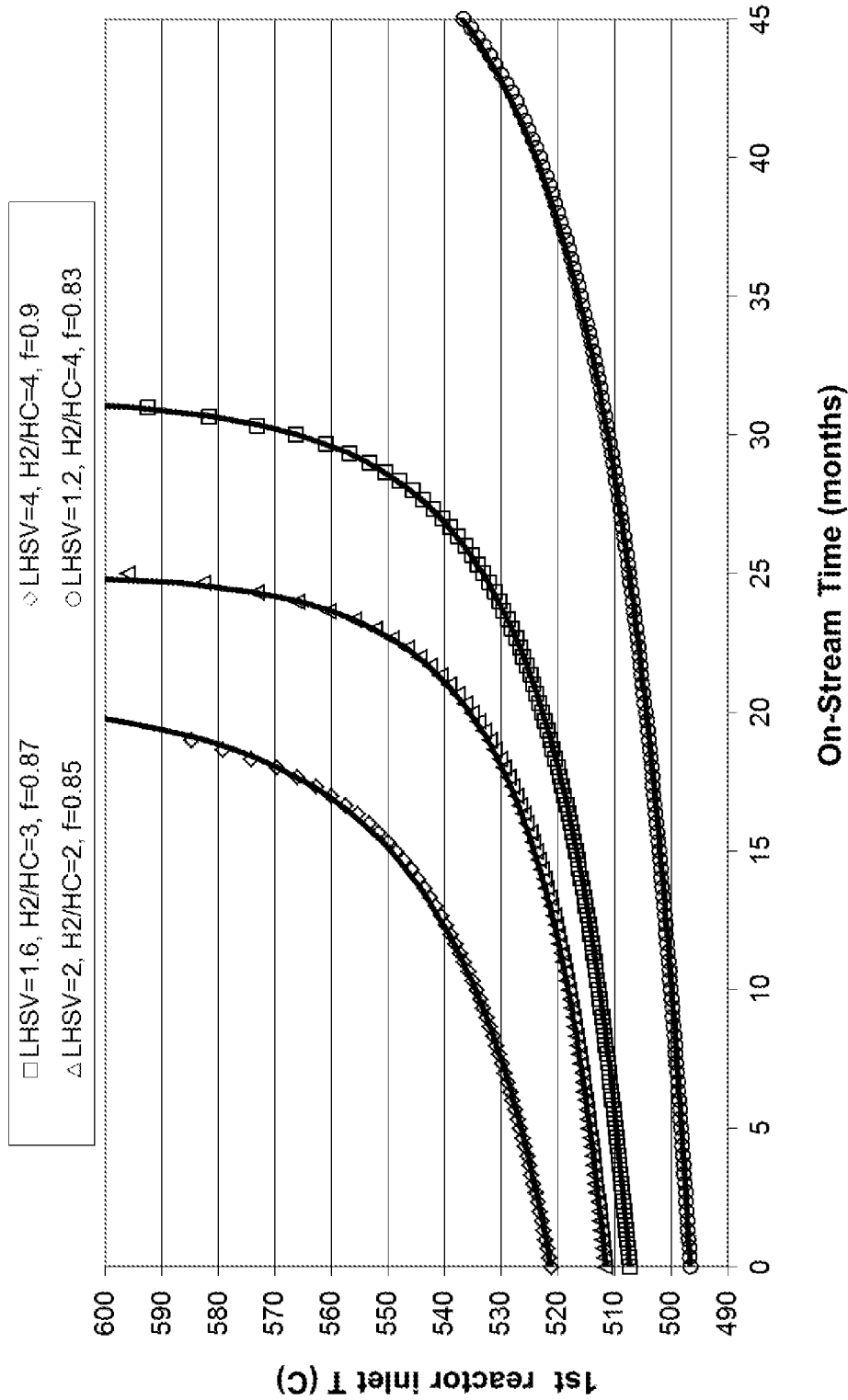
FIG. 7 is a plot of fouling curves predicted by a deactivation kinetic model and analytical solutions fit to the fouling curves under various process conditions for a series of adiabatic reactors.

FIG. 7 is a plot of fouling curves (i.e., the shaped data points), predicted by the deactivation kinetic model and fits of Equation (17) to the model (i.e., the solid lines). The four curves in FIG. 7 are based on model calculations with four different combinations of values for conversion of $C_6$-convertibles, LHSV, and H2/HC ratio. Particularly, one of the curves represents a LHSV of 1.6, an H2/HC ratio of 3, and a conversion of $C_6$-convertibles of 0.87. Another of the curves represents a LHSV of 2, an H2/HC ratio of 2, and a conversion of $C_6$-convertibles of 0.85. Another of the fouling curves represents a LHSV of 1.2, an H2/HC ratio of 4, and a conversion of $C_6$-convertibles of 0.83. Another of the curves represents a LHSV of 4, an H2/HC ratio of 4, and a conversion of $C_6$-convertibles of 0.9. The fits of the data generated by the deactivation kinetic model fit the data quite well, even for series of adiabatic reactors]

In FIG. 7, with an EOR temperature of 540° C., it can be seen that when the LHSV of 1.6, an H2/HC ratio of 3, and a conversion of $C_6$-convertibles of 0.87 is used, the run-length is about 26.6 months. When a LHSV of 2, an H2/HC ratio of 2, and a conversion of $C_6$-convertibles of 0.85 is used, the run-length is about 20.6 months. When a LHSV of 1.2, an H2/HC ratio of 4, and a conversion of $C_6$-convertibles of 0.83 is used, the run-length is about 46.5 months.

When a LHSV of 4, an H2/HC ratio of 4, and a conversion of $C_6$-convertibles of 0.91 is used, the run-length is about 12.3 months.

Plots like FIG. 7 may be made for different combinations of conversion of $C_6$-convertibles, LHSV, and H2/HC ratio values. However, instead of reading run-length off numerous plots of Equation (17) (e.g., FIG. 7) for numerous combinations of conversion of $C_6$-convertibles, LHSV, and H2/HC ratio values, the run-length of the reforming catalyst was calculated as a function of conversion of $C_6$-convertibles, LHSV, and H2/HC ratio as described above using Equations (16) to (19), (21) and (22). Catalyst fouling is accounted for by Equation (16). The results are shown in Table 5, with run-length in units of months rounded to the nearest tenth.

TABLE 5

Catalyst Run-length, Months
$A_d = 1.231 \times 10^{11} - 1.507 \times 10^{10} (H2/HC)_{inlet}$

| | | LHSV | | | | | | | |
|---|---|---|---|---|---|---|---|---|---|
| | | 1.2 | 1.6 | 2 | 2.4 | 2.8 | 3 | 4 | 5 |
| Conversion of $C_6$-Convertibles = 83% | | | | | | | | | |
| 1st reactor inlet H2/HC | 0.5 | 32.2 | 25.4 | 21.1 | 18.0 | 15.7 | 14.7 | 11.1 | 8.7 |
| | 1 | 31.7 | 25.1 | 20.9 | 17.9 | 15.6 | 14.6 | 11.1 | 8.8 |
| | 2 | 32.9 | 26.1 | 21.8 | 18.7 | 16.4 | 15.4 | 11.8 | 9.5 |
| | 3 | 37.0 | 29.4 | 24.5 | 21.0 | 18.4 | 17.3 | 13.3 | 10.7 |
| | 4 | 46.5 | 36.6 | 30.3 | 25.9 | 22.6 | 21.2 | 16.3 | 13.0 |
| Conversion of $C_6$-Convertibles = 85% | | | | | | | | | |
| 1st reactor inlet H2/HC | 0.5 | 30.2 | 23.8 | 19.7 | 16.7 | 14.5 | 13.6 | 10.0 | 7.6 |
| | 1 | 29.9 | 23.6 | 19.5 | 16.7 | 14.5 | 13.6 | 10.1 | 7.8 |
| | 2 | 31.2 | 24.8 | 20.6 | 17.6 | 15.4 | 14.4 | 11.0 | 8.6 |
| | 3 | 35.4 | 28.0 | 23.3 | 19.9 | 17.4 | 16.4 | 12.5 | 9.9 |
| | 4 | 44.8 | 35.2 | 29.0 | 24.7 | 21.5 | 20.2 | 15.4 | 12.2 |
| Conversion of $C_6$-Convertibles = 87% | | | | | | | | | |
| 1st reactor inlet H2/HC | 0.5 | 30.2 | 22.2 | 18.2 | 15.4 | 13.2 | 12.3 | 8.9 | 6.5 |
| | 1 | 28.0 | 22.1 | 18.2 | 15.4 | 13.3 | 12.5 | 9.1 | 6.8 |
| | 2 | 29.6 | 23.4 | 19.4 | 16.5 | 14.3 | 13.4 | 10.1 | 7.8 |
| | 3 | 33.7 | 26.6 | 22.1 | 18.8 | 16.4 | 15.4 | 11.6 | 8.1 |
| | 4 | 43.0 | 33.7 | 27.7 | 23.5 | 20.4 | 19.1 | 14.4 | 11.3 |
| Conversion of $C_6$-Convertibles = 89% | | | | | | | | | |
| 1st reactor inlet H2/HC | 0.5 | 26.2 | 20.5 | 16.7 | 14.0 | 12.0 | 11.1 | 7.7 | 5.2 |
| | 1 | 26.2 | 20.5 | 16.8 | 14.2 | 12.2 | 11.3 | 8.0 | 5.7 |
| | 2 | 27.8 | 21.9 | 18.1 | 15.4 | 13.3 | 12.4 | 9.1 | 6.8 |
| | 3 | 32.0 | 25.2 | 20.8 | 17.7 | 15.3 | 14.4 | 10.7 | 8.2 |
| | 4 | 41.1 | 32.1 | 26.3 | 22.3 | 19.3 | 18.0 | 13.4 | 10.4 |
| Conversion of $C_6$-Convertibles = 91% | | | | | | | | | |
| 1st reactor inlet H2/HC | 0.5 | 24.2 | 18.8 | 15.2 | 12.6 | 10.6 | 9.8 | 6.3 | 3.6 |
| | 1 | 24.3 | 19.0 | 15.4 | 12.9 | 10.9 | 10.1 | 6.8 | 4.3 |
| | 2 | 26.1 | 20.4 | 16.8 | 14.2 | 12.2 | 11.3 | 8.1 | 5.8 |
| | 3 | 30.1 | 23.6 | 19.4 | 16.5 | 14.2 | 13.3 | 9.7 | 7.3 |
| | 4 | 39.0 | 30.3 | 24.8 | 20.9 | 18.0 | 16.8 | 12.3 | 9.4 |
| Conversion of $C_6$-Convertibles = 93% | | | | | | | | | |
| 1st reactor inlet H2/HC | 0.5 | 22.1 | 17.0 | 13.6 | 11.1 | 9.2 | 8.3 | 4.7 | 1.6 |
| | 1 | 22.3 | 17.3 | 14.0 | 11.5 | 9.6 | 8.8 | 5.4 | 2.7 |
| | 2 | 24.2 | 18.9 | 15.4 | 12.9 | 11.0 | 10.1 | 6.9 | 4.5 |
| | 3 | 28.1 | 22.0 | 18.0 | 15.2 | 13.0 | 12.1 | 8.6 | 6.2 |
| | 4 | 36.7 | 28.4 | 23.2 | 19.4 | 16.6 | 15.5 | 11.1 | 8.2 |

NPPB was calculated from Equations (10) and (11) using the results from Table 5. The NPPB values as a function of conversion of $C_6$-convertibles, LHSV, and H2/HC ratio are shown in Table 6. The units of NPPB shown in Table 6 are expressed in pounds of benzene produced per pound of catalyst.

TABLE 6

Net present pounds of benzene/pound catalyst-catalytic life
$A_d = 1.231 \times 10^{11} - 1.507 \times 10^{10} (H2/HC)_{inlet}$

| | | \multicolumn{8}{c}{LHSV} | | | | | | | |
|---|---|---|---|---|---|---|---|---|---|
| | | 1.2 | 1.6 | 2 | 2.4 | 2.8 | 3 | 4 | 5 |

Conversion of $C_6$-Convertibles = 83%

| 1st reactor inlet H2/HC | 0.5 | 8,687 | 9,319 | 9,953 | 10,369 | 10,845 | 10,940 | 10,883 | 11,227 |
|---|---|---|---|---|---|---|---|---|---|
| | 1 | 8,687 | 9,319 | 9,953 | 10,369 | 10,845 | 10,940 | 10,883 | 11,227 |
| | 2 | 8,921 | 9,651 | 10,382 | 10,898 | 10,845 | 10,940 | 11,821 | 11,227 |
| | 3 | 9,837 | 10,629 | 11,230 | 11,943 | 12,097 | 12,293 | 12,752 | 13,604 |
| | 4 | 11,784 | 13,116 | 13,687 | 14,477 | 15,131 | 14,929 | 15,493 | 15,939 |

Conversion of $C_6$-Convertibles = 85%

| 1st reactor inlet H2/HC | 0.5 | 8,410 | 9,201 | 9,748 | 10,072 | 9,802 | 10,502 | 10,176 | 10,265 |
|---|---|---|---|---|---|---|---|---|---|
| | 1 | 8,410 | 9,201 | 9,748 | 10,072 | 9,802 | 10,502 | 10,176 | 10,265 |
| | 2 | 8,654 | 9,544 | 10,192 | 10,619 | 10,457 | 10,502 | 11,145 | 11,498 |
| | 3 | 9,609 | 10,554 | 11,069 | 11,698 | 11,750 | 11,900 | 12,106 | 12,720 |
| | 4 | 11,854 | 12,812 | 13,607 | 14,316 | 14,885 | 14,623 | 14,939 | 15,133 |

Conversion of $C_6$-Convertibles = 87%

| 1st reactor inlet H2/HC | 0.5 | 8,410 | 8,706 | 9,057 | 9,174 | 9,356 | 9,293 | 9,415 | 7,948 |
|---|---|---|---|---|---|---|---|---|---|
| | 1 | 8,102 | 8,706 | 9,057 | 9,174 | 9,356 | 9,293 | 9,415 | 9,233 |
| | 2 | 8,608 | 9,063 | 9,519 | 10,309 | 10,033 | 10,025 | 10,416 | 10,506 |
| | 3 | 9,594 | 10,461 | 10,883 | 11,423 | 11,368 | 11,468 | 12,381 | 11,768 |
| | 4 | 11,689 | 12,792 | 13,504 | 14,126 | 13,969 | 14,279 | 14,332 | 14,260 |

Conversion of $C_6$-Convertibles = 89%

| 1st reactor inlet H2/HC | 0.5 | 7,762 | 8,166 | 8,788 | 8,797 | 8,873 | 8,752 | 8,598 | 6,806 |
|---|---|---|---|---|---|---|---|---|---|
| | 1 | 7,762 | 8,538 | 8,788 | 8,797 | 8,873 | 8,752 | 8,598 | 8,131 |
| | 2 | 8,288 | 8,906 | 9,265 | 9,385 | 9,571 | 9,507 | 9,631 | 9,445 |
| | 3 | 9,315 | 9,993 | 10,672 | 11,118 | 10,949 | 10,996 | 11,670 | 10,748 |
| | 4 | 11,496 | 12,420 | 12,936 | 13,359 | 13,634 | 13,898 | 13,673 | 13,319 |

Conversion of $C_6$-Convertibles = 91%

| 1st reactor inlet H2/HC | 0.5 | 7,388 | 7,966 | 7,997 | 8,388 | 8,353 | 8,171 | 6,651 | 5,591 |
|---|---|---|---|---|---|---|---|---|---|
| | 1 | 7,388 | 7,966 | 7,997 | 8,388 | 8,353 | 8,171 | 7,726 | 5,591 |
| | 2 | 7,936 | 8,349 | 8,985 | 8,995 | 9,073 | 8,949 | 8,791 | 8,314 |
| | 3 | 9,004 | 9,850 | 9,957 | 10,192 | 10,494 | 10,485 | 10,894 | 9,657 |
| | 4 | 11,274 | 12,005 | 12,772 | 13,094 | 13,263 | 13,478 | 12,961 | 12,309 |

Conversion of $C_6$-Convertibles = 93%

| 1st reactor inlet H2/HC | 0.5 | 6,980 | 7,346 | 7,660 | 7,317 | 7,045 | 6,738 | 5,689 | 2,882 |
|---|---|---|---|---|---|---|---|---|---|
| | 1 | 6,980 | 7,346 | 7,660 | 7,947 | 7,794 | 7,548 | 5,689 | 4,304 |
| | 2 | 7,550 | 8,141 | 8,172 | 8,573 | 8,536 | 8,350 | 7,896 | 7,111 |
| | 3 | 8,661 | 9,306 | 9,682 | 9,807 | 10,001 | 9,934 | 10,064 | 8,497 |
| | 4 | 11,022 | 11,548 | 12,110 | 12,211 | 12,856 | 12,259 | 12,194 | 11,231 |

Example 3

The sensitivity of the results to the $A_d$ vs. H2/HC ratio correlation was estimated by using another analytical solution for $A_d$, Equation (23). Run-lengths and NPPB were again calculated for the same values of conversion of $C_6$-convertibles, LHSV, and H2/HC ratio, except that Equation (23) was used for $A_d$ instead of Equation (16). Tables 7 and 8 display the results.

TABLE 7

Catalyst Life, months
$A_d = 1.505 \times 10^{11} - 2.010 \times 10^{10} (H2/HC)_{average}$

| | | LHSV | | | | | | | |
|---|---|---|---|---|---|---|---|---|---|
| | | 1.2 | 1.6 | 2 | 2.4 | 2.8 | 3 | 4 | 5 |

Conversion of $C_6$-Convertibles = 83%

| 1st reactor inlet H2/HC | 0.5 | 27.9 | 22.2 | 18.6 | 15.9 | 13.9 | 13.1 | 10.0 | 7.9 |
|---|---|---|---|---|---|---|---|---|---|
| | 1 | 27.6 | 22.0 | 18.4 | 15.8 | 13.9 | 13.1 | 10.0 | 8.0 |
| | 2 | 29.2 | 23.3 | 19.5 | 16.8 | 14.8 | 13.9 | 10.8 | 8.7 |

TABLE 7-continued

Catalyst Life, months
$A_d = 1.505 \times 10^{11} \cdot 2.010 \times 10^{10} (H2/HC) \text{average}$

| | | LHSV | | | | | | | |
|---|---|---|---|---|---|---|---|---|---|
| | | 1.2 | 1.6 | 2 | 2.4 | 2.8 | 3 | 4 | 5 |
| | 3 | 34.2 | 27.3 | 22.8 | 19.6 | 17.2 | 16.2 | 12.5 | 10.1 |
| | 4 | 46.9 | 36.9 | 30.5 | 26.1 | 22.7 | 21.4 | 16.3 | 13.1 |
| Conversion of $C_6$-Convertibles = 85% | | | | | | | | | |
| 1st reactor inlet H2/HC | 0.5 | 26.3 | 20.9 | 17.3 | 14.8 | 12.9 | 12.1 | 9.1 | 7.0 |
| | 1 | 26.1 | 20.8 | 17.3 | 14.8 | 12.9 | 12.2 | 9.2 | 7.2 |
| | 2 | 27.8 | 22.2 | 18.5 | 15.9 | 13.9 | 13.1 | 10.0 | 8.0 |
| | 3 | 32.8 | 26.1 | 21.7 | 18.6 | 16.3 | 15.3 | 11.8 | 9.4 |
| | 4 | 45.4 | 35.6 | 29.4 | 25.0 | 21.8 | 20.4 | 15.5 | 12.3 |
| Conversion of $C_6$-Convertibles = 87% | | | | | | | | | |
| 1st reactor inlet H2/HC | 0.5 | 26.3 | 19.5 | 16.1 | 13.7 | 11.9 | 11.1 | 8.1 | 6.0 |
| | 1 | 24.6 | 19.5 | 16.2 | 13.8 | 12.0 | 11.2 | 8.3 | 6.3 |
| | 2 | 26.4 | 21.0 | 17.5 | 14.9 | 13.0 | 12.2 | 9.3 | 7.2 |
| | 3 | 31.3 | 24.8 | 20.6 | 17.6 | 15.4 | 14.5 | 11.0 | 8.7 |
| | 4 | 43.8 | 34.2 | 28.1 | 23.9 | 20.7 | 19.4 | 14.6 | 11.4 |
| Conversion of $C_6$-Convertibles = 89% | | | | | | | | | |
| 1st reactor inlet H2/HC | 0.5 | 23.0 | 18.1 | 14.9 | 12.6 | 10.8 | 10.0 | 7.1 | 4.9 |
| | 1 | 23.0 | 18.2 | 15.0 | 12.7 | 11.0 | 10.2 | 7.4 | 5.3 |
| | 2 | 24.9 | 19.7 | 16.4 | 14.0 | 12.1 | 11.4 | 8.4 | 6.4 |
| | 3 | 29.8 | 23.5 | 19.5 | 16.6 | 14.4 | 13.5 | 10.1 | 7.8 |
| | 4 | 42.0 | 32.7 | 26.8 | 22.7 | 19.6 | 18.3 | 13.6 | 10.5 |
| Conversion of $C_6$-Convertibles = 91% | | | | | | | | | |
| 1st reactor inlet H2/HC | 0.5 | 21.3 | 16.6 | 13.6 | 11.4 | 9.6 | 8.9 | 5.9 | 3.5 |
| | 1 | 21.4 | 16.8 | 13.8 | 11.6 | 9.9 | 9.2 | 6.3 | 4.1 |
| | 2 | 23.4 | 18.4 | 15.2 | 12.9 | 11.1 | 10.4 | 7.5 | 5.4 |
| | 3 | 28.1 | 22.1 | 18.3 | 15.5 | 13.4 | 12.5 | 9.2 | 6.9 |
| | 4 | 40.1 | 31.1 | 25.4 | 21.4 | 18.4 | 17.1 | 12.5 | 9.5 |
| Conversion of $C_6$-Convertibles = 93% | | | | | | | | | |
| 1st reactor inlet H2/HC | 0.5 | 19.5 | 15.1 | 12.2 | 10.1 | 8.4 | 7.6 | 4.5 | 1.6 |
| | 1 | 19.8 | 15.4 | 12.5 | 10.4 | 8.8 | 8.1 | 5.1 | 2.6 |
| | 2 | 21.7 | 17.1 | 14.0 | 11.8 | 10.1 | 9.4 | 6.5 | 4.3 |
| | 3 | 26.3 | 20.7 | 17.0 | 14.3 | 12.3 | 11.4 | 8.2 | 5.9 |
| | 4 | 37.9 | 29.3 | 23.8 | 19.9 | 17.0 | 15.8 | 11.3 | 8.3 |

TABLE 8

Net Present pounds of benzene/pounds catalyst-catalytic life
$A_d = 1.505 \times 10^{11} \cdot 2.010 \times 10^{10} (H2/HC) \text{average}$

| | | LHSV | | | | | | | |
|---|---|---|---|---|---|---|---|---|---|
| | | 1.2 | 1.6 | 2 | 2.4 | 2.8 | 3 | 4 | 5 |
| Conversion of $C_6$-Convertibles = 83% | | | | | | | | | |
| 1st reactor inlet H2/HC | 0.5 | 7,730 | 8,306 | 9,082 | 9,296 | 9,571 | 9,564 | 9,937 | 10,023 |
| | 1 | 7,730 | 8,306 | 8,641 | 9,296 | 9,571 | 9,564 | 9,937 | 10,023 |
| | 2 | 7,972 | 8,647 | 9,519 | 9,835 | 10,211 | 10,255 | 10,883 | 11,227 |
| | 3 | 9,153 | 9,980 | 10,808 | 11,423 | 11,474 | 11,620 | 12,752 | 12,421 |
| | 4 | 11,991 | 13,116 | 14,084 | 14,477 | 15,131 | 14,929 | 15,493 | 15,939 |
| Conversion of $C_6$-Convertibles = 85% | | | | | | | | | |
| 1st reactor inlet H2/HC | 0.5 | 7,413 | 8,154 | 8,393 | 8,963 | 9,141 | 9,080 | 9,198 | 9,021 |
| | 1 | 7,413 | 8,154 | 8,393 | 8,963 | 9,141 | 9,080 | 9,198 | 9,021 |
| | 2 | 7,916 | 8,506 | 9,301 | 9,520 | 9,802 | 9,794 | 10,176 | 10,265 |
| | 3 | 9,136 | 9,884 | 10,632 | 11,161 | 11,107 | 11,204 | 12,106 | 11,498 |
| | 4 | 11,854 | 13,123 | 13,607 | 14,316 | 14,885 | 14,623 | 14,939 | 15,133 |

TABLE 8-continued

Net Present pounds of benzene/pounds catalyst-catalytic life
$A_d = 1.505 \times 10^{11} - 2.010 \times 10^{10}(H2/HC)average$

| | | | | | LHSV | | | | |
|---|---|---|---|---|---|---|---|---|---|
| | | 1.2 | 1.6 | 2 | 2.4 | 2.8 | 3 | 4 | 5 |
| Conversion of $C_6$-Convertibles = 87% | | | | | | | | | |
| 1st reactor inlet H2/HC | 0.5 | 7,413 | 7,616 | 8,120 | 8,599 | 8,674 | 8,556 | 8,405 | 7,948 |
| | 1 | 7,326 | 7,616 | 8,120 | 8,599 | 8,674 | 8,556 | 8,405 | 7,948 |
| | 2 | 7,587 | 8,346 | 8,591 | 9,174 | 9,356 | 9,293 | 9,415 | 9,233 |
| | 3 | 8,858 | 9,768 | 10,432 | 10,868 | 10,703 | 10,749 | 11,408 | 11,768 |
| | 4 | 11,912 | 12,792 | 13,504 | 14,126 | 14,605 | 14,279 | 15,290 | 14,260 |
| Conversion of $C_6$-Convertibles = 89% | | | | | | | | | |
| 1st reactor inlet H2/HC | 0.5 | 6,954 | 7,412 | 7,821 | 8,204 | 8,169 | 7,991 | 7,556 | 6,306 |
| | 1 | 6,954 | 7,412 | 7,821 | 8,204 | 8,169 | 7,991 | 7,556 | 6,806 |
| | 2 | 7,495 | 8,166 | 8,307 | 8,797 | 8,873 | 8,752 | 8,598 | 8,131 |
| | 3 | 8,806 | 9,634 | 9,738 | 10,546 | 10,263 | 10,996 | 10,655 | 10,748 |
| | 4 | 11,728 | 12,754 | 13,377 | 13,907 | 14,290 | 13,898 | 14,662 | 14,587 |
| Conversion of $C_6$-Convertibles = 91% | | | | | | | | | |
| 1st reactor inlet H2/HC | 0.5 | 6,547 | 7,188 | 7,496 | 7,159 | 7,626 | 7,386 | 6,651 | 4,212 |
| | 1 | 6,547 | 7,188 | 7,496 | 7,777 | 7,626 | 7,386 | 6,651 | 5,591 |
| | 2 | 7,110 | 7,579 | 7,997 | 8,388 | 8,358 | 8,171 | 8,791 | 6,958 |
| | 3 | 8,475 | 9,106 | 9,473 | 10,192 | 9,786 | 10,485 | 9,848 | 9,657 |
| | 4 | 11,515 | 12,353 | 12,772 | 13,094 | 13,263 | 13,478 | 13,981 | 12,309 |
| Conversion of $C_6$-Convertibles = 93% | | | | | | | | | |
| 1st reactor inlet H2/HC | 0.5 | 6,106 | 6,538 | 6,623 | 6,680 | 6,289 | 6,738 | 4,571 | 2,882 |
| | 1 | 6,400 | 6,538 | 7,144 | 6,680 | 7,045 | 6,738 | 5,689 | 4,304 |
| | 2 | 6,980 | 7,346 | 7,660 | 7,947 | 7,794 | 7,548 | 6,797 | 5,714 |
| | 3 | 8,110 | 8,921 | 9,183 | 9,193 | 9,272 | 9,146 | 8,985 | 8,497 |
| | 4 | 11,273 | 11,910 | 12,583 | 12,799 | 12,856 | 13,020 | 12,194 | 11,231 |

Figure 8:
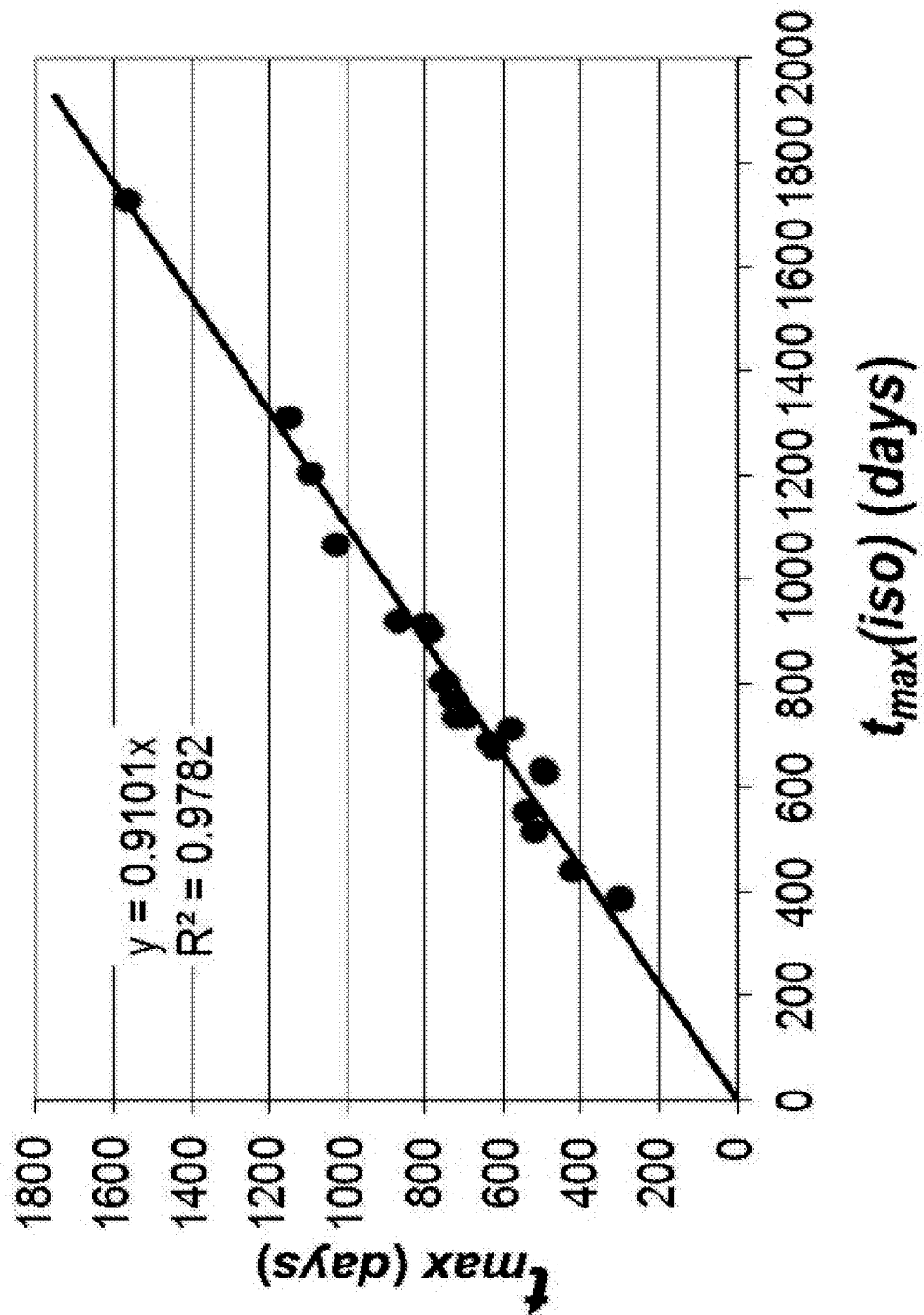
FIG. 8 is a plot of the linear correlation of $t_{max}$ with $t_{max}(iso)$ when the latter is obtained from Equation (18) under the same process conditions and when $t_{max}$ is determined by fitting Equation (17) to fouling curves predicted from a deactivation kinetic model for a series of adiabatic reactors.

FIG. 8 shows the linear correlation of $t_{max}$ with $t_{max}$(iso) when the latter is obtained from Equation (18) under the same process conditions and when $t_{max}$ is determined by fitting Equation (17) to fouling curves from the full calculations with the deactivation kinetic model for a series of adiabatic reactors.

Figure 9:
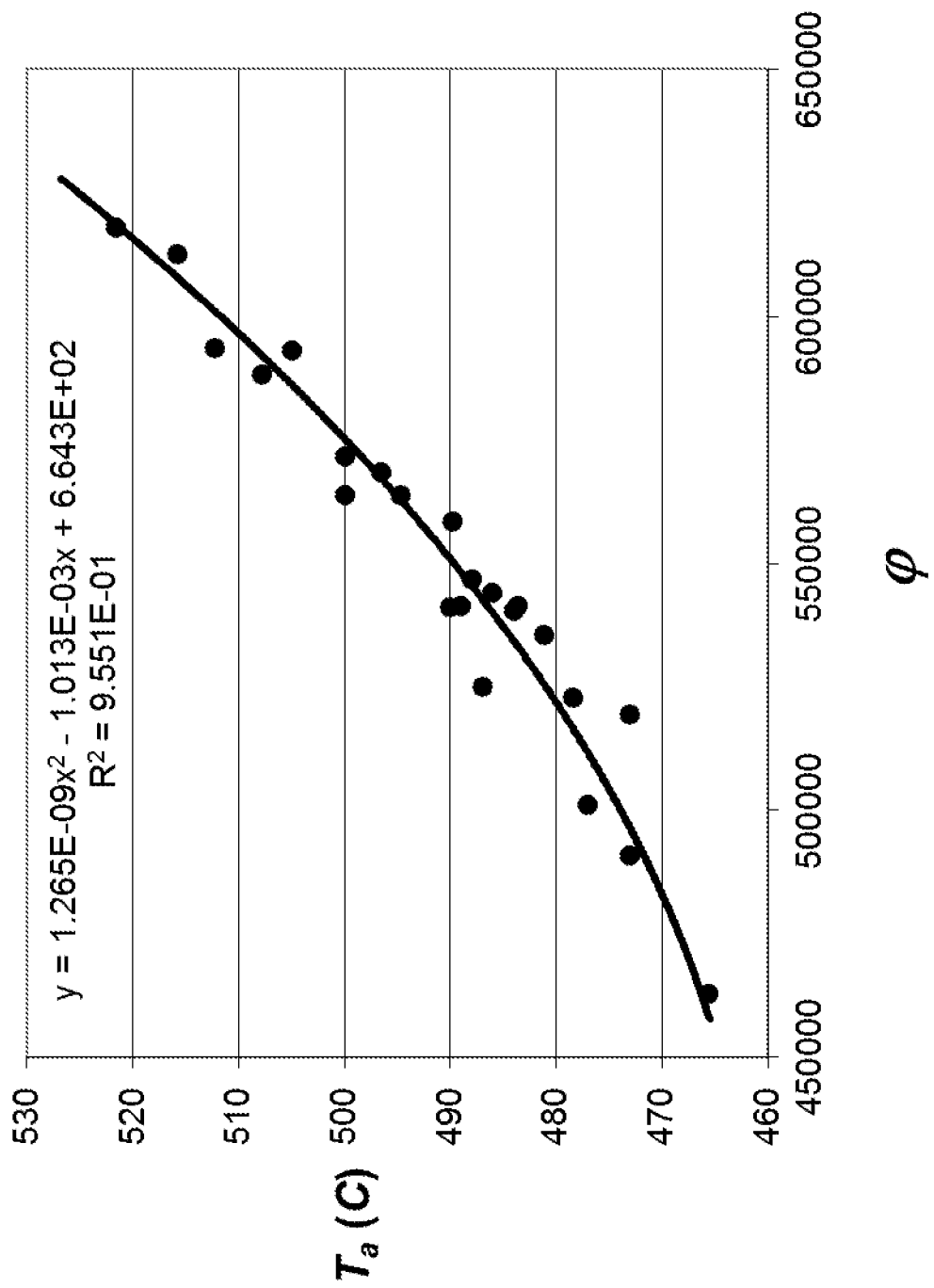
FIG. 9 is a plot of $T_a$ as a function of φ obtained when a second order polynomial represented by Equation (22), i.e., second order with respect to φ, is fitted to values of $T_a$ determined by fitting Equation (17) to the fouling curves predicted by a deactivation kinetic model.

Equation (22) was plotted for the data in Example 2, and the results are shown in FIG. 9 with an $R^2$ value of 0.9551. φ was given by Equation (21). FIG. 9 shows $T_a$ as a function of φ obtained when a second order polynomial represented by Equation (22), i.e., second order with respect to φ, is fitted to values of $T_a$ determined by fitting Equation (17) to the full calculations with the deactivation kinetic model.

Figure 10:
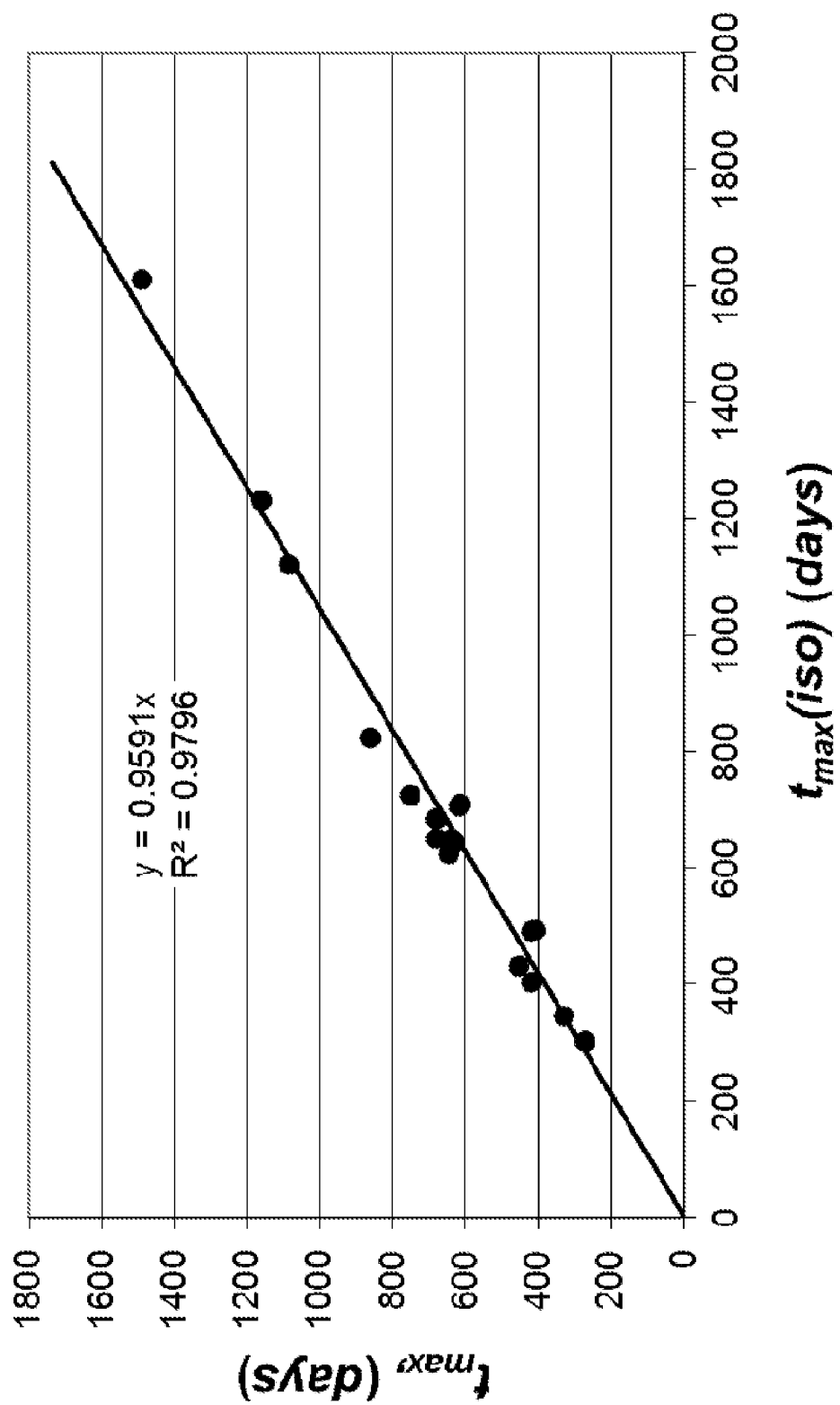
FIG. 10 is a plot of $t_{max}$ as a function of $t_{max}(iso)$ found by repeating full calculations with a deactivation kinetic model using the correlation in Equation (23) and fitting Equation (17) to the results.
Figure 11:
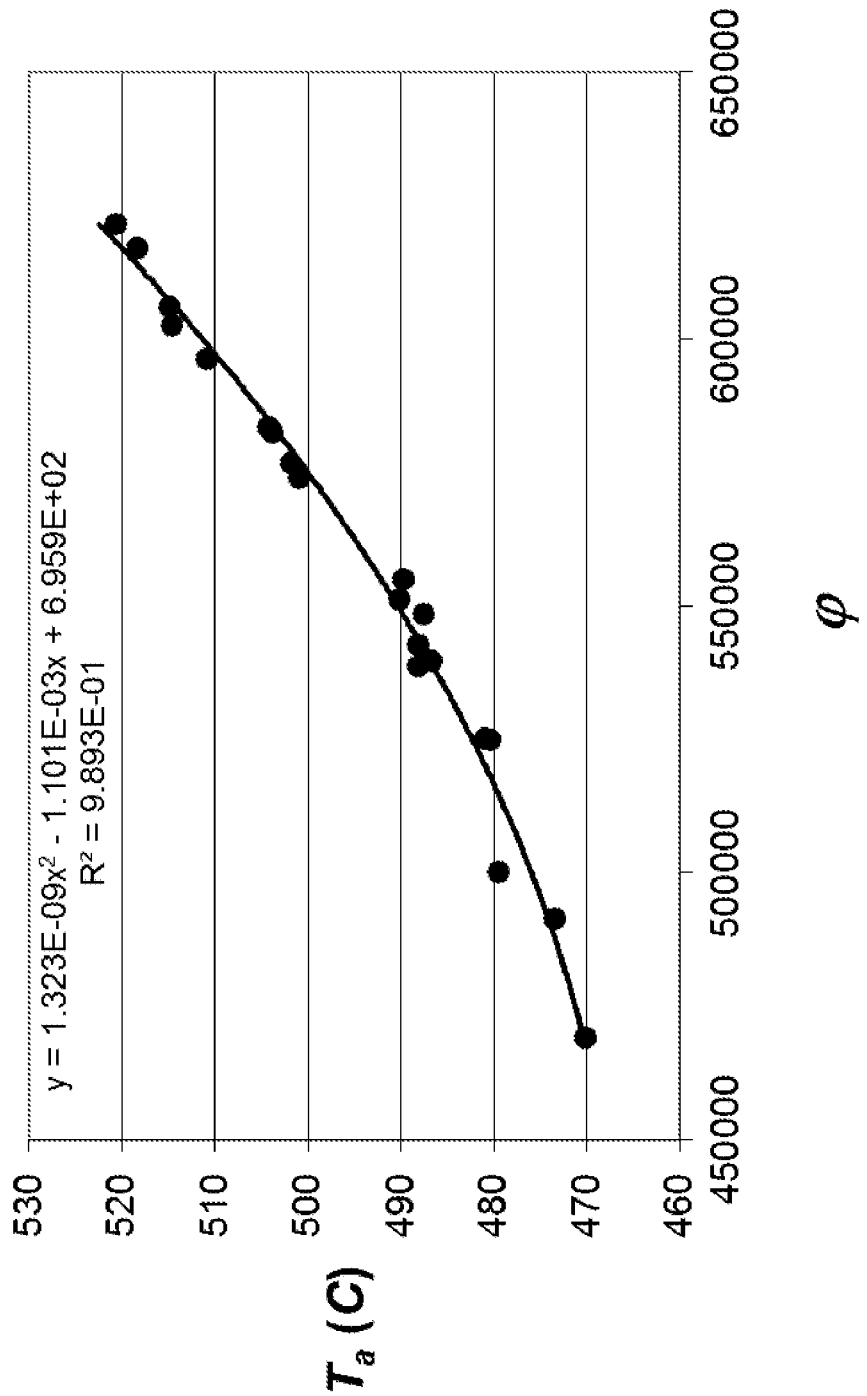
FIG. 11 is a plot of $T_a$ as a function of φ determined by repeating full calculations with a deactivation kinetic model using the correlation in Equation (23) and fitting Equation (17) to the results.

To compare the results of Example 2 in FIGS. 8 and 9 so as to determine sensitivity, full calculations with the deactivation kinetic model using the correlation in Equation (23) instead of Equation (16) were performed. Fitting Equation (17) to the results provides the following equation:

$$t_{max} = 0.9591 t_{max}(iso) \quad (24)$$

a plot of which is shown in FIG. 10 ($R^2$ value is 0.9796), and the equation:

$$T_a = 6.959 \times 10^2 - 1.101 \times 10^{-3} \varphi + 1.323 \times 10^{-9} \varphi^2 \quad (25)$$

a plot of which is shown in FIG. 11 ($R^2$ value is 0.9893). φ was again given by Equation (21). FIG. 10 shows $t_{max}$ as a function of $t_{max}$(iso) found by repeating full calculations with the deactivation kinetic model using the correlation in Equation (23) and fitting Equation (17) to the results. FIG. 11 shows $T_a$ as a function of φ determined by repeating full calculations with the deactivation kinetic model using the correlation in Equation (23) and fitting Equation (17) to the results. The higher $R^2$ values for FIGS. 10 and 11 indicate a better fit for the curves in FIGS. 10 and 11 than the curves in FIGS. 8 and 9.

As can be seen, Table 5 and Table 7 have different values as do Table 6 and Table 8. The different values between Tables 5 and 7 and between Tables 6 and 8 may serve as indicators of the magnitude of the uncertainty in the values given in the tables. The average difference in the benzene yields between Table 6 and 8 is about 7%, with a standard deviation of about 5%. This provides an estimate of the uncertainty and sensitivity in the numbers in these tables.

The results in Tables 5-8 indicate more benzene may be produced per catalyst life cycle (e.g., run-length) when the catalyst is operated at lower conversion of $C_6$-convertibles. There is no significant advantage to using a high H2/HC ratio unless it is greater than about 2. At low to moderate conversions of $C_6$-convertibles, there are maxima in benzene yield as a function of LHSV. For a run-length greater than 12 months, LHSV values are from about 3 to about 4. For a given conversion of $C_6$-convertibles and LHSV, improved NPPB may be attained with H2/HC ratio of less than 1 or greater than 2.

Several trends and correlations have been observed. Specifically, more benzene can be produced in a catalyst life cycle (e.g., run-length) when the catalyst is operated under conditions of low conversion of $C_6$-convertibles and high LHSV. Furthermore, more benzene can be produced in a catalyst life cycle when the catalyst is operated at a H2/HC ratio larger than about 3. Some of the trends that were observed in the results of the isothermal reactor embodiment of Example 1 can also be found for the adiabatic reactors embodiment, as shown in Example 2. First, for a given LHSV and H2/HC ratio to the 1$^{st}$ reactor, a lower conversion of C$_6$-convertibles gives a larger NPPB. Second, a higher H2/HC ratio does not necessary lead to a longer run-length unless the ratio is 3 or larger. There are little differences in the run-lengths and the benzene yields in terms of NPPB when the H2/HC ratio is between 0.5 and 2. An increase in the H2/HC ratio to the 1$^{st}$ reactor increases the heat capacity of the gas in all the reactors. For a given conversion of the feedstream, a higher H2/HC ratio will result in smaller endotherms in the reactors, which translates to higher average catalyst bed temperatures. The higher average bed temperature means a larger Arrhenius term in the deactivation rate constant. Because the deactivation rate constant is a product of A$_d$ and the Arrhenius term, the higher H2/HC ratio has opposite effects on the deactivation rate, namely reducing the deactivation amplitude but increasing the Arrhenius factor. These opposing effects result in small changes in the overall deactivation rate of the catalyst when the H2/HC ratio to the 1$^{st}$ reactor is between 0.5 and 2. At a H2/HC ratio of 3, the reduction in A$_d$ is significantly large that it outweighs the increase in the Arrhenius factor. It is interesting to note that although an increase in the H2/HC ratio increases the average bed temperature, it actually lowers the reactor temperature. Thus, embodiments of the inventive subject matter may comprise selecting an LHSV greater than 3; alternatively, selecting an LHSV of about 4.

At low to moderate conversions of C$_6$-convertibles, there are maxima in the benzene yield as a function of the LHSV. In embodiments, there are maxima in the NPPB at a LHSV of around 3. This may be particularly true when conversion is high. When designing a plant, it is important to match the LHSV with the H2/HC ratio and the required conversion of C$_6$-convertibles in order to achieve the maximum benzene yield from the catalyst. Because it is difficult to have a catalyst replacement every year logistically and economically, run-lengths of less than one year are undesirable. In embodiments, for low to moderate conversions (83% to 89%), the LHSV may be between 2.8 and 3.

It should be noted that the occurrences of maxima are expected and are sensitive to the definition of the EOR inlet temperature. When EOR T is set to a high value, the operation window between the EOR T and SOR T can become so small for a high LHSV operation that the run-length of the reforming catalyst will drop precipitously.

Upon reviewing the data for Example 1 (isothermal reactor) and Example 2 (adiabatic reactors), it may be noted that capital savings may be obtained for reforming processes using a reforming catalyst comprising large-pore zeolite support with a platinum containing compound and at least one halide by going from an adiabatic design to an isothermal one.

ADDITIONAL DESCRIPTION

The following are nonlimiting, specific embodiments in accordance with the present disclosure.

Embodiment 1 is a method of catalytic reforming comprising feeding a feedstream comprising C$_6$-convertibles to one or more reactors; contacting the feedstream with a reforming catalyst selecting values for a LHSV, a H2/HC ratio, and a conversion of C$_6$-convertibles from a deactivation kinetic model so as to maximize a net present amount of benzene produced over a run-length of the reforming catalyst; operating the one or more reactors at the selected LHSV, the selected H2/HC ratio, and the selected conversion of C$_6$-convertibles; and recovering an effluent from the reactor, wherein the effluent comprises at least about 40 wt % benzene.

Embodiment 2 is the method of embodiment 1 wherein the selected H2/HC ratio is greater than 2 or less than 1.

Embodiment 3 is the method of any of embodiments 1 through 2 wherein the selected LHSV is from about 3 to about 4 and the selected H2/HC ratio is about 4.

Embodiment 4 is the method of any of embodiments 1 to 3 wherein the reforming catalyst comprises a silica-bound L-type a zeolite support, platinum, chloride, and fluoride.

Embodiment 5 is the method of any of embodiments 1 to 4 wherein selecting values comprises calculating a fouling curve and determining the run-length of the reforming catalyst at a time at which the fouling curve reaches a prescribed end of run temperature.

Embodiment 6 is the method of embodiment 5 wherein calculating the fouling curve comprises numerically solving a plurality of equations representing three dimensional process variable space spanned by the conversion of C$_6$-convertibles in the feedstream, the LHSV, and the H2/HC ratio.

Embodiment 7 is the method of any of embodiments 5 to 6 wherein selecting values further comprises approximating the fouling curve with an analytical solution to the deactivation kinetic model.

Embodiment 8 is the method of embodiment 7 wherein the analytical solution is represented by:

$$T(t) = \frac{T_0}{1 + (RT_0/E_d)\ln\left[1 - (E_d/\tilde{E}_r)\tilde{k}_d(T_0)t\right]}$$

where R is the gas constant; E$_d$ is an activation energy of a deactivation reaction; $\tilde{E}_r$ is an average activation energy of a conversion of C$_6$-, C$_7$- and C$_8$-convertibles; T$_o$ is a start-of-run temperature; and $\tilde{k}_d(T_o)$ is represented by $\tilde{A}_d \exp(-E_d/RT)$ with $\tilde{A}_d$ being the average of A$_d$ along at least one isothermal reactor and further represented by:

$$\tilde{A}_d = 1.343 \times 10^{11} - 5.282 \times 10^{10} f - 1.456 \times 10^{10} (H2/HC)_{inlet}$$

where $f$ is the fraction representing conversion of C$_6$-convertibles.

Embodiment 9 is the method of any of embodiments 7 to 8 wherein the analytical solution is represented by:

$$T = T_a - \beta/(t/t_{max})\ln(1 - t/t_{max})$$

where T$_a$ is the inlet temperature of at least one adiabatic reactor, t is on-stream time, t$_{max}$ is the time at which the reforming catalyst has near zero activity and the reactor temperature approaches infinity, and β is an adjustable parameter describing the fouling of the catalyst near start-of-run, wherein β is adjusted to fit the analytical solution to the fouling curve.

Embodiment 10 is the method of any of embodiments 1 to 9 further comprising calculating a net present amount of benzene produced and a benzene yield per month of the reforming catalyst to calculate an amount of benzene produced over the run-length per unit of the reforming catalyst and then discounting the amount of benzene produced over the run-length of the reforming catalyst per unit of reforming catalyst to determine the net present amount of benzene produced per unit of reforming catalyst over the run-length of the reforming catalyst.

Embodiment 11 is the method of any of embodiments 1 to 10 further comprising calculating a net present amount of benzene comprises calculating a number of pounds of benzene produced per pound of the reforming catalyst per hour, N, which is given by:

$$N=0.907 f w_{C6} \text{LHSV}(d_{lf}/d_c)$$

where $d_{lf}$, $d_c$, $f$, and $w_{C6}$ are, respectively, the density of the feedstream, the density of the reforming catalyst, the fraction representing conversion of $C_6$-convertibles, and the weight fraction of $C_6$-convertibles in the feedstream.

Embodiment 12 is the method of embodiment 11 wherein N is greater than about 1.

Embodiment 13 is the method of any of embodiments 1 to 12 further comprising calculating a net present amount of benzene comprises calculating a net present pounds of benzene produced per pound of the reforming catalyst over the run-length of the reforming catalyst, NPPB, which is given by:

$$\text{NPPB}=(N/720)\{1-(1-D_m)^n\}/D_m$$

where $D_m$ is the monthly discount rate and n is the run-length of the reforming catalyst in units of months.

Embodiment 14 is the method of embodiment wherein the NPPB is greater than about 14,000.

Embodiment 15 is the method of any of embodiments 11 to 14 wherein N is greater than about 1 or the NPPB is greater than about 14,000.

Embodiment 16 is a method of catalytic reforming, and optionally the method of any of embodiments 1 to 15, comprising kinetically modeling a deactivation of a reforming catalyst with a deactivation kinetic model to determine a run-length of the reforming catalyst as a function of a LHSV of a feedstream, a H2/HC ratio of the feedstream, and a conversion of $C_6$-convertibles in the feedstream; calculating a net present amount of benzene that is produced over the run-length of the reforming catalyst; and selecting values for the LHSV, the H2/HC ratio, and the conversion of $C_6$-convertibles that maximize the net present amount of benzene produced over the run-length of the reforming catalyst.

Embodiment 17 is the method of any of embodiments 1 to 16 wherein the deactivation kinetic model comprises at least one aromatization reaction rate equation, at least one catalyst deactivation equation, and at least one heat balance equation.

Embodiment 18 is the method of embodiment 17 wherein the reforming catalyst comprises a Group VIII metal and at least one halide on an inorganic support and wherein the catalyst deactivation equation is a first order rate equation accounting for the deactivation of the reforming catalyst via coking.

Embodiment 19 is the method of any of embodiments 17 to 18 wherein a deactivation rate constant ($k_d$ (T)) for the first order catalyst deactivation equation is:

$$k_d(T)=A_d \exp(-E_d/RT)$$

where T is a temperature of the reforming catalyst, $E_d$ is an activation energy of one or more catalyst deactivation reactions, and R is a gas constant.

Embodiment 20 is the method of any of embodiments 16 to 18 wherein kinetically modeling the deactivation of the reforming catalyst with the deactivation kinetic model comprises calculating a fouling curve and determining the run-length of the reforming catalyst at a time at which the fouling curve reaches a prescribed end of run temperature.

Embodiment 21 is the method of any of embodiments 5 and 20 wherein calculating the fouling curve comprises numerically solving a plurality of equations representing three dimensional process variable space spanned by the conversion of $C_6$-convertibles in the feedstream, the LHSV, and the H2/HC ratio.

Embodiment 22 is the method of any of embodiments 16 to 21 wherein kinetically modeling the deactivation of the reforming catalyst with the deactivation kinetic model further comprises approximating the fouling curve with an analytical solution to the deactivation kinetic model.

Embodiment 23 is the method of any of embodiments 7 and 22 wherein the analytical solution is represented by:

$$T(t) = \frac{T_0}{1+(RT_0/E_d)\ln\left[1-(E_d/\tilde{E}_r)\tilde{k}_d(T_0)t\right]}$$

where R is the gas constant; $E_d$ is an activation energy of a deactivation reaction; $\tilde{E}_c$ is an average activation energy of a conversion of $C_6$-, $C_7$- and $C_8$-convertibles; $T_o$ is a start-of-run temperature; and $\tilde{k}_d(T_o)$ is represented by $\tilde{A}_d \exp(-E_d/RT)$ with $\tilde{A}_d$ being the average of $A_d$ along at least one isothermal reactor and further represented by:

$$\tilde{A}_d=1.343\times10^{11}-5.282\times10^{10}f-1.456\times10^{10}(H2/HC)_{inlet}$$

where $f$ is the fraction representing conversion of $C_6$-convertibles.

Embodiment 24 is the method of any of embodiments 7 to 8 and 22 to 23 wherein the analytical solution is represented by:

$$T=T_a-\beta/(t/t_{max})\ln(1-t/t_{max})$$

where $T_a$ is the inlet temperature of at least one adiabatic reactor, t is on-stream time, $t_{max}$ is the time at which the reforming catalyst has near zero activity and the reactor temperature approaches infinity, and $\beta$ is an adjustable parameter describing the fouling of the catalyst near start-of-run, wherein $\beta$ is adjusted to fit the analytical solution to the fouling curve.

Embodiment 25 the method of any of embodiments 1 to 24 further comprising determining a sensitivity of the analytical solution by calculating another analytical solution where $A_d$ is represented by $$A_d=1.505\times10^{11}-2.010\times10^{10}(H2/HC)_{average}$$

where $(H2/HC)_{average}$ is the average H2/HC ratio in the at least one reactor.

Embodiment 26 is the method of any of embodiments 1 to 25 further comprising determining a sensitivity of the analytical solution by calculating another analytical solution where $A_d$ is represented by $$A_d=1.231\times10^{11}-1.507\times10^{10}(H2/HC)_{inlet}$$

where $(H2/HC)_{inlet}$ is the H2/HC ratio in the inlet of at least one reactor.

Embodiment 27 is the method of any of embodiments 10 to 26 wherein calculating the net present amount of benzene produced comprises using the run-length of the reforming catalyst and a benzene yield per month of the reforming catalyst to calculate an amount of benzene produced over the run-length per unit of the reforming catalyst and then discounting the amount of benzene produced over the run-length of the reforming catalyst per unit of reforming catalyst to determine the net present amount of benzene produced per unit of reforming catalyst over the run-length of the reforming catalyst.

Embodiment 28 is the method of any of embodiments 10 to 27 wherein calculating a net present amount of benzene comprises calculating a number of pounds of benzene produced per pound of the reforming catalyst per hour, N, which is given by:

$$N=0.907fw_{C6}LHSV(d_{lf}/d_c)$$

where $d_{lf}$, $d_c$, $f$, and $w_{C6}$ are, respectively, the density of the feedstream, the density of the reforming catalyst, the fraction representing conversion of $C_6$-convertibles, and the weight fraction of $C_6$-convertibles in the feedstream.

Embodiment 29 is the method of any of embodiments 11 to 28 wherein N is greater than about 1.

Embodiment 30 is the method of any of embodiments 10 to 29 wherein calculating a net present amount of benzene comprises calculating a net present pounds of benzene produced per pound of the reforming catalyst over the run-length of the reforming catalyst, NPPB, which is given by:

$$NPPB=(N/720)\{1-(1-D_m)^n\}/D_m$$

where $D_m$ is the monthly discount rate and n is the run-length of the reforming catalyst in units of months.

Embodiment 31 is the method of any of embodiments 13 to 30 wherein the NPPB is greater than about 14,000.

Embodiment 32 is the method of any of embodiments 28 to 31 wherein the NPPB is greater than about 14,000 or N is greater than about 1.

Embodiment 33 is the method of any of embodiments 1 to 32 wherein, for a given conversion of the $C_6$-convertibles in the feedstream and the LHSV, a higher value for the net present amount of benzene produced is attained by selecting a H2/HC ratio of the feedstream of greater than about 2 or less than about 1.

Embodiment 34 is the method of any of embodiments 1 to 33 wherein, for a given conversion of $C_6$-convertibles in the feedstream, the LHSV selected is about 4.

Embodiment 35 is the method of any of embodiments 1 to 34 wherein, for a given conversion of $C_6$-convertibles in the feedstream, the H2/HC ratio of the feedstream is about 4.

Embodiment 36 is the method of any of embodiments 1 to 35 wherein the conversion of $C_6$-convertibles in the feedstream is from about 83% to about 93%, wherein the LHSV is about 4 and the H2/HC ratio of the feedstream is about 4.

Embodiment 37 is a catalytic reactor, which may optionally incorporate any of the methods of embodiments 1 to 36, comprising a feedstream and a reforming catalyst wherein the reactor is configured to produce a net present amount of benzene over a run-length of the reforming catalyst; wherein the run-length is determined as a function of a LHSV of the feedstream, a H2/HC ratio of the feedstream, and a conversion of $C_6$-convertibles in the feedstream by kinetically modeling a deactivation of the reforming catalyst with a deactivation kinetic model; and wherein values for the LHSV of the feedstream, the H2/HC ratio of the feedstream, and the conversion of $C_6$-convertibles in the feedstream are selected to maximize the net present amount of benzene produced over the run-length of the reforming catalyst.

Embodiment 38 is the catalytic reactor of embodiment 37 wherein the deactivation kinetic model comprises at least one aromatization reaction rate equation, at least one catalyst deactivation equation, and at least one heat balance equation.

Embodiment 39 is the catalytic reactor of any of embodiments 37 to 38 wherein the reforming catalyst comprises a Group VIII metal and at least one halide on an inorganic support and wherein the catalyst deactivation equation comprises a first order rate equation to account for the deactivation of the reforming catalyst via coking.

Embodiment 40 is the catalytic reactor of any of embodiments 37 to 39 wherein a deactivation rate constant ($k_d$(T)) for the catalyst deactivation equation is:

$$k_d(T)=A_d\exp(-E_d/RT)$$

where T is a temperature of the reforming catalyst, $E_d$ is an activation energy of one or more catalyst deactivation reactions, and R is a gas constant.

Embodiment 41 is the catalytic reactor of any of embodiments 37 to 40 wherein the deactivation of the reforming catalyst is kinetically modeled with the deactivation kinetic model by calculating a fouling curve and determining the run-length of the reforming catalyst at a time at which the fouling curve reaches a prescribed end of run temperature.

Embodiment 42 is the catalytic reactor of embodiment 41 wherein the fouling curve is calculated by numerically solving a plurality of equations representing three dimensional process variable space spanned by the conversion of $C_6$-convertibles in the feedstream, the LHSV of the feedstream, and the H2/HC ratio of the feedstream.

Embodiment 43 is the catalytic reactor of any of embodiments 37 to 42 wherein the deactivation of the reforming catalyst is kinetically modeled with the deactivation kinetic model by approximating the fouling curve with an analytical solution to the deactivation kinetic model.

Embodiment 44 is the catalytic reactor of embodiment 43 wherein the analytical solution is represented by:

$$T(t) = \frac{T_0}{1 + (RT_0/E_d)\ln\left[1 - (E_d/\tilde{E}_r)\tilde{k}_d(T_0)t\right]}$$

where R is the gas constant; $E_d$ is an activation energy of a deactivation reaction; $\tilde{E}_r$ is an average activation energy of a conversion of $C_6$-, $C_7$- and $C_8$-convertibles; $T_o$ is a start-of-run temperature; and $\tilde{k}_d(T_o)$ is represented by $\tilde{A}_d \exp(-E_d/RT)$ with $\tilde{A}_d$ being the average of $A_d$ along at least one isothermal reactor and further represented by:

$$\tilde{A}_d=1.343\times10^{11}-5.282\times10^{10}f-1.456\times10^{10}(H2/HC)_{inlet}$$

where $f$ is the fraction representing conversion of $C_6$-convertibles.

Embodiment 45 is the catalytic reactor of any of embodiments 43 to 44 wherein the analytical solution is represented by:

$$T=T_a-\beta/(t/t_{max})\ln(1-t/t_{max})$$

where $T_a$ is the inlet temperature of at least one adiabatic reactor, t is on-stream time, $t_{max}$ is the time at which the reforming catalyst has near zero activity and the reactor temperature approaches infinity, and β is an adjustable parameter describing the fouling of the catalyst near start-of-run, wherein β is adjusted to fit the analytical solution to the fouling curve.

Embodiment 46 is the catalytic reactor of any of embodiments 37 to 45 wherein the net present amount of benzene produced over the run-length of the reforming catalyst is calculated per unit of the reforming catalyst by using the run-length of the reforming catalyst and a benzene yield per month of the reforming catalyst and then discounting the amount of benzene produced over the run-length of the reforming catalyst per unit of reforming catalyst.

Embodiment 47 is the catalytic reactor of any of embodiments 37 to 46 wherein the net present amount of benzene produced over the run-length of the reforming catalyst is calculated as a number of pounds of benzene produced per pound of the reforming catalyst per hour, N, which is given by:

$$N=0.907fw_{C6}LHSV(d_f/d_c)$$

where $d_f$, $d_c$, $f$, and $w_{C6}$ are, respectively, the density of the feedstream, the density of the reforming catalyst, the fraction representing conversion of $C_6$-convertibles, and the weight fraction of $C_6$-convertibles in the feedstream.

Embodiment 48 is the catalytic reactor of embodiment 47 wherein N is greater than about 1.

Embodiment 49 is the catalytic reactor of any of embodiments 37 to 48 wherein the net present amount of benzene produced over the run-length of the reforming catalyst is calculated as net present pounds of benzene produced per pound of the reforming catalyst over the run-length of the reforming catalyst, NPPB, which is given by:

$$NPPB=(N/720)\{1-(1-D_m)^n\}/D_m$$

where $D_m$ is the monthly discount rate and n is the run-length of the reforming catalyst in units of months.

Embodiment 50 is the catalytic reactor of embodiment wherein the NPPB is greater than about 14,000.

Embodiment 51 is the catalytic reactor of any of embodiments 47 to 50 where the NPPB is greater than about 14,000 or N is greater than about 1.

Embodiment 52 is the catalytic reactor of an of embodiments 37 to 51 wherein, for a given conversion of the $C_6$-convertibles in the feedstream and the LHSV, a higher value for the net present amount of benzene produced is attained by selecting a H2/HC ratio of the feedstream of greater than about 2 or less than about 1.

Embodiment 53 is the catalytic reactor of any of embodiments 37 to 52 wherein, for a given conversion of $C_6$-convertibles in the feedstream, the LHSV selected is about 4.

Embodiment 54 is the catalytic reactor of any of embodiments 37 to 53 wherein, for a given conversion of $C_6$-convertibles in the feedstream, the H2/HC ratio of the feedstream is about 4.

Embodiment 55 is the catalytic reactor of any of embodiments 37 to 54 wherein the conversion of $C_6$-convertibles in the feedstream is from about 83% to about 93%, wherein the LHSV is about 4 and the H2/HC ratio of the feedstream is about 4.

Embodiment 56 is the catalytic reactor of any of embodiments 1 to 55 wherein the reforming catalyst comprises a large pore zeolite, platinum, and optionally one or more halides.

Embodiment 57 is the catalytic reactor of any of embodiments 1 to 57 wherein the reforming catalyst comprises a silica-bound KL-zeolite support, platinum, chloride, and fluoride.

Embodiment 58 is the catalytic reactor of any of embodiments 37 to 57, further comprising an effluent having at least about 40 wt % benzene.

Embodiment 59 is a computer system, which may optionally be used in combination with any of embodiments 1 to 58, comprising one or more processors; a non-transitory memory coupled to the processor, wherein the non-transitory memory comprises executable instructions that, when executed, cause the one or more processors to: kinetically model a deactivation of a reforming catalyst with a deactivation kinetic model to determine a run-length of the reforming catalyst as a function of a LHSV of a feedstream, a H2/HC ratio of the feedstream, and a conversion of $C_6$-convertibles in the feedstream; calculate a net present amount of benzene that is produced over a run-length of the reforming catalyst; and select values for the LHSV, the H2/HC ratio, and the conversion of $C_6$-convertibles that maximize the net present amount of benzene produced over a run-length of the reforming catalyst.

Embodiment 60 is the computer system of embodiment 59 wherein the deactivation kinetic model comprises at least one aromatization reaction rate equation, at least one catalyst deactivation equation, and at least one heat balance equation.

Embodiment 61 is the computer system of embodiments 59 to 60 wherein the reforming catalyst comprises a Group VIII metal and at least one halide on an inorganic support and wherein the catalyst deactivation equation is a first order rate equation.

Embodiment 62 is the computer system of embodiments 59 to 61 wherein a deactivation rate constant ($k_d(T)$) for the first order catalyst deactivation equation is:

$$k_d(T)=A_d\exp(-E_d/RT)$$

where T is a temperature of the reforming catalyst, $E_d$ is an activation energy of one or more catalyst deactivation reactions, and R is a gas constant.

Embodiment 63 is the computer system of any of embodiments 59 to 62 wherein kinetically model the deactivation of the reforming catalyst with the deactivation kinetic model comprises calculate a fouling curve and determine the run-length of the reforming catalyst at a time at which the fouling curve reaches a prescribed end of run temperature.

Embodiment 64 is the computer system of embodiment 63 wherein calculate the fouling curve comprises numerically solving a plurality of equations representing three dimensional process variable space spanned by the conversion of $C_6$-convertibles in the feedstream, the LHSV, and the H2/HC ratio.

Embodiment 65 is the computer system of any of embodiments 59 to 64 wherein kinetically model the deactivation of the reforming catalyst with the deactivation kinetic model further comprises approximate the fouling curve with an analytical solution to the deactivation kinetic model.

Embodiment 66 is the computer system of embodiment 65 wherein the analytical solution is represented by:

$$T(t) = \frac{T_0}{1 + (RT_0/E_d)\ln\left[1 - (E_d/\tilde{E}_r)\tilde{k}_d(T_0)t\right]}$$

where R is the gas constant; $E_d$ is an activation energy of a deactivation reaction; $\tilde{E}_r$ is an average activation energy of a conversion of $C_6$-, $C_7$- and $C_8$-convertibles; $T_o$ is a start-of-run temperature; and $\tilde{k}_d(T_o)$ is represented by $\tilde{A}_d \exp(-E_d/RT)$ with $\tilde{A}_d$ being the average of $A_d$ along at least one isothermal reactor and further represented by:

$$\tilde{A}_d=1.343\times10^{11}-5.282\times10^{10}f-1.456\times10^{10}(H2/HC)_{inlet}$$

where $f$ is the fraction representing conversion of $C_6$-convertibles.

Embodiment 67 is the computer system of any of embodiments 65 to 66 wherein the analytical solution is represented by:

$$T=T_a-\beta/(t/t_{max})\ln(1-t/t_{max})$$

where $T_a$ is the inlet temperature of at least one adiabatic reactor, t is on-stream time, $t_{max}$ is the time at which the reforming catalyst has near zero activity and the reactor temperature approaches infinity, and β is an adjustable parameter describing the fouling of the catalyst near start-of-run, wherein β is adjusted to fit the analytical solution to the fouling curve.

Embodiment 68 is the computer system of any of embodiments 59 to 67 wherein calculate the net present amount of benzene produced comprises use the run-length of the reforming catalyst and a benzene yield per month of the reforming catalyst to calculate an amount of benzene produced over the run-length per unit of the reforming catalyst and then discount the amount of benzene produced over the run-length of the reforming catalyst per unit of reforming catalyst to determine the net present amount of benzene produced per unit of reforming catalyst over the run-length of the reforming catalyst.

Embodiment 69 is the computer system of any of embodiments 59 to 68 wherein calculate a net present amount of benzene comprises calculate a number of pounds of benzene produced per pound of the reforming catalyst per hour, N, which is given by:

$$N = 0.907 f w_{C6} \text{LHSV}(d_f/d_c)$$

where $d_f$, $d_c$, $f$, and $w_{C6}$ are, respectively, the density of the feedstream, the density of the reforming catalyst, the fraction representing conversion of $C_6$-convertibles, and the weight fraction of $C_6$-convertibles in the feedstream.

Embodiment 70 is the computer system of embodiment 69 wherein N is greater than about 1.

Embodiment 71 is the computer system of any of embodiments 59 to 70 wherein calculate a net present amount of benzene comprises calculate a net present pounds of benzene produced per pound of the reforming catalyst over the run-length of the reforming catalyst, NPPB, which is given by:

$$\text{NPPB} = (N/720)\{1 - (1 - D_m)^n\}/D_m$$

where $D_m$ is the monthly discount rate and n is the run-length of the reforming catalyst in units of months.

Embodiment 72 is the computer system of embodiment 71 wherein the NPPB is greater than about 14,000.

Embodiment 73 is the computer system of any of embodiments 69 to 72 wherein the NPPB is greater than about 14,000 or N is greater than about 1.

Embodiment 74 is the computer system of any of embodiments 59 to 73 wherein, for a given conversion of the $C_6$-convertibles in the feedstream and the LHSV, a higher value for the net present amount of benzene produced is attained by selecting a H2/HC ratio of the feedstream of greater than about 2 or less than about 1.

Embodiment 75 is the computer system of any of embodiments 59 to 74 wherein, for a given conversion of $C_6$-convertibles in the feedstream, the LHSV selected is about 4.

Embodiment 76 is the computer system of any of embodiments 59 to 75 wherein, for a given conversion of $C_6$-convertibles in the feedstream, the H2/HC ratio of the feedstream is about 4.

Embodiment 77 is the computer system of any of embodiments 59 to 76 wherein the conversion of $C_6$-convertibles in the feedstream is from about 83% to about 93%, wherein the LHSV is about 4 and the H2/HC ratio of the feedstream is about 4.

Embodiment 78 is a system, which may optionally be utilized in combination with any of embodiments 1 to 77, comprising a catalytic reactor comprising a feedstream and a reforming catalyst; and a computer system coupled to the catalytic reactor and having a deactivation kinetic model to: kinetically model a deactivation of the reforming catalyst with a deactivation kinetic model to determine a run-length of the reforming catalyst as a function of a LHSV of a feedstream, a H2/HC ratio of the feedstream, and a conversion of $C_6$-convertibles in the feedstream; and calculate a net present amount of benzene that is produced over the run-length of the reforming catalyst; wherein the catalytic reactor operates at values for the LHSV, the H2/HC ratio, and the conversion of $C_6$-convertibles that maximize the net present amount of benzene produced over a run-length of the reforming catalyst.

Embodiment 79 is the system of embodiment 78 wherein kinetically model the deactivation of the reforming catalyst with the deactivation kinetic model comprises calculate a fouling curve and determine the run-length of the reforming catalyst at a time at which the fouling curve reaches a prescribed end of run temperature.

Embodiment 80 is the system of any of embodiments 78 to 79 wherein kinetically model the deactivation of the reforming catalyst with the deactivation kinetic model further comprises approximate the fouling curve with an analytical solution to the deactivation kinetic model.

Embodiment 81 is the system of embodiment 80 wherein the analytical solution is represented by:

$$T(t) = \frac{T_0}{1 + (RT_0/E_d)\ln\left[1 - (E_d/\tilde{E}_r)\tilde{k}_d(T_0)t\right]}$$

where R is the gas constant; $E_d$ is an activation energy of a deactivation reaction; $\tilde{E}_r$ is an average activation energy of a conversion of $C_6$-, $C_7$- and $C_8$-convertibles; $T_o$ is a start-of-run temperature; and $\tilde{k}_d(T_o)$ is represented by $\tilde{A}_d \exp(-E_d/RT)$ with $\tilde{A}_d$ being the average of $A_d$ along at least one isothermal reactor and further represented by:

$$\tilde{A}_d = 1.343 \times 10^{11} - 5.282 \times 10^{10} f - 1.456 \times 10^{10} (H2/HC)_{inlet}$$

where $f$ is the fraction representing conversion of $C_6$-convertibles.

Embodiment 82 is the system of any of embodiments 80 to 81 wherein the analytical solution is represented by:

$$T = T_a - \beta/(t/t_{max}) \cdot \ln(1 - t/t_{max})$$

where $T_a$ is the inlet temperature of at least one adiabatic reactor, t is on-stream time, $t_{max}$ is the time at which the reforming catalyst has near zero activity and the reactor temperature approaches infinity, and β is an adjustable parameter describing the fouling of the catalyst near start-of-run, wherein β is adjusted to fit the analytical solution to the fouling curve.

Embodiment 83 is the system of any of embodiments 78 to 82 wherein calculate the net present amount of benzene produced comprises use the run-length of the reforming catalyst and a benzene yield per month of the reforming catalyst to calculate an amount of benzene produced over the run-length per unit of the reforming catalyst and then discount the amount of benzene produced over the run-length of the reforming catalyst per unit of reforming catalyst to determine the net present amount of benzene produced per unit of reforming catalyst over the run-length of the reforming catalyst.

Embodiment 84 is the system of any of embodiments 78 to 83 wherein calculate a net present amount of benzene comprises calculate a number of pounds of benzene produced per pound of the reforming catalyst per hour, N, which is given by:

$$N = 0.907 f w_{C6} \text{LHSV}(d_f/d_c)$$

where $d_{lf}$, $d_c$, $f$, and $w_{C6}$ are, respectively, the density of the feedstream, the density of the reforming catalyst, the fraction representing conversion of $C_6$-convertibles, and the weight fraction of $C_6$-convertibles in the feedstream.

Embodiment 85 is the system of embodiment 84 wherein N is greater than about 1.

Embodiment 86 is the system of any of embodiments 78 to 85 wherein calculate a net present amount of benzene comprises calculate a net present pounds of benzene produced per pound of the reforming catalyst over the run-length of the reforming catalyst, NPPB, which is given by:

$$NPPB = (N/720)\{1-(1-D_m)^n\}/D_m$$

where $D_m$ is the monthly discount rate and n is the run-length of the reforming catalyst in units of months.

Embodiment 87 is the system of embodiment 86 wherein the NPPB is greater than about 14,000.

Embodiment 88 is the system of any of embodiments 84 to 87 wherein the NPPB is greater than about 14,000 or N is greater than about 1.

Embodiment 89 is the system of any of embodiments 78 to 88 wherein, for a given conversion of the $C_6$-convertibles in the feedstream and the LHSV, a higher value for the net present amount of benzene produced is attained by selecting a H2/HC ratio of the feedstream of greater than about 2 or less than about 1.

Embodiment 90 is the system of any of embodiments 78 to 89 wherein, for a given conversion of $C_6$-convertibles in the feedstream, the LHSV selected is about 4.

Embodiment 91 is the system of any of embodiments 78 to 90 wherein, for a given conversion of $C_6$-convertibles in the feedstream, the H2/HC ratio of the feedstream is about 4.

Embodiment 92 is the system of any of embodiments 78 to 91 wherein the conversion of $C_6$-convertibles in the feedstream is from about 83% to about 93%, wherein the LHSV is about 4 and the H2/HC ratio of the feedstream is about 4.

Embodiment 93 is a non-transitory computer readable medium, which may be optionally be utilized in combination with any of embodiments 1 to 92, comprising a model unit to: kinetically model a deactivation of a reforming catalyst with a deactivation kinetic model to determine a run-length of the reforming catalyst as a function of a LHSV of a feedstream, a H2/HC ratio of the feedstream, and a conversion of $C_6$-convertibles in the feedstream; and calculate a net present amount of benzene that is produced over a run-length of the reforming catalyst.

Embodiment 94 is the non-transitory computer readable medium of embodiment 93, further comprising a selection unit to select values for the LHSV, the H2/HC ratio, and the conversion of $C_6$-convertibles that maximize the net present amount of benzene produced over a run-length of the reforming catalyst.

Embodiment 95 is the non-transitory computer readable medium of any of embodiments 93 to 94, further comprising a sensitivity unit to determine a sensitivity of the values selected by the selection unit.

Embodiment 96 is the non-transitory computer readable medium of any of embodiments 93 to 95 wherein kinetically model the deactivation of the reforming catalyst with the deactivation kinetic model comprises calculate a fouling curve and determine the run-length of the reforming catalyst at a time at which the fouling curve reaches a prescribed end of run temperature.

Embodiment 97 is the non-transitory computer readable medium of any of embodiments 93 to 96 wherein kinetically model the deactivation of the reforming catalyst with the deactivation kinetic model further comprises approximate the fouling curve with an analytical solution to the deactivation kinetic model.

Embodiment 98 is the non-transitory computer readable medium of embodiment 97 wherein the analytical solution is represented by:

$$T(t) = \frac{T_0}{1 + (RT_0/E_d)\ln\left[1 - (E_d/\tilde{E}_r)\tilde{k}_d(T_0)t\right]}$$

where R is the gas constant; $E_d$ is an activation energy of a deactivation reaction; $\tilde{E}_r$ is an average activation energy of a conversion of $C_6$-, $C_7$- and $C_8$-convertibles; $T_o$ is a start-of-run temperature; and $\tilde{k}_d(T_o)$ is represented by $\tilde{A}_d \exp(-E_d/RT)$ with $\tilde{A}_d$ being the average of $A_d$ along at least one isothermal reactor and further represented by:

$$\tilde{A}_d = 1.343 \times 10^{11} - 5.282 \times 10^{10} f - 1.456 \times 10^{10} (H2/HC)_{inlet}$$

where $f$ is the fraction representing conversion of $C_6$-convertibles.

Embodiment 99 is the non-transitory computer readable medium of any of embodiments 97 to 98 wherein the analytical solution is represented by:

$$T = T_a - \beta/(t/t_{max}) \cdot \ln(1 - t/t_{max})$$

where $T_a$ is the inlet temperature of at least one adiabatic reactor, t is on-stream time, $t_{max}$ is the time at which the reforming catalyst has near zero activity and the reactor temperature approaches infinity, and $\beta$ is an adjustable parameter describing the fouling of the catalyst near start-of-run, wherein $\beta$ is adjusted to fit the analytical solution to the fouling curve.

Embodiment 100 is the non-transitory computer readable medium of any of embodiments 93 to 99 wherein calculate a net present amount of benzene comprises calculate a number of pounds of benzene produced per pound of the reforming catalyst per hour, N, which is given by:

$$N = 0.907 f w_{C6} \text{LHSV}(d_{lf}/d_c)$$

where $d_{lf}$, $d_c$, $f$, and $w_{C6}$ are, respectively, the density of the feedstream, the density of the reforming catalyst, the fraction representing conversion of $C_6$-convertibles, and the weight fraction of $C_6$-convertibles in the feedstream.

Embodiment 101 is the non-transitory computer readable medium of embodiment 100 wherein N is greater than about 1.

Embodiment 102 is the non-transitory computer readable medium of any of embodiments 93 to 101 wherein calculate a net present amount of benzene comprises calculate a net present pounds of benzene produced per pound of the reforming catalyst over the run-length of the reforming catalyst, NPPB, which is given by:

$$NPPB = (N/720)\{1-(1-D_m)^n\}/D_m$$

where $D_m$ is the monthly discount rate and n is the run-length of the reforming catalyst in units of months.

Embodiment 103 is the non-transitory computer readable medium of embodiment 102 wherein the NPPB is greater than about 14,000.

Embodiment 104 is the non-transitory computer readable medium of any of embodiments 100 to 103 wherein the NPPB is greater than about 14,000 or N is greater than about 1.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Many variations and modifications of the inventive subject matter disclosed herein are possible and are within the scope of the inventive subject matter. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

The ordering of steps in the various methods are for illustration purposes and do not necessarily reflect the order that various steps must be performed. The steps may be rearranged in different orders in different embodiments to reflect the needs, desires and preferences of the entity implementing the systems. Furthermore, many steps may be performed simultaneously with other steps in some embodiments.

Also, techniques, systems, subsystems and methods described and illustrated in the various embodiments as discrete or separate may be combined or integrated with other systems, modules, techniques, or methods without departing from the scope of the present disclosure. Other items shown or discussed as directly coupled or communicating with each other may be coupled or communicating through some interface, device, or intermediate component such that the items may no longer be considered directly coupled to each other but may still be indirectly coupled and in communication, whether electrically, mechanically, or otherwise with one another. Other examples of changes, substitutions, and alterations are ascertainable by one skilled in the art and could be made without departing from the spirit and scope disclosed.

Accordingly, the scope of protection is not limited by the description set out above but is only limited by the claims which follow, that scope including all equivalents of the subject matter of the claims. Each and every claim is incorporated into the specification as an embodiment of the inventive subject matter. Thus, the claims are a further description and are an addition to the preferred embodiments of the inventive subject matter. The discussion of a reference in the disclosure is not an admission that it is prior art to the inventive subject matter, especially any reference that may have a publication date after the priority date of this application. The disclosures of all patents, patent applications, and publications cited herein are hereby incorporated by reference, to the extent that they provide exemplary, procedural or other details supplementary to those set forth herein.

What is claimed is:

1. A system comprising:
   a catalytic reforming reactor having a reforming catalyst contained therein; and
   a computer system coupled to the catalytic reforming reactor and configured to:
   kinetically model a fouling curve of the reforming catalyst with a deactivation kinetic model comprising at least one first order aromatization reaction rate equation, based on a first value for each of a LHSV, a $H_2$/HC ratio, and a conversion of the $C_6$-convertibles to determine a start of run temperature $T_o$;
   approximate the fouling curve with an analytical solution to the deactivation kinetic model;
   calculate run-lengths of the reforming catalyst for each of a plurality of values for each of the LHSV, the $H_2$/HC ratio, and the conversion of the $C_6$-convertibles using the analytical solution and the start of run temperature $T_o$;
   calculate net present amounts of benzene that are produced over the run-lengths of the reforming catalyst for each of the plurality of values for each of the LHSV, the $H_2$/HC ratio, and the conversion of the $C_6$-convertibles; and
   select a second value for each of the LHSV, the $H_2$/HC ratio, and the conversion of the $C_6$-convertibles from the plurality of values that maximizes the net present amount of benzene produced over the run-length of the reforming catalyst;
   wherein the catalytic reforming reactor operates at the selected second value for each of the LHSV, the $H_2$/HC ratio, and the conversion of the $C_6$-convertibles.

2. The system of claim 1, wherein the catalytic reforming reactor is configured to:
   contact a feedstream comprising $C_6$-convertibles with the reforming catalyst at a temperature between 700° F. and 1050° F., wherein the $C_6$-convertibles are $C_6$ hydrocarbons having no more than one branch; and
   emit an effluent comprising at least about 40 wt % benzene.

3. The system of claim 1, wherein the reforming catalyst comprises a Group VIII metal and at least one halide on an inorganic support.

4. The system of claim 1, wherein the catalytic reforming reactor is isothermal and the analytical solution is represented by:

$$T(t) = \frac{T_0}{1 + (RT_0/E_d)\ln\left[1 - (E_d/\tilde{E}_r)\tilde{k}_d(T_0)t\right]}$$

where R is the gas constant; $E_d$ is an activation energy of a deactivation reaction; $\tilde{E}_r$ is an average activation energy of a conversion of $C_6$-, $C_7$- and $C_8$-convertibles; $T_o$ is a start-of-run temperature; and $\tilde{k}_d(T_0)$ is represented by $\tilde{A}_d \exp(-E_d/RT)$ with $\tilde{A}_d$ being the average of $A_d$ along the catalytic reforming reactor and further represented by:

$$\tilde{A}_d = 1.343 \times 10^{11} - 5.282 \times 10^{10} f - 1.456 \times 10^{10} (H2/HC)_{inlet}$$

where $f$ is the fraction representing the conversion of $C_6$-convertibles.

5. The system of claim 1, wherein the catalytic reforming reactor is adiabatic and the analytical solution is represented by:

$$T(t) = T_a - \beta/(t/t_{max})\ln(1 - t/t_{max})$$

where $T_a$ is the inlet temperature of the catalytic reforming reactor, t is on-stream time, $t_{max}$ is the time at which the reforming catalyst has near zero activity and the reactor temperature approaches infinity, and $\beta$ is an adjustable parameter describing the fouling of the reforming catalyst near start-of-run, wherein β is adjusted to fit the analytical solution to the fouling curve.

6. The system of claim 5, wherein the deactivation kinetic model further comprises at least one catalyst deactivation equation and at least one heat balance equation, and wherein the at least one catalyst deactivation equation is a first order rate equation accounting for the deactivation of the reforming catalyst via coking.

7. The system of claim 5, wherein the computer system is further configured to:
   determine a sensitivity of the analytical solution by calculating another analytical solution where $A_d$ is represented by $$A_d = 1.505 \times 10^{11} - 2.010 \times 10^{10} (H_2/HC)_{average}$$

where $(H_2/HC)_{average}$ is the average $H_2/HC$ ratio in the catalytic reforming reactor.

8. The system of claim 5, wherein the computer system is further configured to:
   determine a sensitivity of the analytical solution by calculating another analytical solution where $A_d$ is represented by $$A_d = 1.231 \times 10^{11} - 1.507 \times 10^{10} (H_2/HC)_{inlet}$$

where $(H_2/HC)_{inlet}$ is the $H_2/HC$ ratio in the inlet of the catalytic reforming reactor.

9. The system of claim 1, wherein calculate net present amounts of benzene comprises calculate a number of pounds of benzene produced per pound of the reforming catalyst per hour, N, which is given by:

$$N = 0.907 f w_{C6} \text{LHSV}(d_f/d_c)$$

where $d_f$, $d_c$, $f$, and $w_{C6}$ are, respectively, the density of the feedstream, the density of the reforming catalyst, the fraction representing the conversion of the $C_6$-convertibles, and the weight fraction of the $C_6$-convertibles in the feedstream.

10. The system of claim 9, wherein N is greater than about 1.

11. The system of claim 1, wherein calculate net present amounts of benzene further comprises calculate a net present pounds of benzene produced per pound of the reforming catalyst over the run-length of the reforming catalyst, NPPB, which is given by:

$$\text{NPPB} = (N/720)\{1-(1-D_m)^n\}/D_m$$

where $D_m$ is a monthly discount rate and n is the run-length of the reforming catalyst in units of months.

12. The system of claim 11, wherein the NPPB is greater than about 14,000.

* * * * *